(12) United States Patent
Yamagishi et al.

(10) Patent No.: US 7,933,145 B2
(45) Date of Patent: Apr. 26, 2011

(54) NONVOLATILE MAGNETIC MEMORY DEVICE

(75) Inventors: Hajime Yamagishi, Kanagawa (JP);
Shoji Ichikawa, Kanagawa (JP);
Takashi Kinoshita, Kanagawa (JP);
Masanori Hosomi, Kanagawa (JP);
Mitsuhara Shoji, Kanagawa (JP)

(73) Assignee: Sony Corporation, Tokyo (JP)

( * ) Notice: Subject to any disclaimer, the term of this patent is extended or adjusted under 35 U.S.C. 154(b) by 231 days.

(21) Appl. No.: 12/395,814

(22) Filed: Mar. 2, 2009

(65) Prior Publication Data

US 2009/0224300 A1 Sep. 10, 2009

(30) Foreign Application Priority Data

Mar. 5, 2008 (JP) ................................. 2008-054364

(51) Int. Cl.
*G11C 11/15* (2006.01)
(52) U.S. Cl. ........................................................ 365/158
(58) Field of Classification Search .................. 365/158
See application file for complete search history.

(56) References Cited

FOREIGN PATENT DOCUMENTS

| | | |
|---|---|---|
| JP | 2003-017782 | 1/2003 |
| JP | 2005-353788 A | 12/2005 |
| JP | 2006-156608 A | 6/2006 |
| JP | 2007-004901 A | 1/2007 |
| WO | WO 2006/054588 A1 | 5/2006 |

OTHER PUBLICATIONS

Wang et al., "Feasibility of Ultra-Dense Spin-Tunneling Random Access Memory", IEEE Transactions on Magnetics, vol. 33, Nov. 1997, pp. 4498-4512.
R. Scheuerlein et al., "A 10ns Read and Write Non-Volatile Memory Array Using a Magnetic Tunnel Junction and FET Switch in each Cell", 2000 IEEE International Solid-State Circuits Conference.

*Primary Examiner* — Evan Pert
(74) *Attorney, Agent, or Firm* — Wolf, Greenfield & Sacks, P.C.

(57) ABSTRACT

A nonvolatile magnetic memory device includes a magnetoresistance effect element that includes: a layered structure having a recording layer; a first wiring electrically connected to a lower part of the layered structure; a second wiring electrically connected to an upper part of the layered structure; and an interlayer insulation layer surrounding the layered structure. The magnetoresistance effect element further includes a low Young modulus region having a Young modulus lower than that of a material forming the interlayer insulation layer. The recording layer has an easy magnetization axis, and a hard magnetization axis orthogonal to the easy magnetization axis. When the magnetostriction constant $\lambda$ of a material forming the recording layer is a positive value or a negative value, the low Young modulus region is disposed in an extension region of the easy magnetization axis or in an extension region of the hard magnetization axis of the recording layer, respectively.

20 Claims, 19 Drawing Sheets

RECORDING OF INFORMATION "0"  RECORDING OF INFORMATION "1"

NONVOLATILE MAGNETIC MEMORY DEVICE

CROSS REFERENCES TO RELATED APPLICATIONS

The present invention contains subject matter related to Japanese Patent Application JP 2008-054364 filed in the Japanese Patent Office on Mar. 5, 2008, the entire contents of which being incorporated herein by reference.

BACKGROUND OF THE INVENTION

1. Field of the Invention

The present invention relates to a nonvolatile magnetic memory device.

2. Description of the Related Art

Attendant on the drastic spread of personal small apparatuses, such as information communication apparatuses, particularly, mobile terminals, various semiconductor devices, such as memory elements or logic elements constituting the apparatuses, are desired to have higher performance, such as higher degree of integration, higher operating speed, lower power consumption, and the like. Particularly, nonvolatile memories are considered to be keenly desired in the ubiquitous computing age. Even in the cases of consumption or trouble in the power supply or in the cases of cutoff between a server and a network due to some disorder, the nonvolatile memory makes it possible to preserve and protect important information. In addition, while the recent portable apparatuses are designed to suppress power consumption as much as possible by putting unnecessary circuit blocks into the standby state, if a nonvolatile memory capable of functioning as both a high-speed work memory and a large-capacity storage memory can be realized, it is possible to eliminate the wastefulness in power consumption and memory. Furthermore, the "instant-on" function enabling an instantaneous start upon making the power supply can also become possible if a high-speed large-capacity nonvolatile memory can be realized.

Examples of the nonvolatile memory include flash memories using semiconductor materials, and ferroelectric non-volatile semiconductor memories (FERAMs, Ferroelectric Random Access Memories) using ferroelectric materials. However, the flash memories have the defects that the write speed is on the order of microseconds, which is lower than desired. Meanwhile, the FERAM has a number of times of rewriting possible on the order of $10^{12}$ to $10^{14}$, which is too low for the FERAM to be used in place of SRAM or DRAM, and micro-processing of the ferroelectric material layer is difficult to carry out.

As a nonvolatile memory free of the above-described defects, the nonvolatile magnetic memory devices called MRAMs (Magnetic Random Access Memories) have come to be paid attention to. Of the MRAMs, the MRAM using the TMR (Tunnel Magnetoresistance) effect has come to be paid attention to with recent improvement of characteristics of TMR materials (for example, see Wang et al., "Feasibility of Ultra-Dense Spin-Tunneling Random Access Memory", IEEE Transactions on Magnetics, Vol. 33, November 1997, pp. 4498-4512). The TMR type MRAM is simple in structure, promises easy scaling, and has a large number of times of rewriting possible because of the recording by rotation of the magnetic moment. Furthermore, with the TMR type MRAM, a very short access time is expected, and it is said that the TMR type MRAM has already come to be able to operate at a rate of 100 MHz (for example, see R. Scheuerlein et al., "A 10 ns Read and Write Non-Volatile Memory Array Using a Magnetic Tunnel Junction and FET Switch in each Cell", 2000 IEEE International Solid-State Circuits Conference Digest of Technical Papers, February 2000, pp.128-129).

A schematic, partially sectional view of the TMR type MRAM (hereinafter, simply referred to as MRAM) is shown in FIG. 18. The MRAM includes a magnetic tunneling junction element (also called an MTJ element) connected to a selection transistor TR including a MOSFET.

The MTJ element has a laminate structure of first ferromagnetic material layer 2051, a tunnel insulation film 2052, and a second ferromagnetic material layer. Specifically, the first ferromagnetic material layer 2051 has a two-layered structure of, for example, an antiferromagnetic material layer 2051A and a ferromagnetic material layer (also called a pinned layer or magnetization pinned layer 2051B), in this order from the lower side, and has a strong unidirectional magnetic anisotropy due to the exchange interaction between the two layers. The second ferromagnetic material layer whose magnetization direction can be rotated comparatively easily is also called a free layer or a recording layer. In the following description, the second ferromagnetic material layer may be called a recording layer 2053. The tunnel insulation film 2052 plays the roles of interrupting magnetic coupling between the recording layer 2053 and the magnetization pinned layer 2051B, and of passing a tunnel current. A bit line BL (second wiring) for connection between the MRAM and the MRAM is formed on an interlayer insulation layer 26. A cap layer 2061 provided between the bit line BL and the recording layer 2053 functions to prevent mutual diffusion between the atoms constituting the bit line BL and the recording layer 2053, to reduce contact resistance, and to prevent oxidation of the recording layer 2053. In FIG. 18, reference numeral 2041 denotes a first wiring connected to a lower surface of the antiferromagnetic material layer 2051A.

A write word line WWL is disposed below the MTJ element with a second lower insulation layer 24 interposed therebetween. The extension direction (first direction) of the write word line WWL and the extension direction (second direction) of the bit line BL (second wiring) are ordinarily orthogonal to each other.

The selection transistor TR is formed in a portion of a silicon semiconductor substrate 10 surrounded by an element isolation region 11, and is covered with a first lower insulation layer 21. A source/drain region 14B on one side is connected to the first wiring 2041 of the MTJ element through a contact hole 22 including a tungsten plug, a landing pad portion 23, and a contact hole 25 including a tungsten plug. A source/drain region 14A on the other side is connected to a sense line 16 through a tungsten plug 15. In FIG. 18, reference numeral 12 denotes a gate electrode (functioning as a so-called word line), and reference numeral 13 denotes a gate insulation film. In the MRAM array, the MRAM is arranged at each of the intersections (overlap regions) in the lattice including the bit lines BL and the write word lines WWL.

In writing data into the MRAM having the above-described configuration, a current in a positive or negative direction flows in the bit line BL, while a current in a fixed direction flows in the write word line WWL, and a composite magnetic field thus generated changes the magnetization direction of the recording layer 2053. Thus, "1" or "0" is recorded in the recording layer 2053.

Meanwhile, reading of data is conducted by setting the selection transistor TR into the on state, passing a current through the bit line BL, and detecting via the sense line 16 a change in the tunnel current due to the magnetoresistance effect. When the magnetization directions of the recording layer 2053 and the magnetization pinned layer 2051B are equal, a low resistance result is obtained (this state is made to be "0", for example), and when the magnetization directions of the recording layer 2053 and the magnetization pinned layer 2051B are anti-parallel, a high resistance result is obtained (this state is made to be "1", for example).

In the MRAM, in order to stably hold recorded information, the recording layer 2053 in which information is to be recorded needs to have a uniform coercive force. Meanwhile, in order to rewrite recorded information, a predetermined amount of current needs to pass through the bit line BL. However, with the miniaturization of the MRAM, the bit line BL is made finer, and accordingly a sufficient amount of current is difficult to pass through the bit line BL. For this reason, as a structure allowing magnetization inversion with a smaller amount of current, a spin injection type magnetoresistance effect element applying magnetization inversion by spin injection has come to be paid attention to (for example, see JP-A-2003-17782) Magnetization inversion by spin injection is a phenomenon that an electron spin-polarized through a magnetic material is injected into other magnetic material, and magnetization inversion occurs in other magnetic material.

A conceptual view of a spin injection type magnetoresistance effect element is shown in FIG. 2A. The spin injection type magnetoresistance effect element includes a magnetoresistance effect multi-layer film including a multi-layer film having a GMR (Giant Magnetoresistance) effect or a TMR effect. The magnetoresistance effect multi-layer film is interposed between two wirings 41 and 42. Specifically, the magnetoresistance effect multi-layer film includes a recording layer (also called a magnetization inversion layer or free layer) 53 having a function of recording information and a magnetization reference layer (also called a pinned layer) 51 having a pinned magnetization direction and serving as a spin filter with a nonmagnetic material film 52 interposed therebetween. A current flows in a direction perpendicular to the film surface (see FIG. 2A). A schematic plan view of the recording layer 53 is shown in FIG. 2B. The size of the recording layer 53 depends on the type or thickness of a magnetic material forming the recording layer 53. The size of the recording layer 53 is about 200 nm or less in order to promote single magnetic domain formation and reduce a critical current $I_c$ of spin-injection magnetization inversion. The recording layer 53 may have two or more magnetization directions (for example, two lateral directions indicated by arrows in FIG. 2A, that is, a first direction and a second direction) by an appropriate magnetic anisotropy, and each of the magnetization directions corresponds to information to be recorded. In the example of FIG. 2B, the recording layer 53 is a long elliptic in a planar shape so as to be provided with a magnetic shape anisotropy. That is, the recording layer 53 has an easy magnetization axis parallel to the first direction and the second direction, and a hard magnetization axis orthogonal to the easy magnetization axis. The length of the recording layer 53 along the easy magnetization axis is longer than that of the recording layer 53 along the hard magnetization axis.

FIG. 19 shows the relationship between a memory cell size and a write current. In FIG. 19, the right vertical axis represents the memory cell size ($F^2$), the left vertical axis represents a write current, and the horizontal axis represents the size of a short side of an MTJ element. As will be apparent from FIG. 19, in the spin-injection magnetization inversion type, as the element size is reduced, the write current also decreases. When the cell size is the same as that of an embedded DRAM, the write current becomes small so as to be 100 µA. Meanwhile, in a known MRAM, as the element size is reduced, the write current significantly increases. When the cell size is the same as that of a 6-transistor type SRAM (6-TSRAM), the write current is about 1 mA.

In such a spin injection type magnetoresistance effect element, the device structure can be simplified, as compared with the MRAM. In addition, since magnetization inversion by spin injection is used, as described above, even if the element is miniaturized, the write current does not increase, as compared with the MRAM in which magnetization inversion is produced by an external magnetic field.

SUMMARY OF THE INVENTION

In order to maintain the characteristics of the MRAM or the magnetoresistance effect element, such as a spin injection type magnetoresistance effect element, an index Δ of thermal stability of a predetermined value or more needs to be secured such that magnetization inversion is not produced by heat. In general, it is said that the index Δ of thermal stability needs to be 60 or more. The index Δ of thermal stability may be expressed by the following equation (1).

$$\Delta = (M_s \cdot V \cdot H_k)/(2 \cdot k_B \cdot T) \tag{1}$$

$M_s$: the saturation magnetization level of the recording layer
V: the volume of the recording layer
$H_k$: the anisotropy field of the recording layer
$k_B$: the Boltzmann constant
T: the absolute temperature of the recording layer From the equation (1), it is determined that the index Δ of thermal stability increases as the saturation magnetization level $M_s$ increases, the volume V increases, and the anisotropy field $H_k$ increases. The anisotropy field $H_k$ of the recording layer is the amount corresponding to anisotropy energy (magneto-crystalline anisotropy energy) for directing spins within the crystal toward a predetermined direction. Magneto-crystalline anisotropy energy is energy necessary for fixing the direction of spins to be determined depending on the crystal structure and orientation.

A coercive force (coercivity) $H_c$, which is the intensity of a magnetic field opposite to a magnetized direction when the magnetism is substantially reduced to zero even after various magnetization processes is used as a value approximating ease of magnetization inversion. The anisotropy field $H_k$ and the coercive force $H_c$ are separately used as parameters necessary for material development or device development, and have a correspondence relationship. An increase in the coercive force $H_c$ causes an increase in the anisotropy field $H_k$. As a result, as seen from the equation (1), the index Δ of thermal stability may be improved. As shown in the following equation (2), the coercive force $H_c$ is expressed by the sum of an eigenvalue of a material forming the recording layer (the first term of the right-handed side in the equation (2)), a value according to the shape of the recording layer (the second term of the right-handed side in the equation (2)), a value according to internal stress of the recording layer (the third term of the right-handed side in the equation (2)), and the like.

$$H_c = H_{c\text{-}film} + (1/4\pi) \cdot \{(M_s \cdot t)/W\} \cdot f(r) + 3(\lambda/Ms) \cdot \sigma + A \tag{2}$$

$H_{c\text{-}film}$: the coercive force of the recording layer in a thin film state
t: the thickness of the recording layer
W: the length of the recording layer along the hard magnetization axis
f(r): the function of shape anisotropy in the recording layer
r: the aspect ratio of the recording layer (the length along the easy magnetization axis/the length along the hard magnetization axis)

λ: the magnetostriction constant of a material forming the recording layer

σ: stress in the recording layer along the easy magnetization axis (a positive value is tensile stress, and a negative value is a compressive force)

A: constant

The first term of the right-handed side in the equation (2) is an eigenvalue of a material forming the recording layer. Accordingly, the value of the first term of the right-handed side is uniquely determined according to the material forming the recording layer. The second term of the right-handed side in the equation (2) is a value according to the shape of the recording layer. The value of the second term of the right-handed side may be increased by increasing the aspect ratio of the recording layer and the shape anisotropy, but the aspect ratio of the recording layer is limited by the cell size or the like.

Therefore, from the equation (2), in order to increase the value of the coercive force $H_c$, it is most effective to increase the value of the third term of the right-handed side in the equation (2). In the third term of the right-handed side in the equation (2), the value of the saturation magnetization level $M_c$ and the value of the magnetostriction constant λ are uniquely determined according to the material forming the recording layer. For this reason, in order to increase the value of the third term of the right-handed side in the equation (2), it is desirable to increase the absolute value of stress σ along the easy magnetization axis.

Therefore, there is a need for a nonvolatile magnetic memory device that includes a magnetoresistance effect element having the configuration and structure capable of improving thermal stability of a recording layer by increasing a coercive force $H_c$.

A nonvolatile magnetic memory device according to a first embodiment, a second embodiment, or a third embodiment of the invention includes a magnetoresistance effect element that includes (A) a layered structure having a recording layer, (B) a first wiring electrically connected to a lower part of the layered structure, (C) a second wiring electrically connected to an upper part of the layered structure, and (D) an interlayer insulation layer surrounding the layered structure.

In the nonvolatile magnetic memory device according to the first embodiment of the invention, the magnetoresistance effect element further includes a low Young modulus region having a Young modulus lower than the Young modulus of a material forming the interlayer insulation layer, and the recording layer has an easy magnetization axis and a hard magnetization axis orthogonal to the easy magnetization axis. When the magnetostriction constant λ of a material forming the recording layer is a positive value, the low Young modulus region is disposed in an extension region of the easy magnetization axis of the recording layer, and when the magnetostriction constant λ of the material forming the recording layer is a negative value, the low Young modulus region is disposed in an extension region of the hard magnetization axis of the recording layer.

In the nonvolatile magnetic memory device according to the second embodiment of the invention, the magnetoresistance effect element further includes a high Young modulus region having a Young modulus higher than the Young modulus of a material forming the interlayer insulation layer, and the recording layer has an easy magnetization axis and a hard magnetization axis orthogonal to the easy magnetization axis. When the magnetostriction constant λ of a material forming the recording layer is a positive value, the high Young modulus region is disposed in an extension region of the hard magnetization axis of the recording layer, and when the magnetostriction constant λ of the material forming the recording layer is a negative value, the high Young modulus region is disposed in an extension region of the easy magnetization axis of the recording layer.

In the nonvolatile magnetic memory device according to the third embodiment of the invention, the magnetoresistance effect element further includes a high Young modulus region and a low Young modulus region having a Young modulus lower than the Young modulus of the high Young modulus region, and the recording layer has an easy magnetization axis and a hard magnetization axis orthogonal to the easy magnetization axis. When the magnetostriction constant λ of a material forming the recording layer is a positive value, the high Young modulus region is disposed in an extension region of the hard magnetization axis of the recording layer, and the low Young modulus region is disposed in an extension region of the easy magnetization axis of the recording layer. When the magnetostriction constant λ of the material forming the recording layer is a negative value, the high Young modulus region is disposed in the extension region of the easy magnetization axis of the recording layer, and the low Young modulus region is disposed in an extension region of the hard magnetization axis of the recording layer.

In the nonvolatile magnetic memory device according to the first embodiment of the invention, the low Young modulus region in the magnetoresistance effect element may be formed by an extension portion of the second wiring. Alternatively, the low Young modulus region may be formed by an extension portion of an upper insulation layer surrounding the second wiring.

In the nonvolatile magnetic memory device according to the second embodiment of the invention, the high Young modulus region in the magnetoresistance effect element may be formed by an extension portion of the second wiring. Alternatively, the high Young modulus region may be formed by an extension portion of an upper insulation layer surrounding the second wiring.

In the nonvolatile magnetic memory device according to the first embodiment, the second embodiment, or the third embodiment of the invention (hereinafter, these nonvolatile magnetic memory devices may be collectively and simply called "the nonvolatile magnetic memory device of the invention"), the magnetoresistance effect element may be formed by a tunnel magnetoresistance effect element using a TMR effect, and more preferably, may be formed by a spin injection type magnetoresistance effect element applying magnetization inversion by spin injection. In this case, a selection transistor including a field effect transistor may be provided below the layered structure, and an extension direction of the second wiring (for example, a bit line) may be parallel to an extension direction of a gate electrode constituting the field effect transistor. However, the invention is not limited thereto. For example, a projection image in an extension direction of the second wiring may be orthogonal to a projection image in an extension direction of a gate electrode constituting the field effect transistor. In some cases, the selection transistor may not be provided.

In the nonvolatile magnetic memory device of the invention having the above-described configuration, a connection portion may be provided between the upper part of the layered structure and the second wiring in the magnetoresistance effect element, the Young modulus of a material forming the connection portion may be higher than the Young modulus of the material forming the interlayer insulation layer. This configuration may be called "first configuration" for convenience. Alternatively, the Young modulus of a material forming the first wiring may be higher than the Young modulus of the material forming the interlayer insulation layer. This configuration may be called "second configuration" for convenience. In addition, a connection portion may be provided between the upper part of the layered structure and the second wiring, and the Young modulus of a material forming the connection portion may be higher than the Young modulus of the material forming the interlayer insulation layer, and the Young modulus of a material forming the first wiring may be higher than the Young modulus of the material forming the interlayer insulation layer. This configuration maybe called "third configuration" for convenience.

In the following description, the Young modulus of the low Young modulus region is called $E_L$, the Young modulus of the material forming the high Young modulus region is called $E_H$, the Young modulus of the material forming the interlayer insulation layer is called $E_0$, the Young modulus of the material forming the first wiring is called $E_1$, the Young modulus of a material forming the second wiring is called $E_2$, the Young modulus of a material forming the upper insulation layer is called $E_U$, and the Young modulus of the material forming the connection portion is called $E_C$.

In the nonvolatile magnetic memory device according to the first or third embodiment of the invention, as the material forming the low Young modulus region in the magnetoresistance effect element, a conductive material or an insulating material may be used. Alternatively, the low Young modulus region may be formed by a cavity. When the low Young modulus region is formed of a conductive material, examples of the conductive material include Cu, Al, Cu-based alloys, and Al-based alloys, which are widely used for wirings of semiconductors at present. Other examples of the conductive material include Au, Pt, Ta, Sn, In, Ag, Pb, Nb, Zn, Ni, Co, Fe, V, Cr, Ti, and Mg, alloys containing them as main components, and nitrides of them. When the low Young modulus region is formed of an insulating material, examples of the insulating material include SiOC, SiO, SiCN, organic SOG, which is an insulating material having a low dielectric constant, low-dielectric-constant insulating materials, such as polyimide-based resin and fluorine resin (for example, fluorocarbon, amorphous tetrafluoroethylene, polytetrafluoroethylene, polyarylether, arylether fluoride, polyimide fluoride, parylene, benzocyclobutene, amorphous carbon, cycloperfluorocarbon polymer, fullerene fluoride), Silk (Trademark of The Dow Chemical Co., a coat-type low-dielectric-constant material for an interlayer insulation film), Flare (Trademark of Honeywell Electronic Materials Co., a polyallyether (PAE)-based material). The material forming the low Young modulus region may be appropriately selected from among materials, for example, satisfying $E_0-E_L \geq 1\times10^{10}$ Pa (10 GPa) and preferably, $E_0-E_L \geq 5\times10^{10}$ Pa (50 GPa).

In the nonvolatile magnetic memory device according to the second or third embodiment of the invention, as the material forming the high Young modulus region in the magnetoresistance effect element, a conductive material or an insulating material may be used. When the high Young modulus region is formed of a conductive material, examples of the conductive material include Cu, Al, Cu-based alloys, and Al-based alloys, which are widely used for wirings of semiconductors at present. Other examples of the conductive material include Ir, W, Rh, Ru, and Mo, a layered structure of layers formed of them, and alloys containing them as main components. When the high Young modulus region is formed of an insulating material, examples of the insulating material include SiN series ($Si_3N_4$) as a representative, SiOC, SiO, SiCN, organic SOG, which is an insulating material having a low dielectric constant, and low-dielectric-constant insulating materials, such as polyimide-base resin and fluorine resin.

In general, the low-dielectric-constant insulating material is a material having a low Young modulus, but it may have a high Young modulus by a film deposition method or a layered structure. For this reason, the low-dielectric-constant insulating material is not particularly limited. The material forming the high Young modulus region may be appropriately selected from among materials, for example, satisfying $E_H-E_0 \geq 1\times10^{10}$ Pa (10 GPa) and preferably, $E_H-E_0 \geq 5\times10^{10}$ Pa.

In the nonvolatile magnetic memory device of the invention having the above-described configuration, examples of the material forming the first wiring in the magnetoresistance effect element include Ir, Re, Rh, Ru, Mo, W, TiN, $TiB_2$, $ZrB_2$, ZrN, $VB_2$, $NbB_2$, NbC, $TaB_2$, TaC, $CrB_2$, $MO_2B_5$, $W_2B_5$, and WC. When the Young modulus $E_1$ of the material forming the first wiring is higher than the Young modulus $E_0$ of the material forming the interlayer insulation layer, the material forming the first wiring serving as a source applying stress may be appropriately selected from among materials, for example, satisfying $E_1-E_0 \geq 1\times10^{10}$ Pa (10 GPa) and preferably, $E_1-E_0 \geq 5\times10^{10}$ Pa. Specifically, Ir, Re, Rh, Ru, Mo, W, TiN, $TiB_2$, $ZrB_2$, ZrN, $VB_2$, $NbB_2$, NbC, $TaB_2$, TaC, $CrB_2$, $MO_2B_5$, $W_2B_5$, and WC may be used. Alternatively, one of materials, for example, having the Young modulus $E_1$ of $4\times10^{11}$ Pa or more may be appropriately selected, or one of materials capable of applying compressive stress of $1\times10^8$ Pa to $5\times10^9$ Pa to the recording layer may be appropriately selected. As the material forming the second wiring (for example, functioning as a so-called bit line), the above-described materials may be used. When the low Young modulus region is formed by the extension portion of the second wiring, the material forming the second wiring may be appropriately selected from among materials, for example, satisfying $E_0-E_2 \geq 1\times10^{10}$ Pa (10 GPa) and preferably, $E_0-E_2 \geq 5\times10^{10}$ Pa. When the high Young modulus region is formed by the extension portion of the second wiring, the material forming the second wiring may be appropriately selected from among material, for example, satisfying $E_2-E_0 \geq 1\times10^{10}$ Pa (10 GPa) and preferably, $E_2-E_0 \geq 5\times10^{10}$ Pa.

As the material forming the interlayer insulation layer, SiN series ($Si_3N_4$) as a representative, SiOC, SiO, SiCN, organic SOG, which is an insulating material having a low dielectric constant, or a low-dielectric-constant insulating material, such as polyimide-based resin or fluorine resin, may be used. In general, the low-dielectric-constant insulating material is a material having a low Young modulus, but it may have a high Young modulus by a film deposition method or a layered structure. For this reason, the low-dielectric-constant insulating material is not particularly limited.

When the low Young modulus region is formed by the extension portion of the upper insulation layer surrounding the second wiring, examples of the material forming the upper insulation layer include SiOC, SiO, SiCN, organic SOG, which is an insulating material having a low dielectric constant, low-dielectric-constant insulating materials, such as polyimide-based resin and fluorine resin (for example, fluorocarbon, amorphous tetrafluoroethylene, polytetrafluoroethylene, polyarylether, arylether fluoride, polyimide fluoride, parylene, benzocyclobutene, amorphous carbon, cycloperfluorocarbon polymer, and fullerene fluoride), Silk, and Flare. Alternatively, the material forming the upper insulation layer may be appropriately selected from among materials, for example, satisfying $E_0-E_U \geq 1\times10^1$ Pa (10 GPa) and preferably, $E_0-E_U \geq 5\times10^{10}$ Pa. When the high Young modulus region is formed by the extension portion of the upper insulation layer surrounding the second wiring, examples of the material forming the upper insulation layer include SiN series ($Si_3N_4$) as a representative, SiOC, SiO, SiCN, organic SOG, which is an insulating material having a low dielectric constant, and low-dielectric-constant insulating materials, such as polyimide-based resin and fluorine resin. In general, the low-dielectric-constant insulating material is a material having a low Young modulus, but it may have a high Young modulus by a film deposition method or a layered structure. For this reason, the low-dielectric-constant insulating material is not particularly limited. Alternatively, the material forming the upper insulation layer may be appropriately selected from among materials, for example, satisfying $E_U-E_0 \geq 1\times10^{10}$ Pa (10 GPa) and preferably, $E_U-E_0 \geq 5\times10^{10}$ Pa.

Examples of the material forming the connection portion include Ir, Re, Rh, Ru, Mo, W, TiN, $TiB_2$, $ZrB_2$, ZrN, $VB_2$, $NbB_2$, NbC, $TaB_2$, TaC, $CrB_2$, $MO_2B_5$, $W_2B_5$, WC, Ta, TaN, WN, Al-based alloys, and Cu-based alloys. Particularly, in the connection portion, the same effect is obtained only by partially sandwiching between films having a high Young modulus. When the Young modulus $E_C$ of the material forming the connection portion is higher than the Young modulus $E_0$ of the material forming the interlayer insulation layer, the material forming the connection portion serving as a source applying stress may be appropriately selected from among materials, for example, satisfying $E_C-E_0 \geq 1\times10^{10}$ Pa (10 GPa) and preferably, $E_C-E_0 \geq 5\times10^{10}$ Pa, may be appropriately selected from among materials, for example, having the Young modulus $E_C$ of $4\times10^{11}$ Pa or more, or may be appropriately selected from among materials capable of applying compressive stress of $1\times10^8$ Pa to $5\times10^9$ Pa to the recording layer.

The values of the Young moduli of various metal materials and alloy materials are shown in the following Table 1.

TABLE 1

| Metal (Alloy) | Young Modulus (GPa) | Metal (Alloy) | Young Modulus (GPa) |
| --- | --- | --- | --- |
| Ir | 529 | $NbB_2$ | 630 |
| Re | 460 | NbC | 580 |
| Rh | 359 | $TaB_2$ | 680 |
| Ru | 414 | TaC | 560 |
| Mo | 324 | $CrB_2$ | 540 |
| W | 345 | $Mo_2B_5$ | 670 |
| TiN | 590 | $W_2B_5$ | 770 |
| $TiB_2$ | 560 | WC | 720 |
| $ZrB_2$ | 540 | Cu | 110 |
| ZrN | 510 | Ti | 116 |
| $VB_2$ | 510 | Ta | 186 |

The fact that the low Young modulus region or the high Young modulus region is disposed in the extension region of the easy magnetization axis or the extension region of the hard magnetization axis of the recording layer means a state where the low Young modulus region or the high Young modulus region is disposed so as to abut an end of the recording layer or so as to be away from the end of the recording layer. In the former case, the material forming the low Young modulus region or the high Young modulus region needs to be an insulating material, or the low Young modulus region may be formed by a cavity. In the latter case, a distance from the low Young modulus region or the high Young modulus region to the end of the recording layer is intrinsically arbitrary. The extension region of the easy magnetization axis of the recording layer indicates the maximum width of the recording layer when the recording layer is cut along the hard magnetization axis of the recording layer, that is, a strip-shaped region of the interlayer insulation layer that extends in parallel to the easy magnetization axis of the recording layer. The fact that the low Young modulus region or the high Young modulus region is disposed in the extension region of the easy magnetization axis of the recording layer means that the low Young modulus region or the high Young modulus region entirely or partially exists within the strip-shaped region. The extension region of the hard magnetization axis of the recording layer indicates the maximum width of the recording layer when the recording layer is cut along the easy magnetization axis of the recording layer, that is, a strip-shaped region of the interlayer insulation layer that extends in parallel to the hard magnetization axis of the recording layer. The fact that the low Young modulus region or the high Young modulus region is disposed in the extension region of the hard magnetization axis of the recording layer means that the low Young modulus region or the high Young modulus region entirely or partially exists within the strip-shaped region. The planar shape of the low Young modulus region or the high Young modulus region may be an arbitrary sectional shape including a circular shape, an elliptical shape, a flat oval shape, a triangular shape, a rectangular shape, a polygonal shape, a rounded triangular shape, a rounded rectangular shape, and a rounded polygonal shape. The low Young modulus regions or the high Young modulus regions may be disposed on both sides of a single recording layer, or a single low Young modulus region or high Young modulus region may be disposed between two adjacent recording layers.

Examples of the planar shape of the recording layer or the layered structure include an elliptical shape, a flat oval shape (a figure obtained from a combination of two semicircles and two line segments), a shape surrounded by a parabola or a hyperbola, a shape based on a figure which may be broadly expressed by a quadratic function or a cubic function or more, a regular polygonal shape (including a rectangular shape, a regular polygonal shape, such as a regular pentagonal shape or more, a rounded rectangular shape, and a rounded regular polygonal shape, such as a rounded regular pentagonal shape or more), and a flat circular shape (a figure obtained by crushing a circular shape in one direction). Other examples of the planar shape of the recording layer or the layered structure include a combination of an elliptical shape and a line segment, a combination of a parabola and a line segment, a combination of a hyperbola and a line segment, or broadly, a combination of a quadratic function and a linear function or a combination of a cubic function or more and a linear function. More preferably, a curved shape which will be described below may be used.

In the spin injection type magnetoresistance effect element, a layered structure having a TMR effect or a GMR effect may be formed by a magnetization reference layer (also called a pinned layer), a nonmagnetic material film, and a recording layer (also called a magnetization inversion layer or free layer) for storing information. The fact that the layered structure having a TMR effect is formed by the magnetization reference layer, the nonmagnetic material film, and the recording layer indicates a structure in which the nonmagnetic material film functioning as a tunnel insulation film is sandwiched between the magnetization reference layer formed of a magnetic material and the recording layer formed of a magnetic material. As an electrical connection state of the magnetization reference layer and the first wiring (or the second wiring), the first wiring (or the second wiring) may be directly connected to the magnetization reference layer, or the first wiring (or the second wiring) may be connected to the magnetization reference layer through an antiferromagnetic material layer. When the magnetization reference layer is connected to the first wiring, a polarized spin current is injected from the first wiring into the recording layer through the magnetization reference layer, and when the magnetization reference layer is connected to the second wiring, a polarized spin current is injected from the second wiring into the recording layer through the magnetization reference layer. In addition, the magnetization direction in the recording layer is set to a first direction (a direction parallel to the easy magnetization axis) or a second direction (a direction opposite to the first direction). Thus, information is written in the recording layer. The magnetization reference layer may have a layered ferri structure (a layered structure having antiferromagnetic coupling), or the magnetization reference layer may have a magnetostatic coupling structure. The layered ferri structure indicates a structure which has, for example, a three-layered structure of magnetic material layer/ruthenium (Ru) layer/magnetic material layer (specifically, for example, a three-layered structure of CoFe/Ru/CoFe or a three-layered structure of CoFeB/Ru/CoFeB), and in which interlayer exchange coupling of the two magnetic material layers becomes antiferromagnetic or ferromagnetic according to the thickness of the ruthenium layer. A structure in which interlayer exchange coupling of the two magnetic material layers becomes ferromagnetic is called a layered ferro structure. A structure in which, in the two magnetic material layers, antiferromagnetic coupling is obtained by a leak magnetic field from the end surface of the magnetic material layer is called a magnetostatic coupling structure. Examples of a material for the antiferromagnetic material layer include an iron-manganese alloy, a nickel-manganese alloy, a platinum-manganese alloy, an iridium-manganese alloy, a rhodium-manganese alloy, a cobalt oxide, and a nickel oxide. A base film formed of Ta, Cr, Ru, or Ti may be formed between the first wiring (or the second wiring) and the antiferromagnetic material layer in order to improve crystallinity of the antiferromagnetic material layer.

In the spin injection type magnetoresistance effect element, examples of the materials forming the recording layer (magnetization inversion layer) and the magnetization reference layer include ferromagnetic materials, such as nickel (Ni), iron (Fe), and cobalt (Co), alloys of the ferromagnetic materials (for example, Co—Fe, Co—Fe—Ni, and Ni—Fe), alloys (for example, Co—Fe—B) obtained by mixing the alloys of the ferromagnetic materials with nonmagnetic elements (for example, tantalum, boron, chromium, platinum, silicon, carbon, and nitrogen), and oxides (for example, ferrite: Fe—MnO) containing one or more of Co, Fe, and Ni, a group of intermetallic compounds called halfmetallic ferromagnetic materials (Heusler alloys: NiMnSb, $Co_2MnGe$, $Co_2MnSi$, and $CO_2CrAl$), and oxides (for example, (La,Sr)$MnO_3$, $CrO_2$, and $Fe_3O_4$). The crystallinity of the recording layer or the magnetization reference layer is intrinsically arbitrary. The recording layer and the magnetization reference layer may be polycrystalline, monocrystalline, or amorphous. Further, various magnetic semiconductors may be used regardless of soft magnetic (soft film) or hard magnetic (hard film).

In the spin injection type magnetoresistance effect element, as a material forming the nonmagnetic material film constituting the layered structure having a TMR effect, insulating materials, such as aluminum oxide ($AlO_x$), aluminum nitride (AlN), magnesium oxide (MgO), magnesium nitride, silicon oxide, silicon nitride, $TiO_2$ or $Cr_2O_3$, Ge, NiO, $CdO_x$, $HfO_2$, $Ta_2O_5$, BN, and ZnS, may be used. As a material forming the nonmagnetic material film constituting the layered structure having a GMR effect, conductive materials, such as Cu, Ru, Cr, Au, Ag, Pt, Ta, and alloys thereof may be used. If conductivity is high (resistivity is several hundred $\mu\Omega\cdot cm$ or less), any nonmetallic material may be used. Preferably, a material which is difficult to produce interface reaction with the recording layer or the magnetization reference layer is appropriately selected.

These layers may be formed, for example, by physical vapor deposition (PVD), such as sputtering, ion beam deposition, or vacuum deposition, or chemical vapor deposition (CVD), such as ALD (Atomic Layer Deposition).

The nonmagnetic material film may be obtained through oxidization or nitridation of a metal film formed by sputtering. Specifically, when aluminum oxide ($AlO_x$) is used as an insulating material forming the nonmagnetic material film, for example, a method of oxidizing aluminum formed by sputtering in the atmosphere, a method of plasma oxidizing aluminum formed by sputtering, a method of oxidizing aluminum formed by sputtering using ICP plasma, a method of spontaneously oxidizing aluminum formed by sputtering under an oxygen atmosphere, a method of oxidizing aluminum formed by sputtering using oxygen radicals, a method of irradiating ultraviolet rays when aluminum formed by sputtering is spontaneously oxidized under an oxygen atmosphere, a method of forming an aluminum film by reactive sputtering, or a method of forming an aluminum oxide ($AlO_x$) film by sputtering may be used.

When the magnetoresistance effect element is formed by a tunnel magnetoresistance effect element using a TMR effect, the layered structure includes a first ferromagnetic material layer, a tunnel insulation film, and a recording layer (also called a second ferromagnetic material layer or free layer). More specifically, the first ferromagnetic material layer preferably has a two-layered structure of an antiferromagnetic material layer and a ferromagnetic material layer (also called a pinned layer or magnetization pinned layer). Therefore, the first ferromagnetic material layer may have a strong unidirectional magnetic anisotropy by the exchange interaction between the two layers. The magnetization pinned layer abuts the tunnel insulation film. The magnetization pinned layer may have, for example, a multi-layered structure (for example, ferromagnetic material layer/metal layer/ferromagnetic material layer) having synthetic antiferromagnetic coupling (SAF). Synthetic antiferromagnetic coupling is reported, for example, by S. S. Parkin et al, Physical Review Letters, 7 May, pp. 2304-2307 (1990). In the recording layer, the magnetization direction is rotated comparatively easily. The tunnel insulation film plays the roles of interrupting magnetic coupling between the recording layer and the magnetization pinned layer and of passing a tunnel current.

In the tunnel magnetoresistance effect element, the first ferromagnetic material layer (the pinned layer or magnetization pinned layer) and the recording layer (the second ferromagnetic material layer or free layer) may be formed of, for example, ferromagnetic materials containing transition metal magnetic elements, specifically, nickel (Ni), iron (Fe), or cobalt (Co), or ferromagnetic materials containing alloys of the transition metals (for example, Co—Fe, Co—Fe—Ni, and Ni—Fe) as main components. Further, so-called halfmetallic ferromagnetic materials or amorphous ferromagnetic materials, such as CoFe—B may be used. Examples of the material forming the antiferromagnetic material layer include an iron-manganese alloy, a nickel-manganese alloy, a platinum-manganese ally, an iridium-manganese alloy, a rhodium-manganese alloy, cobalt oxide, and nickel oxide. These layers may be formed, for example, by PVD, such as sputtering, ion beam deposition, or vacuum deposition.

In the tunnel magnetoresistance effect element, as an insulating material forming the tunnel insulation film, aluminum oxide ($AlO_x$), aluminum nitride (AlN), magnesium oxide (MgO), magnesium nitride, silicon oxide, or silicon nitride may be used. In addition, Ge, NiO, $CdO_x$, $HfO_2$, $Ta_2O_5$, BN, or ZnS may be used. The tunnel insulation film may be obtained, for example, through oxidization or nitridation of a metal film formed by sputtering. More specifically, when aluminum oxide (AlO$_x$) is used as an insulating material forming the tunnel insulation film, for example, a method of oxidizing aluminum formed by sputtering in the atmosphere, a method of oxidizing aluminum formed by sputtering using plasma, a method of oxidizing aluminum formed by sputtering using ICP plasma, a method of spontaneously oxidizing aluminum formed by sputtering under an oxygen atmosphere, a method of oxidizing aluminum formed by sputtering using oxygen radicals, a method of irradiating ultraviolet rays when aluminum formed by sputtering is spontaneously oxidized under an oxygen atmosphere, a method of forming an aluminum film by reactive sputtering, or a method of forming an aluminum oxide film by sputtering may be used. Alternatively, the tunnel insulation film may be formed by ALD.

The layered structure in the magnetoresistance effect element may be patterned, for example, by reactive ion etching (RIE), ion milling (ion beam etching). In some cases, the layered structure may be patterned by a so-called lift-off method.

In the nonvolatile magnetic memory device, a selection transistor including a field effect transistor may further provided below the layered structure. More specifically, though not limited, a selection transistor formed on a semiconductor substrate and a lower insulation layer covering the selection transistor may be provided. In this case, the first wiring may be formed on the lower insulation layer, such that the first wiring may be electrically connected to the selection transistor through a connection hole in the lower insulation layer (or a connection hole and a landing pad portion or a lower wiring). The interlayer insulation layer may surround the layered structure so as to cover the lower insulation layer and the first wiring, and the second wiring may be formed on the interlayer insulation layer.

In the tunnel magnetoresistance effect element (MRAM), the lower insulation layer has a layered structure of a first lower insulation layer and a second lower insulation layer, a write word line is formed on the first lower insulation layer, and the second lower insulation layer covers the write word line and the first lower insulation layer.

The selection transistor may include, for example, a known MISFET or MOSFET. The connection hole that electrically connects the first wiring and the selection transistor may be formed of polysilicon doped with an impurity, a high-melting metal, such as tungsten, Ti, Pt, Pd, Cu, TiW, TiNW, WSi$_2$, or MoSi$_2$, or metal silicide, and may be formed by CVD or PVD, such as sputtering. Examples of a material for the lower insulation layer include silicon oxide (SiO$_2$), silicon nitride (SiN), SiON, SOG, NSG, BPSG, PSG, BSG, and LTO. The lower wiring or the write word line in the tunnel magnetoresistance effect element may be formed of, for example, aluminum, an aluminum-based alloy, such as Al—Cu, or copper (Cu), and may be formed, for example, by PVD, such as sputtering.

In the nonvolatile magnetic memory device of the invention, when the magnetostriction constant λ of the material forming the recording layer is a positive value, (1-A) the low Young modulus region is disposed in the extension region of the easy magnetization axis of the recording layer (the nonvolatile magnetic memory device according to the first embodiment of the invention), (1-B) the high Young modulus region is disposed in the extension region of the hard magnetization axis of the recording layer (the nonvolatile magnetic memory device according to the second embodiment of the invention), or (1-C) the high Young modulus region is disposed in the extension region of the hard magnetization axis of the recording layer and the low Young modulus region is disposed in the extension region of the easy magnetization axis of the recording layer (the nonvolatile magnetic memory device according to the third embodiment of the invention). Therefore, when the magnetostriction constant λ of the material forming the recording layer is a positive value, it is possible to apply large tensile stress (σ) to the recording layer along the easy magnetization axis of the recording layer.

When the magnetostriction constant λ of the material forming the recording layer is a negative value, (2-A) the low Young modulus region is disposed in the extension region of the hard magnetization axis of the recording layer (the nonvolatile magnetic memory device according to the first embodiment of the invention), (2-B) the high Young modulus region is disposed in the extension region of the easy magnetization axis of the recording layer (the nonvolatile magnetic memory device according to the second embodiment of the invention), or (2-C) the high Young modulus region is disposed in the extension region of the easy magnetization axis of the recording layer and the low Young modulus region is disposed in the extension region of the hard magnetization axis of the recording layer (the nonvolatile magnetic memory device according to the third embodiment of the invention). Therefore, when the magnetostriction constant λ of the material forming the recording layer is a negative value, large compressive stress (σ) can be applied to the recording layer along the easy magnetization axis of the recording layer.

Since large tensile stress or compressive stress can be applied to the recording layer along the easy magnetization axis of the recording layer, the value of the third term $[3(\lambda/M_s)\cdot\sigma]$ of the right-handed side in the equation (2) can be increased. As a result, the coercive force $H_c$ can be increased due to a Villari effect, also called an inverse magnetostriction effect, and thus the anisotropy field $H_k$ can be increased. Therefore, the index Δ of thermal stability in the equation (1) can be improved. For this reason, it is possible to provide a nonvolatile magnetic memory device that includes a highly reliable magnetoresistance effect element capable of improving thermal stability of the recording layer and a data retaining characteristic. The magnitude of stress (σ) does not depend on the material forming the recording layer. As a result, by appropriately selecting of a material forming the recording layer, for example, a critical current (write current) $I_c$ of spin-injection magnetization inversion can be reduced, and thus low power consumption of the nonvolatile magnetic memory device can be achieved.

DESCRIPTION OF PREFERRED EMBODIMENTS

Hereinafter, the invention will be described based on Examples with reference to the drawings.

Example 1

Figure 1A:
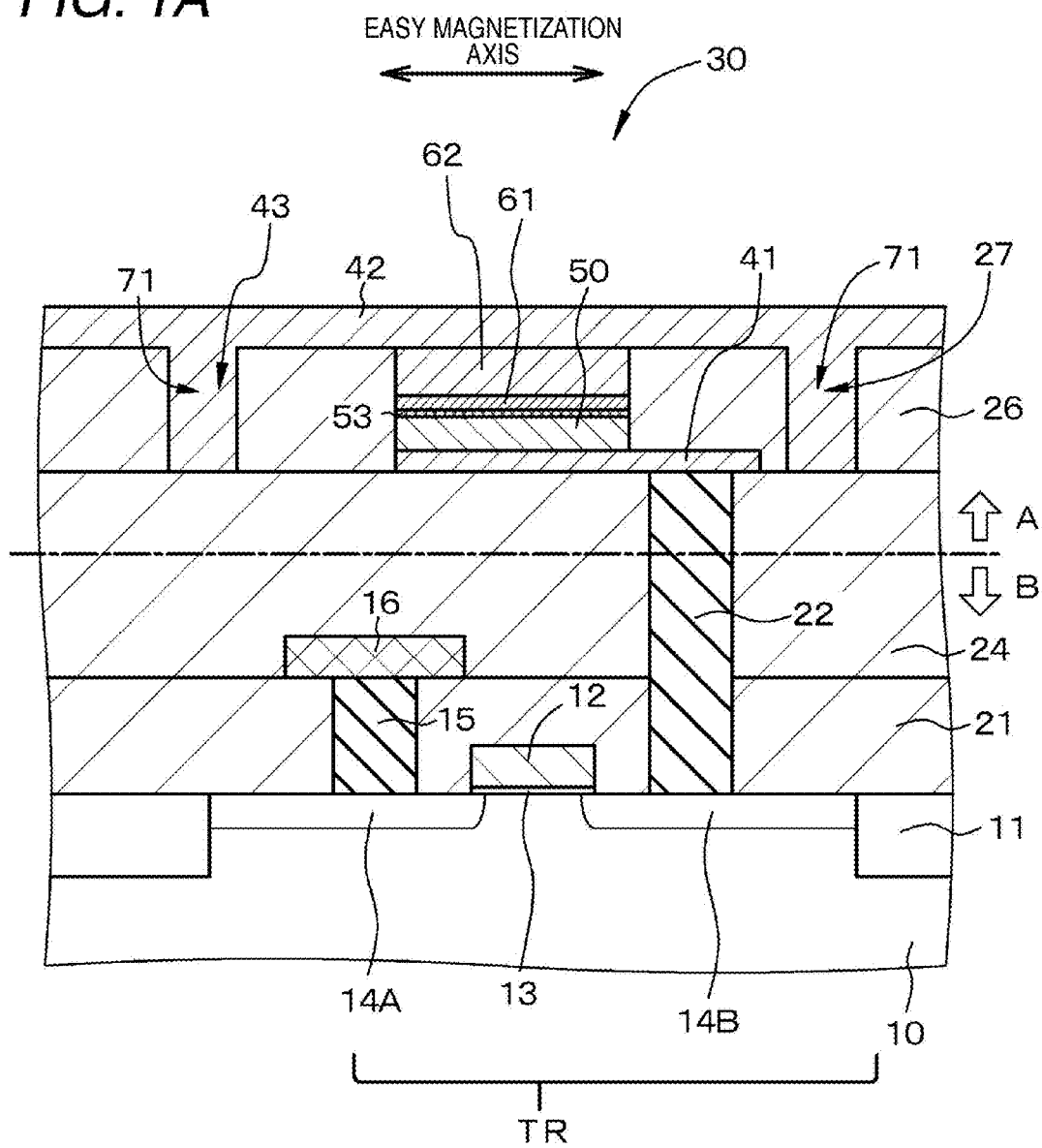
FIGS. 1A and 1B are a schematic partial sectional view of a nonvolatile magnetic memory device according to Example 1, and a schematic layout view of a second wiring and the like, respectively.
Figure 1B:
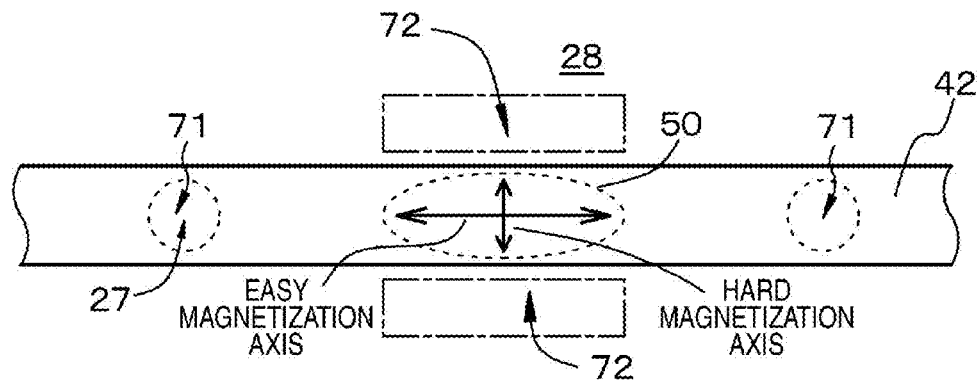
Figure 2A:
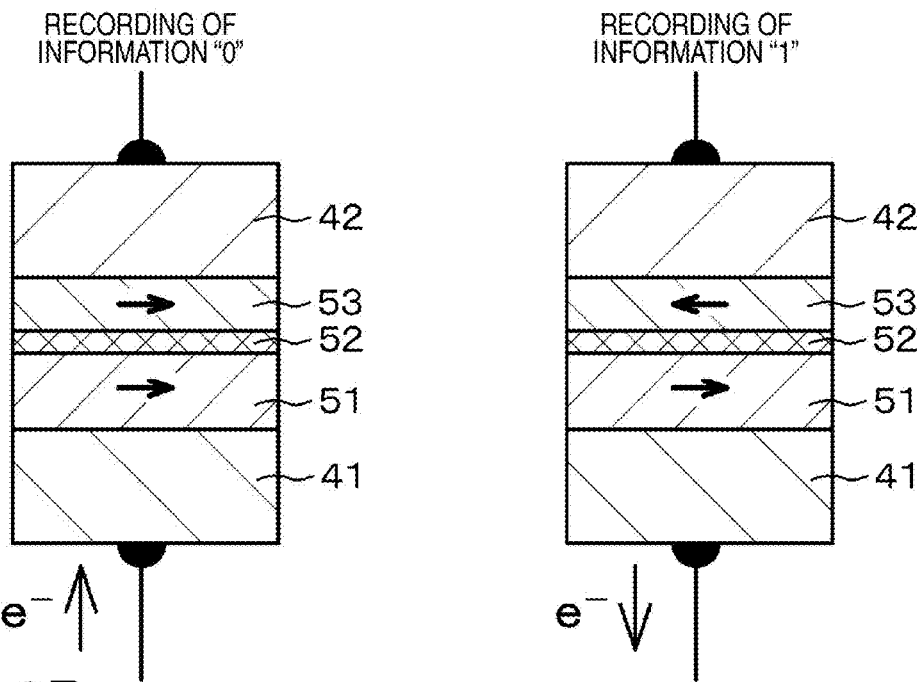
FIGS. 2A and 2B are a conceptual view of a spin injection type magnetoresistance effect element applying spin-injection magnetization inversion, and a schematic plan view of a magnetization inversion layer, respectively.
Figure 2B:
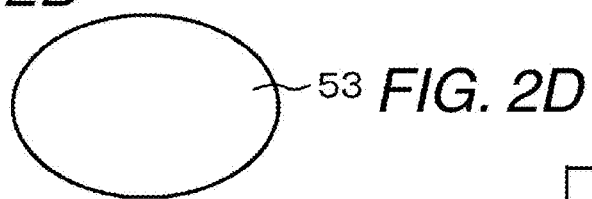

Example 1 relates to the nonvolatile magnetic memory device according to the first and third embodiments of the invention, and specifically, to first configuration. A schematic partial sectional view of the nonvolatile magnetic memory device of Example 1 or Example 3 described below is shown in FIG. 1A, and a schematic layout view of a second wiring and the like is shown in FIG. 1B. A conceptual view of a layered structure is shown in FIG. 2A, and a schematic plan view of a recording layer is shown in FIG. 2B. As shown in the drawings, the nonvolatile magnetic memory device includes a magnetoresistance effect element 30 that includes (A) a layered structure 50 having a recording layer 53, (B) a first wiring 41 electrically connected to a lower part of the layered structure 50, (C) a second wiring 42 electrically connected to an upper part of the layered structure 50, and (D) an interlayer insulation layer 26 surrounding the layered structure 50. In Example 1 to Example 10, the magnetoresistance effect element 30 is formed by a spin injection type magnetoresistance effect element applying magnetization inversion by spin injection.

Referring to the schematic partial sectional view of FIG. 1A, in a region "A" on an upper side of a one-dot-chain line and a region "B" on a lower side of the one-dot-chain line, a direction from which the section of the nonvolatile magnetic memory device is viewed varies by 90 degrees. That is, in the region "A", the section of the nonvolatile magnetic memory device is viewed from a direction parallel to a hard magnetization axis, and in the region "B", the section of the nonvolatile magnetic memory device is viewed from a direction parallel to an easy magnetization axis. Therefore, in FIG. 1A, a state where a projection image in an extension direction of the second wiring (in Example 1, a bit line) 42 is orthogonal to a projection image in an extension direction of a gate electrode 12 constituting a field effect transistor is shown, but they are actually parallel to each other.

The recording layer 53 constituting the layered structure 50 has an easy magnetization axis and a hard magnetization axis orthogonal to the easy magnetization axis. In Example 1, the easy magnetization axis is parallel to the second wiring 42. In the nonvolatile magnetic memory device of Example 1, the magnetoresistance effect element 30 further includes a low Young modulus region 71 having a Young modulus $E_L$ lower than the Young modulus $E_0$ of a material forming the interlayer insulation layer 26. In Example 1, the magnetostriction constant λ of a material forming the recording layer 53 is a positive value, and the low Young modulus region 71 is disposed in an extension region of the easy magnetization axis of the recording layer 53. Specifically, in Example 1, the low Young modulus region 71 is formed by an extension portion 43 of the second wiring 42, and as indicated by a dotted line in FIG. 1B, the planar shape of the low Young modulus region 71 is a circular shape.

Alternatively, the magnetoresistance effect element 30 may further include a high Young modulus region 72 and a low Young modulus region 71 having a Young modulus lower than the Young modulus of the high Young modulus region 72. In this case, the high Young modulus region 72 may be disposed in an extension region of the hard magnetization axis of the recording layer 53, and the low Young modulus region 71 may be disposed in an extension region of the easy magnetization axis of the recording layer 53. In Example 1, specifically, the high Young modulus region 72 corresponds to a portion of the interlayer insulation layer 26 that exists in the extension region of the hard magnetization axis of the recording layer 53. In FIG. 1B, the high Young modulus region 72 is indicated by a one-dot-chain line, and the high Young modulus region 72 is formed by the interlayer insulation layer 26 itself.

A connection portion 62 is provided between the upper part of the layered structure 50 and the second wiring 42, and the Young modulus $E_C$ of a material forming the connection portion 62 serving as a source applying stress is higher than the Young modulus $E_0$ of a material forming the interlayer insulation layer 26. Specifically, the connection portion 62 is formed of a 100 nm-thick TiN layer and is formed by sputtering. When sputtering, by forming the connection portion 62 while inclining a semiconductor substrate, stress along the easy magnetization axis of the recording layer can be increased.

A cap layer 61 formed of an about 5 nm-thick Ta layer is formed between the layered structure 50 and the connection portion 62 by sputtering. The cap layer 61 functions to prevent mutual diffusion between the atoms constituting the wiring or the connection portion 62 and the atoms constituting the recording layer 53, to reduce contact resistance, and to prevent oxidation of the recording layer 53. Other examples of the cap layer include a Ru layer, a Pt layer, an MgO layer, and a layered structure of Ru film/Ta film.

A selection transistor TR including a field effect transistor is provided below the layered structure 50 (more specifically, below the first wiring 41). An extension direction of the second wiring (bit line) 42 is parallel to an extension direction of the gate electrode 12 constituting the field effect transistor. Specifically, the selection transistor TR is formed in a portion of the silicon semiconductor substrate 10 surrounded by an element isolation region 11 and is covered with the lower insulation layers 21 and 24. One source/drain region 14B is connected to the first wiring 41 through a connection hole 22 including a tungsten plug. The other source/drain region 14A is connected to a sense line 16 through a tungsten plug 15. In the drawings, reference numeral 12 denotes a gate electrode (functioning as a so-called word line), and reference numeral 13 denotes a gate insulation film.

As shown in the conceptual view of FIG. 2A, the layered structure 50 has the following configuration and structure and is formed by sputtering. In the magnetization pinned layer, the magnetization direction is pinned by exchange coupling of Pt—Mn of an antiferromagnetic material layer constituting an upper bottom layer. In the recording layer 53, the magnetization direction is changed to be parallel or antiparallel to the pinned magnetization depending on a direction in which a current flows.

Specifically, the spin injection type magnetoresistance effect element of Example 1 has a structure in which a magnetoresistance effect multi-layer film including a multi-layer film having a GMR (Giant Magnetoresistance) effect or a TMR effect is sandwiched between two wirings 41 and 42. That is, a recording layer (also called a magnetization inversion layer or free layer) 53 having a function of recording information and a magnetization reference layer (also called a pinned layer) 51 having a pinned magnetization direction and serving as a spin filter are laminated with a nonmagnetic material film 52 interposed therebetween. A current flows in a direction perpendicular to the film surface (see FIG. 2A). A schematic plan view of the recording layer 53 is shown in FIG. 2B. The size of the recording layer 53 depends on the type or thickness of a magnetic material forming the recording layer 53. The size of the recording layer 53 is about 200 nm or less in order to promote single magnetic domain formation and reduce a critical current $I_c$ of spin-injection magnetization inversion. The recording layer 53 may have two or more magnetization directions (for example, two lateral directions indicated by arrows in FIG. 2A, that is, a first direction and a second direction) by an appropriate magnetic anisotropy, and each of the magnetization directions corresponds to information to be recorded. In the example of FIG. 2B, the recording layer 53 is a long elliptic in a planar shape so as to be provided with a magnetic shape anisotropy. That is, the recording layer 53 has an easy magnetization axis parallel to the first direction and the second direction, and a hard magnetization axis. The length of the recording layer 53 along the easy magnetization axis is longer than that of the recording layer 53 along the hard magnetization axis.

Figure 2C:
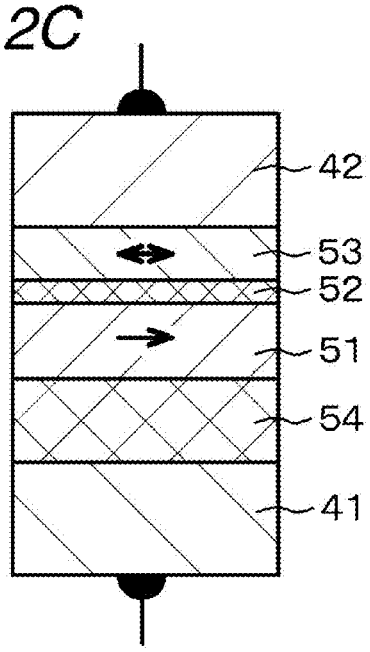
FIG. 2C is a schematic view showing a state where, in the spin injection type magnetoresistance effect element, the magnetization direction of a magnetization reference layer is pinned by exchange coupling to an antiferromagnetic material layer.
Figure 2D:
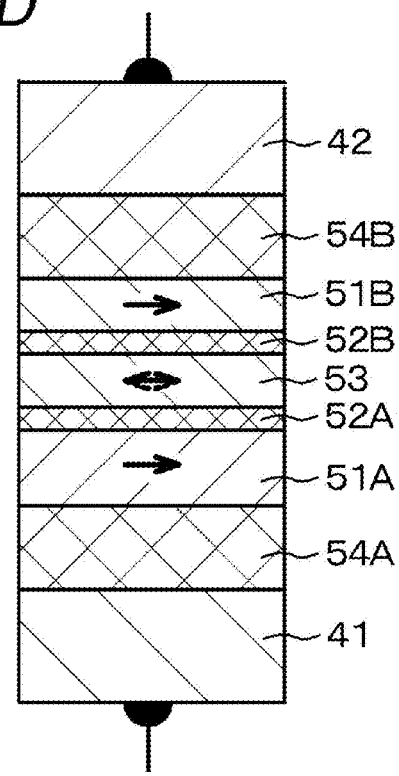
FIG. 2D is a conceptual view of a spin injection type magnetoresistance effect element having a double spin filter structure.

The magnetization direction of the magnetization reference layer 51 is usually pinned by exchange coupling of the antiferromagnetic material layer 54 (see FIG. 2C). A double spin filter structure is known in which magnetization reference layers 51A and 51B are disposed above and below the recording layer 53 with nonmagnetic material films 52A and 52B interposed therebetween, respectively, thereby improving efficiency of spin-injection magnetization inversion (see FIG. 2D). Reference numerals 54A and 54B are antiferromagnetic material layers. In the example of FIGS. 2A, 2C, and 2D, the recording layer 53 and the magnetization reference layer 51 (when the magnetization reference layer includes two layers 51A and 51B, one of the two layers) may have a layered ferri structure. The nonmagnetic material films 52, 52A, and 52B are formed of a metal material or an insulating material. In the structure of FIG. 2A or 2C, in order to suppress a leak magnetic field from the magnetization reference layer 51 to the recording layer 53, that is, in order to prevent magnetostatic coupling of the magnetization reference layer 51 and the recording layer 53, the magnetization reference layer 51 is formed so as to be sufficiently larger than the recording layer 53. In any cases, a nonvolatile magnetic memory element applying spin-injection magnetization inversion (spin injection type magnetoresistance effect element) has a two-terminal spin transfer element structure in which a magnetoresistance effect multi-layer film is sandwiched between wirings.

(Layered Structure 50)
  Recording layer 53
    About 3 nm-thick Co—Fe—B layer
  Nonmagnetic material film (tunnel insulation film) 52
    1.0 nm-thick MgO film
  Magnetization reference layer (multi-layer film having SAF) 51 (in the drawing, a single layer is shown)
    Upper layer: Co—Fe—B layer
    Medium layer: Ru layer
    Lower layer: Co—Fe layer The second wiring 42 and the low Young modulus region 71 formed by the extension portion 43 of the second wiring are formed of copper (Cu), and the low Young modulus region 71 is formed by filling a hole 27 in the interlayer insulation layer 26 with copper. The interlayer insulation layer 26 is formed of an SiN layer formed by plasma CVD. The connection portion 62 is formed of a TiN layer, as described above, and the Young modulus $E_C$ of the material forming the connection portion 62 is higher than the Young modulus $E_0$ of the material forming the interlayer insulation layer 26. The values of the Young moduli are shown below. The first wiring 41 has a two-layered structure of an upper layer including an 20 nm-thick antiferromagnetic material layer formed of a Pt—Mn alloy and a lower layer formed of a 10 nm-thick Ta layer. In the drawing, the first wiring 41 is shown in the form of a single layer.

Young modulus $E_L$ of low Young modulus region 71: about $1.5 \times 10^{11}$ Pa Young modulus $E_0$ of interlayer insulation layer 26: about $2.2 \times 10^{11}$ Pa Young modulus $E_C$ of material forming connection portion 62: about $5.9 \times 10^{11}$ Pa Hereinafter, the overview of a manufacturing method of the nonvolatile magnetic memory device of Example 1 will be described. Unless otherwise noted, nonvolatile magnetic memory devices of other Examples may be basically manufactured by the same method.

(Step-100)

First, by a known method, the element isolation region 11 is formed in the silicon semiconductor substrate 10, and the gate oxide film 13, the gate electrode 12, and the selection transistor TR including the source/drain regions 14A and 14B are formed in a portion of the silicon semiconductor substrate 10 surrounded by the element isolation region 11. Next, the first lower insulation layer 21 is formed, the tungsten plug 15 is formed in a portion of the first lower insulation layer 21 above the source/drain region 14A, and the sense line 16 is formed on the first lower insulation layer 21. Subsequently, the second lower insulation layer 24 is formed on the entire surface, and the connection hole 22 including a tungsten plug is formed in the lower insulation layers 21 and 24 above the source/drain region 14B. Thus, the selection transistor TR covered with the lower insulation layers 21 and 24 can be obtained.

(Step-110)

Next, the first wiring 41 having a two-layered structure, the layered structure 50, the cap layer 61, and the connection portion 62 are successively formed on the entire surface by sputtering in vacuum. When sputtering, by forming the connection portion 62 while inclining the semiconductor substrate, it is desirable to increase stress along the easy magnetization axis of the recording layer.

(First Wiring 41 of Two-Layered Structure)
  Process gas: argon=100 sccm
  Atmospheric pressure: 0.6 Pa
  DC power: 200 W
(Magnetization Reference Layer 51)
Lower Layer
  Process gas: argon=50 sccm
  Atmospheric pressure: 0.3 Pa
  DC power: 100 W
Medium Layer
  Process gas: argon=50 sccm
  Atmospheric pressure: 0.3 Pa
  DC power: 50 W
Upper Layer
  Process gas: argon=50 sccm
  Atmospheric pressure: 0.3 Pa
  DC power: 100 W
(Nonmagnetic Material Film 52)
  Process gas: argon=100 sccm
  Atmospheric pressure: 1.0 Pa
  RF power: 500 W
(Recording Layer 53)
  Process gas: argon=50 sccm
  Atmospheric pressure: 0.3 Pa
  DC power: 200 W
(Cap Layer 61)
  Process gas: argon=100 sccm
  Atmospheric pressure: 0.6 Pa
  DC power: 200 W
(Connection Portion 62)
  Process gas: argon=30 sccm
  Reactive gas: $N_2$=70 sccm
  Atmospheric pressure: 0.7 Pa
  DC power: 10 kW (Step-120)

Next, a hard mask layer (not shown) formed of $SiO_2$ is formed on the first wiring 41, the layered structure 50, the cap layer 61, and the connection portion 62 by bias high-density plasma CVD (HDP-CVD), a patterned resist layer is formed on the hard mask layer. Next, the hard mask layer is etched by dry etching, and the resist layer is removed by ashing. Next, the connection portion 62, the cap layer 61, and the layered structure 50 are etched by reactive ion etching (RIE) with the hard mask layer as an etching mask, and as shown in the schematic plan view by a dotted line of FIG. 1B, an elliptical layered structure 50 is provided. In some cases, etching is executed to the recording layer 53 in the layered structure 50. At this time, the nonmagnetic material film (tunnel insulation film) 52 and the magnetization reference layer 51 may not be etched. Instead of patterning the connection portion 62, the cap layer 61, and the recording layer 53 by the RIE method, ion milling (ion beam etching) maybe used for patterning. Next, an etching mask is formed, and the first wiring 41 is patterned. When the nonmagnetic material film 52 and the magnetization reference layer 51 are not etched, at this time, the nonmagnetic material film 52 and the magnetization reference layer 51 may be etched.

(Step-130)

Next, the interlayer insulation layer 26 formed of an SiN layer is formed on the entire surface by plasma CVD. Thereafter, the interlayer insulation layer 26 and the hard mask layer are planarized by chemical mechanical polishing (CMP), and thus the connection portion 62 is exposed.

(Step-140)

Next, the upper insulation layer 28 (see FIG. 1B) formed of a silicon oxide (P—SiO) film by plasma CVD is formed on the entire surface, and a concave portion (groove) for forming the second wiring 42 is formed in the upper insulation layer 28 by photolithography or dry etching. Next, the hole 27 for forming the low Young modulus region 71 in the bottom of the groove is provided in the interlayer insulation layer 26.

(Step-150)

Next, a copper layer, the second wiring 42 formed of copper, and the low Young modulus region 71 formed by the extension portion 43 of the second wiring 42 are formed on the upper insulation layer 28, inside of the groove, and inside of the hole 27 in the interlayer insulation layer 26 by plating. Next, the copper layer on the upper insulation layer 28 is removed by CMP. In this way, the nonvolatile magnetic memory device having the structure shown in FIGS. 1A and 1B can be obtained.

In the nonvolatile magnetic memory device of Example 1, the connection portion 62 also functions as a source applying stress. With this connection portion 62, though also depending on the exterior shape of the recording layer 53, compressive stress (a force pressing the recording layer 53) of about $0.1 \times 10^9$ Pa to $5 \times 10^9$ Pa is applied to the recording layer 53. As a result, although the recording layer 53 is displaced so as to expand in a direction along the easy magnetization axis and a direction along the hard magnetization axis, the low Young modulus region 71 is disposed in the extension region of the easy magnetization axis of the recording layer 53. Accordingly, the recording layer 53 is displaced so as to expand along the easy magnetization axis of the recording layer 53. Actually, however, since the recording layer 53 is surrounded by the interlayer insulation layer 26, the recording layer 53 cannot be displaced, and tensile stress is applied to the recording layer 53. For this reason, the value of the third term of the right-handed side in the equation (2) can be increased, and thus the coercive force $H_c$ can be increased. In addition, the anisotropy field $H_k$ can be increased. As a result, the index $\Delta$ of thermal stability in the equation (1) can be improved. For this reason, it is possible to provide a nonvolatile magnetic memory device that includes a highly reliable magnetoresistance effect element capable of improving the thermal stability of the recording layer 53 and increasing the coercive force $H_c$, thereby improving a data retaining characteristic. The magnitude of stress ($\sigma$) does not depend on the material forming the recording layer 53. Therefore, by appropriately selecting the material forming the recording layer 53, for example, a critical current (write current) $I_c$ of spin-injection magnetization inversion can be reduced, and low power consumption of the nonvolatile magnetic memory device can be achieved.

The relationship between the material and thickness of the connection portion 62 and the coercive force $H_c$ was examined. The recording layer 53 was formed of a 2 nm-thick Co—Fe—B layer. For convenience, in the sample, the connection portion 62 was formed of Ta (Young modulus: 186 GPa). Compressive stress against the recording layer 53 formed of 10 nm-thick Ta is about 2 GPa, and compressive stress against the recording layer 53 of 20 nm-thick Ta is about 3 GPa. As the measurement results of the coercive force $H_c$, in the case of the 10 nm-thick connection portion 62, the coercive force $H_c$ was 40 (Oe), and in the case of the 20 nm-thick connection portion 62, the coercive force $H_c$ was 50 (Oe). That is, the coercive force $H_c$ was increased by 10 (Oe). When the connection portion 62 is formed of Ru (10 nm-thick) having a Young modulus (414 GPA) about 2.2 times larger than the Young modulus of Ta, the coercive force $H_c$ was 70 (Oe). From this, it was determined that the coercive force $H_c$ was in proportion to the Young modulus of the material forming the connection portion 62.

Instead of Step-140 and Step-150, the hole 27 for forming the low Young modulus region 71 may be provided in the interlayer insulation layer 26 by photolithography and dry etching, then an aluminum layer or an aluminum alloy layer may be formed on the interlayer insulation layer 26 including the hole 27 by sputtering, and subsequently the aluminum layer or the aluminum alloy layer may be patterned by photolithography and etching. In this way, the second wiring 42 and the low Young modulus region 71 may be obtained. Before the aluminum layer or the aluminum alloy layer is formed, a Ti layer and a TiN layer functioning as a barrier layer may be sequentially formed on the entire surface.

Figure 3A:
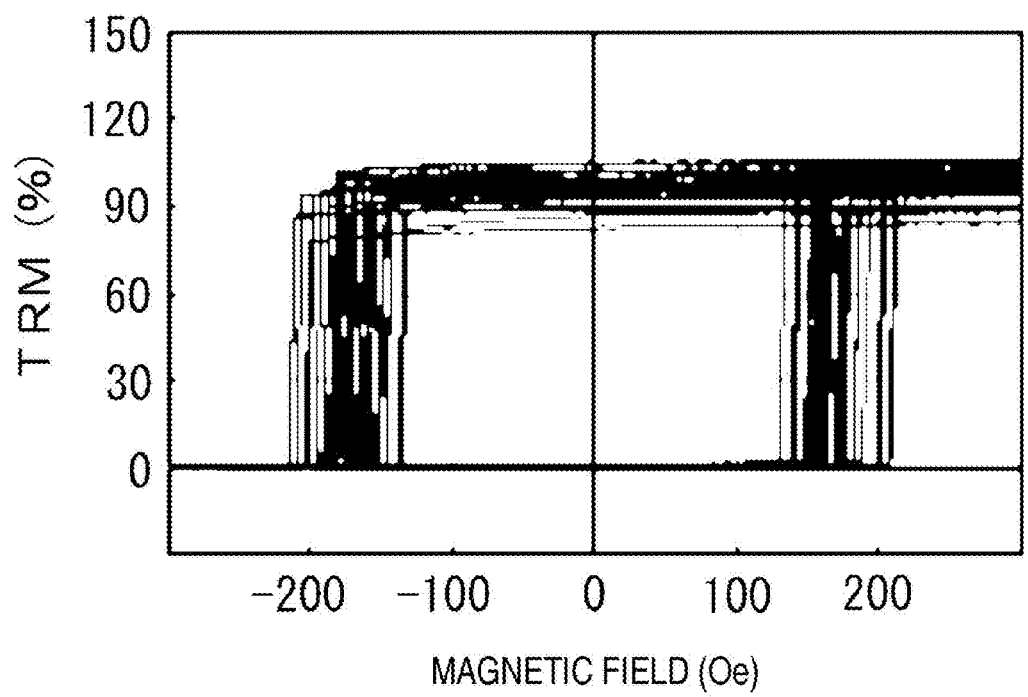
FIGS. 3A and 3B are graphs showing measurement results of an applied magnetic field and an TMR effect in a sample according to an example and a sample according to a comparative example, respectively.
Figure 3B:
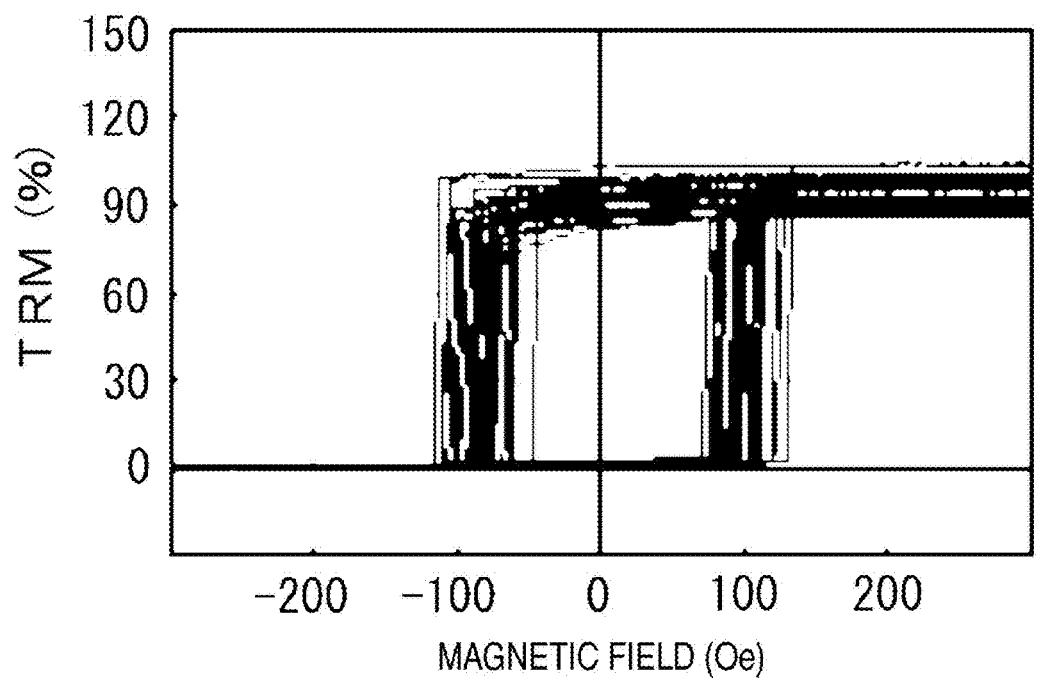

The measurement result of the relationship between an applied magnetic field and a TMR effect in the Example sample including the second wiring 42 and the low Young modulus region 71 formed of aluminum is shown in FIG. 3A. For comparison, the measurement result of the relationship between an applied magnetic field and a TMR effect in a comparative example sample having no low Young modulus region 71 is shown in FIG. 3B. From FIGS. 3A and 3B, it is determined that the Example sample has an increased coercive force $H_c$ about 1.5 times larger than the comparative example sample. The value of the index Δ of thermal stability calculated on the basis of the result is as follows, and the high index Δ of thermal stability could be achieved.

Example sample: $A$=82 [coercive force $H_c$: about 150 (Oe)]

Comparative example sample: $A$=63 [coercive force $H_c$: about 100 (Oe)]

Example 2

Figure 4A:
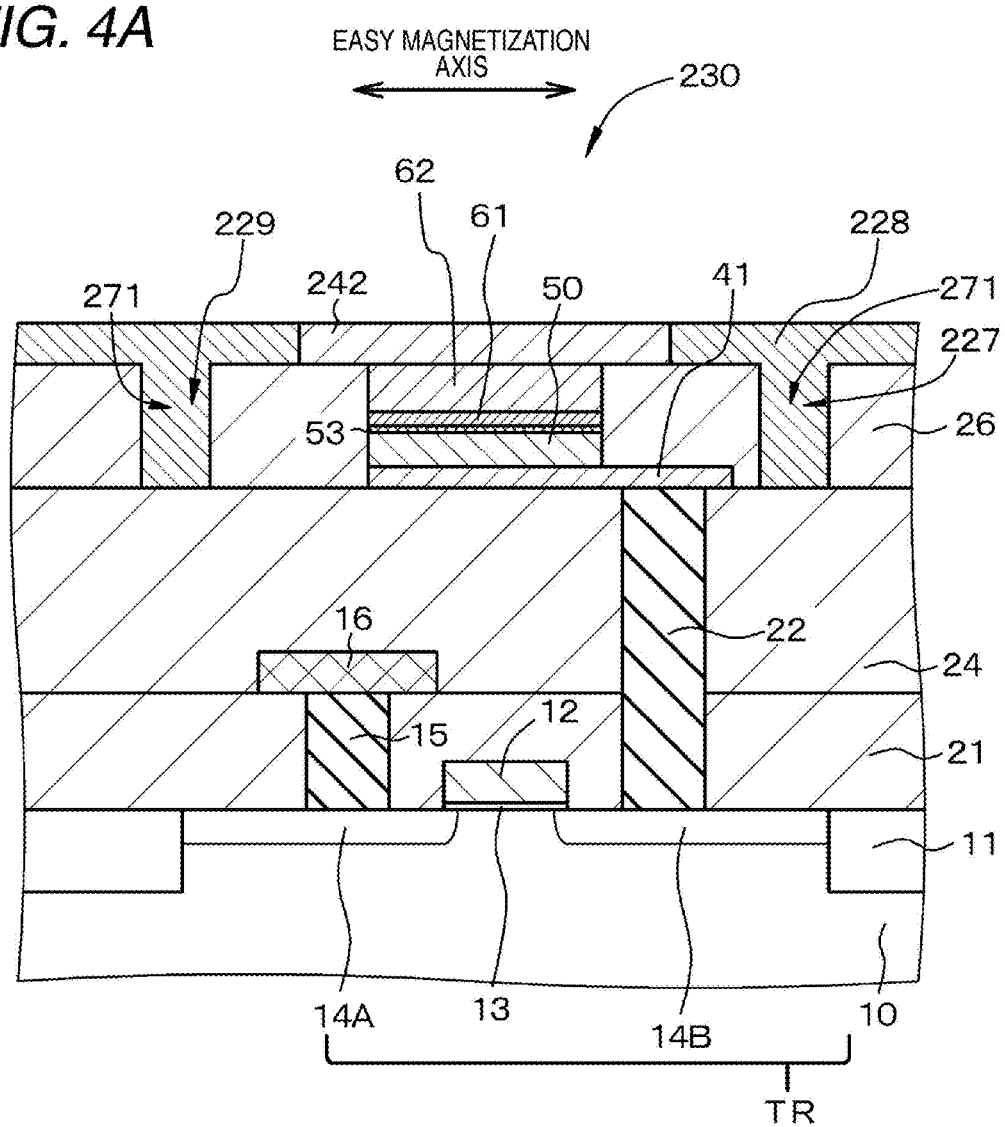
FIGS. 4A and 4B are a schematic partial sectional view of a nonvolatile magnetic memory device according to Example 2, and a schematic layout view of a second wiring and the like, respectively.
Figure 4B:
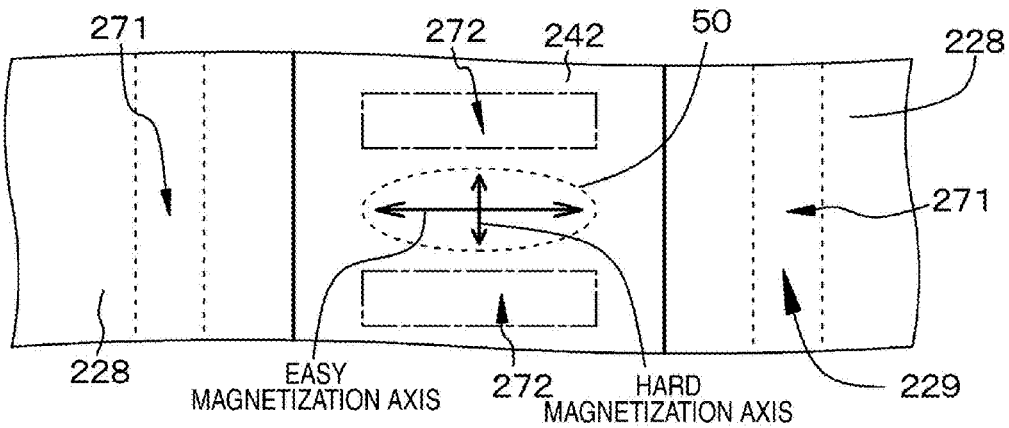

Example 2 is a modification of Example 1. A schematic partial sectional view of a nonvolatile magnetic memory device of Example 2 is shown in FIG. 4A, and a schematic layout view of a second wiring and the like is shown in FIG. 4B. Unlike FIG. 1A, in FIG. 4A, the all sections of the nonvolatile magnetic memory device are viewed from a direction parallel to the hard magnetization axis. A projection image in an extension direction of a second wiring (bit line) 242 is parallel to a projection image in an extension direction of the gate electrode 12 constituting the field effect transistor.

In Example 1, the low Young modulus region 71 constituting the magnetoresistance effect element 30 was formed by the extension portion 43 of the second wiring 42. Meanwhile, in Example 2, a low Young modulus region 271 constituting a magnetoresistance effect element 230 is formed by an extension portion 229 of an upper insulation layer 228 surrounding the second wiring 242. As indicated by a dotted line in FIG. 4B, the low Young modulus region 271 has a strip-shaped planar shape extending so as to be parallel to the second wiring 242. Like Example 1, the planar shape of the low Young modulus region 271 may have a circular shape.

In Example 2, the upper insulation layer 228 was formed of a silicon oxide (P—SiO) film formed by plasma CVD. The Young modulus $E_U$ of the upper insulation layer 228 is $5 \times 10^{10}$ Pa (50 GPa).

Except for the above configuration and structure, the configuration and structure of the nonvolatile magnetic memory device of Example 2 may be the same as the configuration and structure of the nonvolatile magnetic memory device of Example 1, and thus detailed descriptions thereof will be omitted.

The nonvolatile magnetic memory device of Example 2 can be manufactured by the following method.

(Step-200)

First, the same steps as Step-100 to Step-130 of Example 1 are executed.

(Step-210)

Thereafter, a groove 227 for forming the low Young modulus region 271 is provided in the interlayer insulation layer 26 by photolithography and dry etching. Next, the upper insulation layer 228 is formed on the entire surface to fill the groove 227, and a groove (concave portion) is formed in the upper insulation layer 228 corresponding to a portion, in which the second wiring 242 is to be formed, by photolithography and dry etching.

(Step-220)

Next, a copper layer and the second wiring 242 formed of copper are formed on the upper insulation layer 228 and inside of the groove by plating. Thereafter, the copper layer on the upper insulation layer 228 is removed by CMP. In this way, the nonvolatile magnetic memory device having the structure shown in FIGS. 4A and 4B can be obtained.

Example 3

Example 3 is also a modification of Example 1, and relates to the second configuration. In Example 3, the Young modulus $E_1$ of the material forming the first wiring is higher than the Young modulus $E_0$ of the material forming the interlayer insulation layer 26. Specifically, the material forming the first wiring is ruthenium (Ru, Young modulus $E_1$: $4.1 \times 10^{11}$ Pa). As the material forming the first wiring, other materials, for example, tungsten (W, Young modulus $E_1$: $3.5 \times 10^{11}$ Pa) may be used. In Example 3, the material forming the connection portion is TiN (Young modulus: $1.1 \times 10^{11}$ Pa), and does not have a function as a source applying stress.

Except for the above configuration and structure, the configuration and structure of the nonvolatile magnetic memory device of Example 3 may be the same as the configuration and structure of the nonvolatile magnetic memory device of Example 1, and thus detailed descriptions thereof will be omitted. In Example 3, the configuration and structure of the low Young modulus region 271 described in Example 2 may be used.

In the nonvolatile magnetic memory device of Example 3, the first wiring also functions as a source applying stress. With this first wiring, though also depending on the exterior shape of the recording layer 53, compressive stress (a force pressing the recording layer 53) of 10 GPa or more is applied to the recording layer 53. As a result, the same phenomenon as described in Example 1 is produced, and thus tensile stress is applied to the recording layer 53. For this reason, the same effects as described in Example 1 can be obtained.

Example 4

Example 4 is a modification of Example 1 and Example 3, and relates to the third configuration. Like Example 1, in Example 4, the connection portion 62 is provided between the upper part of the layered structure 50 and the second wiring 42, and the Young modulus $E_C$ of the material forming the connection portion 62 is higher than the Young modulus $E_0$ of the material forming the interlayer insulation layer 26. In addition, like Example 3, the Young modulus $E_1$ of the material forming the first wiring is higher than the Young modulus $E_0$ of the material forming the interlayer insulation layer 26.

Except for the above configuration and structure, the configuration and structure of the nonvolatile magnetic memory device of Example 4 may be the same as the configuration and structure of the nonvolatile magnetic memory devices of Example 1 and Example 3, and thus detailed descriptions thereof will be omitted. In Example 4, the configuration and structure of low Young modulus region 271 described in Example 2 may be used.

Example 5

Figure 5A:
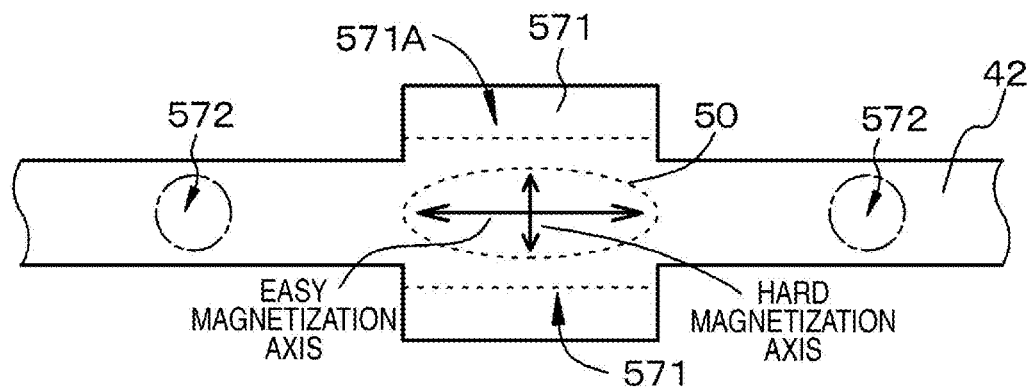
FIGS. 5A and 5B are schematic layout views of a second wiring and the like in a nonvolatile magnetic memory device according to Example 5.

Example 5 is a modification of Example 1. In Example 5, as a material forming the recording layer, a material having a negative magnetostriction constant λ (specifically, $Ne_{90}Fe_{10}$ [material having a Ne:Fe composition ratio of 90/10], $\lambda = -2.0 \times 10^5$) was used. A schematic layout view of a second wiring and the like is shown in FIG. 5A. As shown in FIG. 5A, a low Young modulus region 571 is disposed in an extension region of the hard magnetization axis of the recording layer. A portion 571A of the low Young modulus region surrounded by a solid line and a one-dot-chain line extends to the interlayer insulation layer 26.

A high Young modulus region 572 is regarded as to be disposed in an extension region of the easy magnetization axis of the recording layer 53. More specifically, in Example 5, the high Young modulus region 572 corresponds to a portion of the interlayer insulation layer 26 that exists in the extension region of the easy magnetization axis of the recording layer 53. In FIG. 5A, the high Young modulus region 572 is indicated by a one-dot-chain line, and the high Young modulus region 572 is formed by the interlayer insulation layer 26 itself.

Figure 5B:
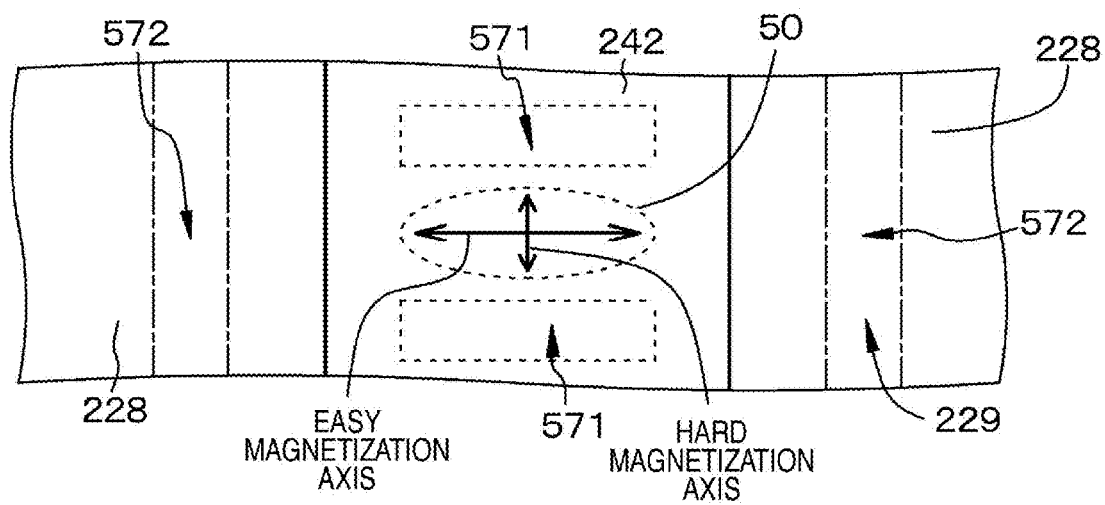

Except for the above configuration and structure, the configuration and structure of the nonvolatile magnetic memory device of Example 5 may be the same as the configuration and structure of the nonvolatile magnetic memory device of Example 1, and thus detailed descriptions thereof will be omitted. In Example 5, the configuration and structure of the low Young modulus region 271 described in Example 2 may be used (see the schematic layout view of the second wiring and the like of FIG. 5B). The configuration and structure of the first wiring or the connection portion described in Example 3 and Example 4 may be used.

Example 6

Example 6 relates to a nonvolatile magnetic memory device according to the second and third embodiments of the invention, and specifically, to the first configuration. A schematic partial sectional view of the nonvolatile magnetic memory device of Example 6 is basically the same as that shown in FIG. 1A.

Figure 6A:
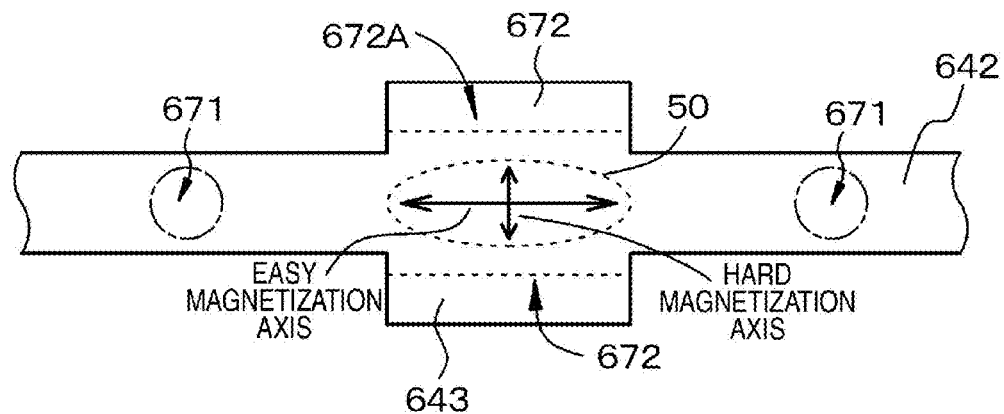
FIGS. 6A, 6B, and 6C are schematic layout views of a second wiring and the like in a nonvolatile magnetic memory device according to Examples 6, 7, and 10, respectively.

In Example 6, the recording layer 53 constituting the layered structure 50 has an easy magnetization axis and a hard magnetization axis orthogonal to the easy magnetization axis. In Example 6, the easy magnetization axis is parallel to a second wiring 642. A schematic layout view of a second wiring and the like in the nonvolatile magnetic memory device of Example 6 is shown in FIG. 6A. The magnetoresistance effect element further includes a high Young modulus region 672 having a Young modulus $E_H$ higher than the Young modulus $E_0$ of the material forming the interlayer insulation layer. In Example 6, the magnetostriction constant λ of the material forming the recording layer 53 is a positive value, and the high Young modulus region 672 is disposed in an extension region of the hard magnetization axis of the recording layer 53. Specifically, in Example 6, the high Young modulus region 672 is formed by an extension portion 643 of the second wiring 642, and as indicated by a region surrounded by a solid line and a dotted line in FIG. 6A, the planar shape thereof is a rectangular shape. A portion 672A of the high Young modulus region extends to the interlayer insulation layer 26. In Example 6, the second wiring 642 and the high Young modulus region 672, which is the extension portion 643 of the second wiring 642, are formed of ruthenium (Ru, Young modulus $E_H$: $4.1 \times 10^{11}$ Pa) or tungsten (W, Young modulus $E_H$: $3.5 \times 10^{11}$ Pa). In some cases, the second wiring 642 and the high Young modulus region 672, which is the extension portion 643 of the second wiring 642, may have a two-layered structure of a lower layer formed of ruthenium (Ru) or tungsten (W) and an upper layer formed of aluminum (Al) or copper (Cu).

A low Young modulus region 671 is regarded as to be disposed in an extension region of the easy magnetization axis of the recording layer 53. More specifically, in Example 6, the low Young modulus region 671 corresponds to a portion of the interlayer insulation layer 26 that exits in the extension region of the easy magnetization axis of the recording layer 53. In FIG. 6A, the low Young modulus region 671 is indicated by a one-dot-chain line, and the low Young modulus region 671 is formed by the interlayer insulation layer itself.

Except for the above configuration and structure, the configuration and structure of the nonvolatile magnetic memory device of Example 6 may be the same as the configuration and structure of the nonvolatile magnetic memory device of Example 1, and thus detailed descriptions thereof will be omitted.

In the nonvolatile magnetic memory device of Example 6, the connection portion 62 also functions as a source applying stress. With this connection portion 62, though also depending on the exterior shape of the recording layer 53, compressive stress (a force pressing the recording layer 53) of 10 GPa or more is applied to the recording layer 53. As a result, although the recording layer 53 is displaced so as to expand in a direction along the easy magnetization axis and a direction along the hard magnetization axis, the high Young modulus region 672 is disposed in the extension region of the hard magnetization axis of the recording layer 53. Accordingly, the recording layer 53 is displaced so as to expand along the easy magnetization axis of the recording layer 53. Actually, however, since the recording layer 53 is surrounded by the interlayer insulation layer 26, the recording layer 53 cannot be displaced, and tensile stress is applied to the recording layer 53. For this reason, the value of the third term of the right-handed side in the equation (2) can be increased, and thus the coercive force $H_c$ can be increased. In addition, the anisotropy field $H_k$ can be increased. As a result, the index Δ of thermal stability in the equation (1) can be improved. For this reason, it is possible to provide a nonvolatile magnetic memory device that includes a highly reliable magnetoresistance effect element capable of improving the thermal stability of the recording layer 53 and increasing the coercive force $H_c$, thereby improving a data retaining characteristic. The magnitude of stress (σ) does not depend on the material forming the recording layer 53. Therefore, by appropriately selecting the material forming the recording layer 53, for example, a critical current (write current) $I_c$ of spin-injection magnetization inversion can be reduced, and low power consumption of the nonvolatile magnetic memory device can be achieved.

Example 7

Figure 6B:
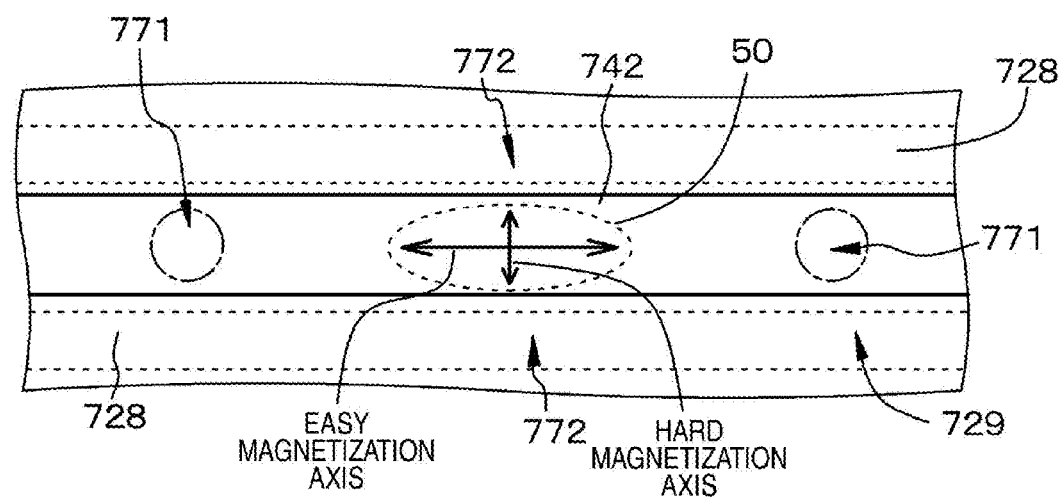

Example 7 is a modification of Example 6. A schematic layout view of a second wiring and the like in a nonvolatile magnetic memory device of Example 7 is shown in FIG. 6B. In Example 6, the high Young modulus region 672 constituting the magnetoresistance effect element was formed by the extension portion 643 of the second wiring 642. In Example 7, a high Young modulus region 772 constituting the magnetoresistance effect element is formed by an extension portion 729 of an upper insulation layer 728 surrounding a second wiring 742. The high Young modulus region 772 is indicated by a dotted line in FIG. 6B, and has a strip-shaped planar shape extending in parallel to the second wiring 742. Like Example 6, the planar shape of the high Young modulus region 772 may have a circular shape.

In Example 7, the upper insulation layer 728 was formed of SiN (Young modulus $E_U$: about $2.2 \times 10^{11}$ Pa), and the interlayer insulation layer 26 was formed of a silicon oxide (P—SiO, Young modulus $E_0$: $5 \times 10^{10}$ Pa) film formed by plasma CVD.

Except for the above configuration and structure, the configuration and structure of the nonvolatile magnetic memory device of Example 7 may be the same as the configuration and structure of the nonvolatile magnetic memory device of Example 6, and thus detailed descriptions thereof will be omitted. The nonvolatile magnetic memory device of Example 7 may be substantially manufactured by the same method as Example 2, and thus a detailed description of the manufacturing method will be omitted.

Example 8

Example 8 is a modification of Example 6, and relates to the second configuration. In Example 8, the Young modulus $E_1$ of the material forming the first wiring is higher than the Young modulus $E_0$ of the material forming the interlayer insulation layer. Specifically, the first wiring is formed of the same material as the first wiring described in Example 3.

Except for the above configuration and structure, the configuration and structure of the nonvolatile magnetic memory device of Example 8 may be the same as the configuration and structure of the nonvolatile magnetic memory device of Example 6, and thus detailed descriptions thereof will be omitted. In Example 8, the configuration and structure of the high Young modulus region 772 described in Example 7 may be used.

In the nonvolatile magnetic memory device of Example 8, the first wiring also functions as a source applying stress. With this first wiring, though also depending on the exterior shape of the recording layer 53, compressive stress (a force pressing the recording layer 53) of 10 GPa or more is applied to the recording layer 53. As a result, the same phenomenon as described in Example 1 is produced, and thus tensile stress is applied to the recording layer 53. For this reason, the same effects as described in Example 1 can be obtained.

Example 9

Example 9 is a modification of Example 6 and Example 8, and relates to the third configuration. In Example 9, like the Example 6, the connection portion 62 is provided between the upper part of the layered structure 50 and the second wiring, and the Young modulus $E_C$ of the material forming the connection portion 62 is higher than the Young modulus $E_0$ of the material forming the interlayer insulation layer 26. In addition, like Example 8, the Young modulus $E_1$ of the material forming the first wiring is higher than the Young modulus $E_0$ of the material forming the interlayer insulation layer 26.

Except for the above configuration and structure, the configuration and structure of the nonvolatile magnetic memory device of Example 9 may be the same as the configuration and structure of the nonvolatile magnetic memory device of Example 6 and Example 8, and thus detailed descriptions thereof will be omitted. In Example 9, the configuration and structure of the high Young modulus region 772 described in Example 7 may be used.

Example 10

Figure 6C:
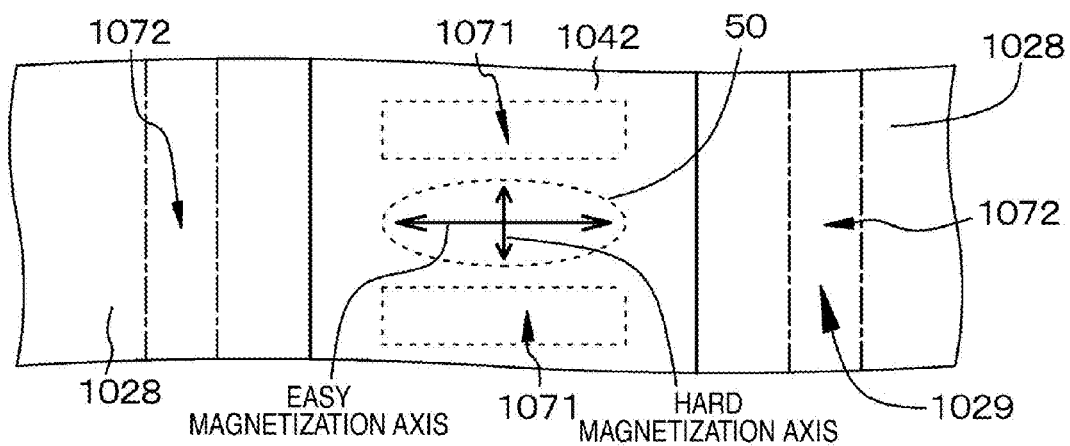

Example 10 is a modification of Example 6. In Example 10, like Example 5, as a material forming the recording layer, a material having a negative magnetostriction constant $\lambda$ value was used. A schematic layout view of a second wiring and the like is shown in FIG. 6C. As shown in FIG. 6C, a high Young modulus region 1072 is disposed in an extension region of the easy magnetization axis of the recording layer 53. A portion of the high Young modulus region 1072 surrounded by a dotted line extends to the interlayer insulation layer 26.

A low Young modulus region 1071 is regarded as to be disposed in an extension region of the hard magnetization axis of the recording layer 53. More specifically, in Example 10, the low Young modulus region 1071 corresponds to a portion of the interlayer insulation layer that exists in the extension region of the hard magnetization axis of the recording layer 53. In FIG. 6C, the low Young modulus region 1071 is indicated by a one-dot-chain line, and the low Young modulus region is formed by the interlayer insulation layer itself.

Except for the above configuration and structure, the configuration and structure of the nonvolatile magnetic memory device of Example 10 may be the same as the configuration and structure of the nonvolatile magnetic memory device of Example 6, and thus detailed descriptions thereof will be omitted. In Example 10, the configuration and structure of the high Young modulus region described in Example 7 maybe used. In addition, the configuration and structure of the first wiring or the connection portion described in Example 8 and Example 9 may be used.

Although the invention has been described based on Examples, the invention is not limited to Examples. Various layered structures and used materials described in Examples are just for illustrative, but they may be appropriately changed. In Examples, the spin injection type magnetoresistance effect element having a structure in which the recording layer is an uppermost layer of the layered structure has been described, but a spin injection type magnetoresistance effect element having a structure in which the lamination order of the layers is reversed and the recording layer is a lowermost layer may be adopted. The magnetization reference layer 51, the nonmagnetic material film 52, and the recording layer 53 constituting the layered structure may not have the same shape and size. In addition, the magnetization reference layer 51 and the nonmagnetic material film 52 may extend onto the first wiring 41.

Figure 7:
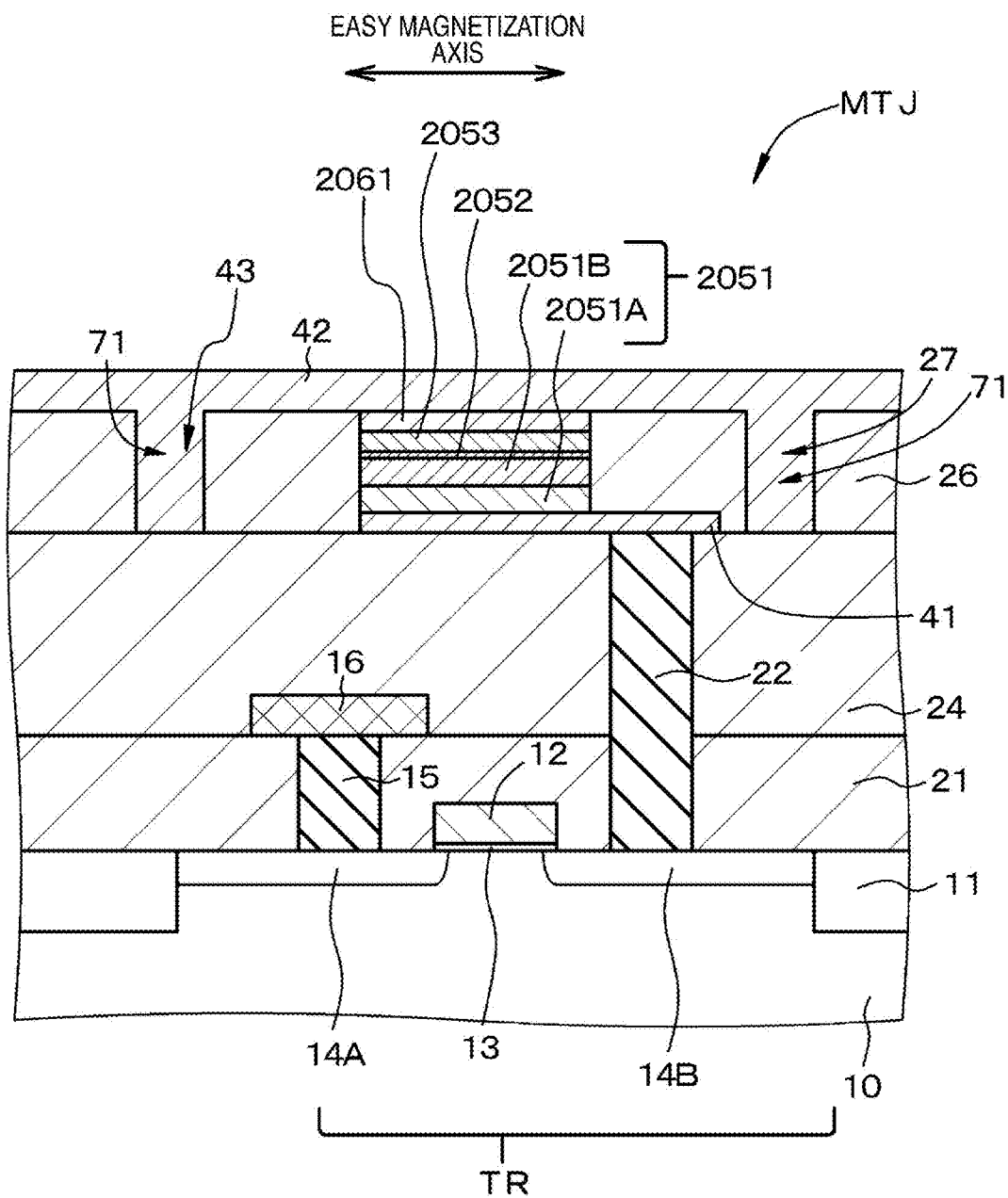
FIG. 7 is a schematic partial sectional view of a modification of the nonvolatile magnetic memory device according to Example 1 (a tunnel magnetoresistance effect element using a TMR effect).
Figure 18:
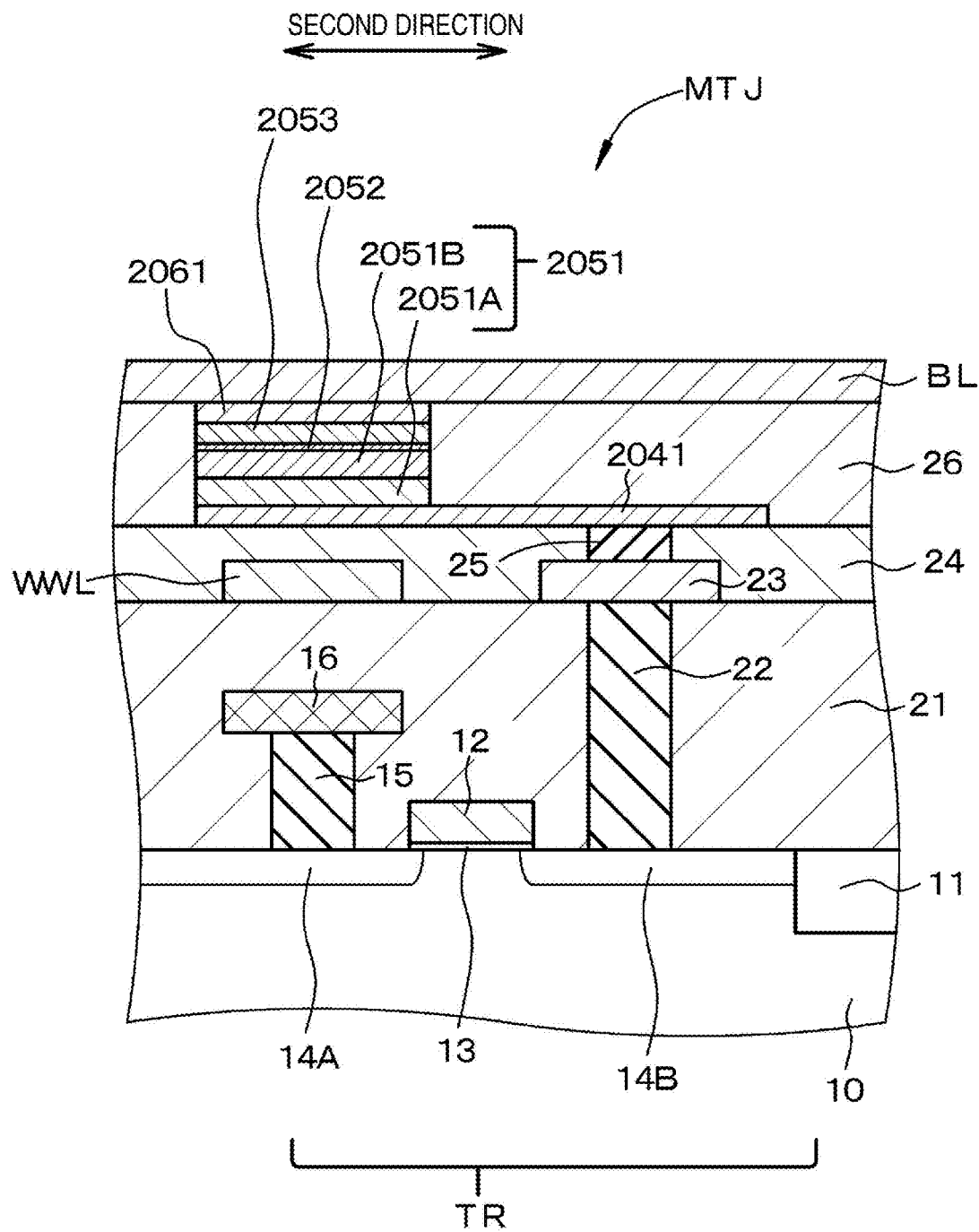
FIG. 18 is a schematic partial sectional view of a known TMR type nonvolatile magnetic memory device.
Figure 19:
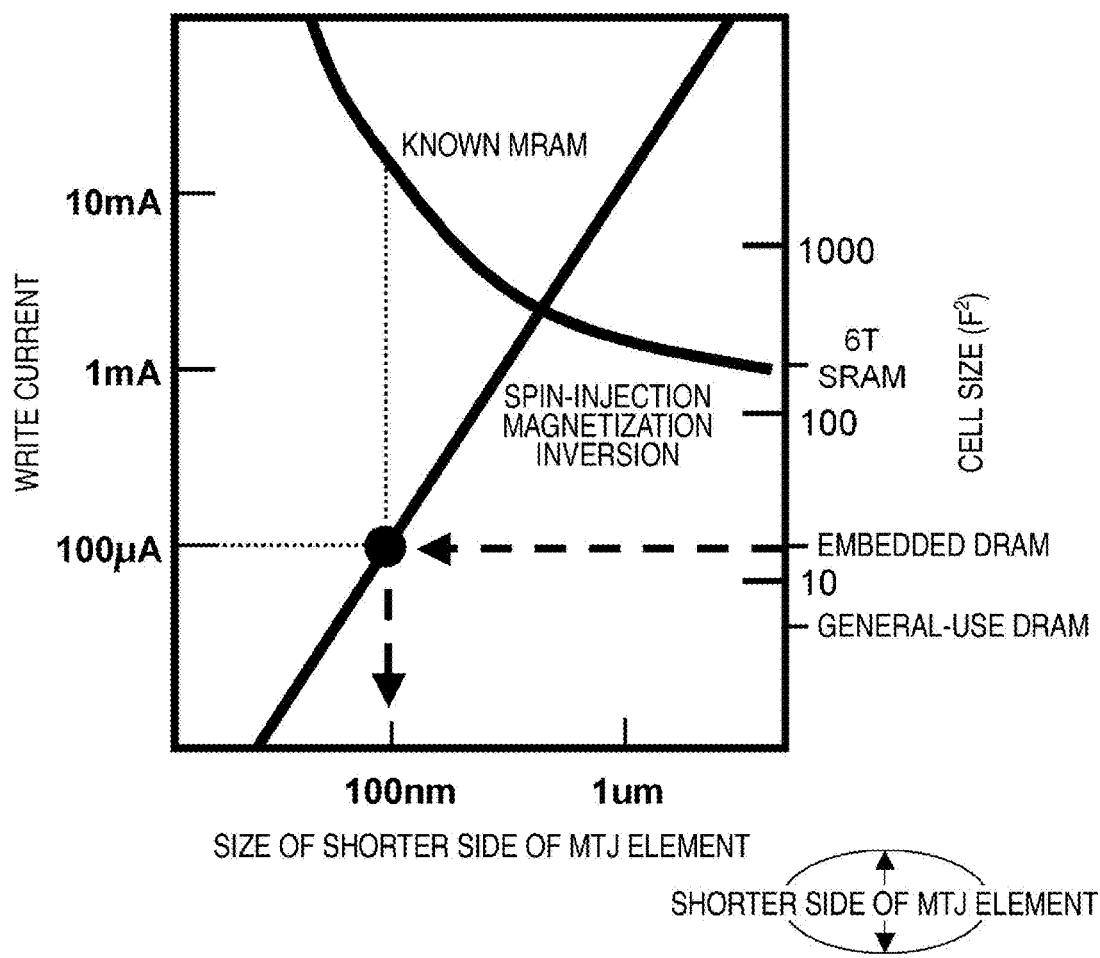
FIG. 19 is a graph showing the relationship between a memory cell size and a write current.

Instead of the spin injection type magnetoresistance effect element described in Examples, for example, as shown in FIG. 7, a nonvolatile magnetic memory device combined with a known tunnel magnetoresistance effect element using a TMR effect shown in FIG. 18 and the low Young modulus region 71 described in Example 1 or, though not shown, a nonvolatile magnetic memory device combined with a known tunnel magnetoresistance effect element using a TMR effect shown in FIG. 18 and the low Young modulus region or the high Young modulus region described in Example 2 to Example 10 may be adopted. In FIG. 7, the write word line WWL, the second lower insulation layer 24, the landing pad portion 23, and the connection hole 25 shown in FIG. 18 are not shown. In Examples, the lower part of the layered structure and the source/drain region 14B of the selection transistor TR are connected through the first wiring 41 and the connection hole 22, but in some cases, the first wiring 41 may not be provided. In this case, the connection hole 22 corresponds to the first wiring.

In the tunnel magnetoresistance effect element, examples of the data write system include not only the direct mode in which a unidirectional current passes through the write word line WWL, and a positive or negative current passes through the bit line depending on data to be written, but also the toggle mode described in U.S. Pat. No. 6,545,906B1 or U.S. Pat. No. 6,633,498B1. The toggle mode is a system in which a unidirectional current passes through the write word line WWL, a unidirectional current passes through the bit line without depending on data to be written, and data is written into the magnetoresistance effect element only when data recorded in the magnetoresistance effect element is different from data to be written. Data reading may be carried out using a data read line, without using the bit line. In this case, the bit line is formed above the recording layer (the second ferromagnetic material layer) so as to be electrically insulated from the recording layer (the second ferromagnetic material layer) through the upper interlayer insulation layer. The data read line electrically connected to the recording layer (the second ferromagnetic material layer) may be provided separately.

In Example 1, Example 3, and Example 4, the low Young modulus region may be formed of a material different from the material forming the second wiring. In this case, in Step-140 of Example 1, the hole for forming the low Young modulus region may be provided in the interlayer insulation layer, and then the hole maybe filled with an appropriate material. Similarly, in Example 6, Example 8, and Example 9, the high Young modulus region may be formed of a material different from the material forming the second wiring. The projection image in the extension direction of the second wiring (the bit line) may be orthogonal to the projection image in the extension direction of the gate electrode 12 constituting the selection transistor TR.

In Examples, the planar shape of the recording layer is an elliptical shape, but the planar shape of the recording layer may have a pseudo rhombic shape. At least two of four sides constituting the pseudo rhombic shape each may include a smooth curve having a central portion thereof curved toward the center of the pseudo rhombic shape. The easy magnetization axis of the recording layer may be substantially parallel to the longer axis of the pseudo rhombic shape, and the hard magnetization axis of the recording layer may be substantially parallel to the shorter axis of the pseudo rhombic shape. The sides constituting the planar shape of the recording layer may be smoothly connected to each other. For convenience, such a planar shape of the recording layer is called a "first planar shape".

The "pseudo rhombic shape" means that the planar shape of the recording layer has the following shape, as viewed macroscopically. Let the four sides be represented by side A, side B, side C, and side D in this order counterclockwise, the four sides A, B, C, and D be approximated by line segments, the length of the line segment opposed to the side A be $L_a$, the length of the line segment opposed to the side B be $L_b$, the length of the line segment opposed to the side C be $L_c$, and the length of the line segment opposed to the side D be $L_d$, then the planar shape satisfies the $L_a=L_b=L_c=L_d$, satisfies $L_a \cong L_b \cong L_c \cong L_d$, satisfies $L_a=L_b \neq L_c=L_d$, or satisfies $L_a \cong L_b \neq L_c \cong L_d$. When the recording layer is viewed microscopically, at least two (at maximum, four) of the four sides constituting the planar shape of the recording layer each include a curve.

In general, where a real variable function F(X) has a continuous differential coefficient at each point in an interval a<X<b, the function F(X) is said to be "smooth" or "continuously differentiable" over the interval. The expression "substantially parallel" means that two line segments or straight lines do not intersect each other, or that the intersection angle is within the range of ±20°. The expression "substantially orthogonal" means that two line segments or straight lines orthogonally intersect each other, or that the intersection angle is within the range of 90°±20°. The expression "substantially line symmetric" includes the meaning of not only the case where when the recording layer is folded along the axis of symmetry, the two portions of the recording layer folded perfectly overlap each other but also the case where the two portions of the recording layer folded do not perfectly overlap each other because of dispersions in the manufacturing process of the recording layer. The "center" means the center of gravity of the shape. Hereinafter, the expressions "smooth", "substantially parallel", "substantially line symmetric", and "center" will be used in the meanings just described.

In the first planar shape, it is desirable that the relationship $1.0<L_L/L_S<10$, and preferably $1.2<L_L/L_S<3.0$ is satisfied, where the length of the longer axis of the pseudo rhombic shape is $2L_L$, and the length of the shorter axis of the pseudo rhombic shape is $2L_S$. In addition, it is desirable that the relationship $0.1 \leq r_L/L_S<1.0$, and preferably $0.2 \leq r_L/L_S \leq 0.8$ is satisfied, and the relationship $0.1 \leq r_S/L_L \leq 10$, and preferably $0.2 \leq r_S/L_L \leq 5$ is satisfied, where $r_L$ is the radius of curvature of the planar shape of the recording layer at the intersection between the longer axis of the pseudo rhombic shape and the planar shape of the recording layer, and $r_S$ is the radius of curvature of the planar shape of the recording layer at the intersection between the shorter axis of the pseudo rhombic shape and the planar shape of the recording layer.

In the first planar shape, it is desirable that at least two points of inflection are present in each of the sides each including a smooth curve having a central portion thereof curved.

In the first planar shape including the above-described configuration, it is desirable that when the pseudo rhombic shape is divided into two regions by the longer axis of the pseudo rhombic shape, the two sides each including a smooth curve having a central portion thereof curved belong to one of the regions. In the first planar shape including such a desirable configuration, it is desirable that the four sides each include a smooth curve having a central portion thereof curved toward the center of the pseudo rhombic shape. In the first planar shape including the above-described configuration, it is desirable that the planar shape of the recording layer is substantially line symmetric with respect to the shorter axis of the pseudo rhombic shape. Such a configuration includes the case where the two of the four sides constituting the pseudo rhombic shape each include a smooth curve having a central portion thereof curved toward the center of the pseudo rhombic shape, and the case where all of the four sides constituting the pseudo rhombic shape each include a smooth curve having a central portion thereof curved toward the center of the pseudo rhombic shape. It is also desirable that the planar shape of the recording layer is substantially line symmetric with respect to the longer axis of the pseudo rhombic shape.

The planar shape of the recording layer may include four sides, and at least two of the four sides each may include a smooth curve. The planar shape of the recording layer may be inscribed in a virtual rhombus having a longer axis and a shorter axis orthogonal to the longer axis at the bisection point of the longer axis, the longer axis being substantially parallel to the easy magnetization axis of the recording layer, and the shorter axis being substantially parallel to the hard magnetization axis of the recording layer. Each of the sides including the smooth curve may contact the corresponding side of the virtual rhombus at at least two points. The sides constituting the planar shape of the recording layer may be smoothly connected to each other. For convenience, such a planar shape of the recording layer is called a "second planar shape".

In the "virtual rhombus", when the four sides of the virtual rhombus are represented by side A (length $L_a$), side B (length $L_b$), side C (length $L_c$), and side D (length $L_d$) in this order counterclockwise, the relationship $L_a=L_b=L_c=L_d$ is satisfied, the relationship $L_a \cong L_b \cong L_c = L_d$ is satisfied, the relationship $L_a \cong L_b \neq L_c \cong L_d$ is satisfied, or the relationship $L_a \cong L_b \cong L_c \cong L_d$ is satisfied.

In the second planar shape, it is desirable that the relationship $1.0 < L_{i-L}/L_{i-S} \leq 10$, and preferably $1.2 \leq L_{i-L}/L_{i-S} \leq 3.0$ is satisfied, where the length of the longer axis is $2L_{i-L}$ and the length of the shorter axis $2L_{i-S}$. In addition, it is desirable that the relationship $0.1 \leq r_L/L_{i-S} < 1.0$, and preferably $0.2 \leq r_L/L_{i-S} \leq 0.8$ is satisfied, and the relationship $0.1 \leq r_S/L_{i-L} \leq 10$, and preferably $0.2 \leq r_S/L_{i-L} \leq 5$ is satisfied, where $r_L$ is the radius of curvature of the planar shape of the recording layer at the intersection between the longer axis of the virtual rhombus and the planar shape of the recording layer, and $r_S$ is the radius of curvature of the planar shape of the recording layer at the intersection between the shorter axis of the virtual rhombus and the planar shape of the recording layer. In addition, in an interval $0 < X < X_1$ (described below) of the side including a smooth curve, it is desirable that the relationship $0 < D_{MAX} \leq X_1/2$, and preferably $X_1/30 \leq D_{MAX} \leq X_1/3$ is satisfied, where $D_{MAX}$ is the maximum distance between the side including a smooth curve and the corresponding side of the virtual rhombus.

In the second planar shape, it is desirable that when, in each of the sides constituting the planar shape of the recording layer and each including the smooth curve, (a) the point located closest to the shorter axis of the virtual rhombus of at least two points in contact with the side of the virtual rhombus is made to be the origin (0, 0) of a Gaussian coordinate system, (b) the point located closest to the longer axis of the virtual rhombus of at least two points in contact with the side of the virtual rhombus is made to be $(X_1, 0)$ [where $X_1 > 0$], (c) the intersection with the shorter axis of the virtual rhombus is made to be $(X_S, Y_S)$ [where $X_S < 0$, $Y_S < 0$], and (d) the intersection with the longer axis of the virtual rhombus is made to be $(X_L, Y_L)$ [where $X_L > 0$, $Y_L < 0$], if the side is represented by a real variable function $F(X)$, and the intersection between the longer axis and the shorter axis of the virtual rhombus is located in the third quadrant or the fourth quadrant, the real variable function $F(X)$ has a continuous differential coefficient at each point in an interval $X_S < X < X_L$, and the real variable function $F(X)$ has at least two points of inflection in an interval $0 < X < X_1$.

In the second planar shape including the above-described configuration, it is desirable that the planar shape of the recording layer is substantially line symmetric with respect to the shorter axis of the virtual rhombus. Such a configuration includes the case where two of the four sides constituting the planar shape of the recording layer each include a smooth curve, and the case where all of the four sides each include a smooth curve. Alternatively, it is desirable that the four sides of the planar shape of the recording layer each include a smooth curve, and that the planar shape of the recording layer is substantially line symmetric with respect to the shorter axis of the virtual rhombus, and is substantially line symmetric with respect to the longer axis of the virtual rhombus.

The planar shape of the recording layer may include a first shape, and two projected portions oppositely projected from the first shape, and the two projected portions may be located on the projected portion axis. The projected portion axis may pass through the center of the first shape and may be orthogonal to the first shape axis passing through the center of the first shape. The first shape may include one shape selected from a group including an ellipse, a flat oval, and a flat circle, and the projected portions each may include one shape selected from a group including a part of a circle, a part of an ellipse, a part of a flat oval, and a part of a flat circle. The easy magnetization axis of the recording layer may be substantially parallel to the first shape axis, and the hard magnetization axis of the recording layer may be substantially parallel to the projected portion axis. The relationship $L_L > L_S$ may be satisfied, where the length of the first shape along the first shape axis is $2L_L$, and the distance between the front ends of the two projected portions along the projected portion axis is $2L_S$. The portion at which the outline of the first shape and the outline of each projected portion intersect may include a smooth curve. For convenience, such a planar shape of the recording layer is called a "third planar shape".

In the third planar shape, examples of the combination of (the first shape, the projected portion) include (an ellipse, a part of a circle), (an ellipse, a part of an ellipse), (an ellipse, a part of a flat oval), (an ellipse, a part of a flat circle), (a flat oval, a part of a circle), (a flat oval, a part of an ellipse), (a flat oval, a part of a flat oval), (a flat oval, a part of a flat circle), (a flat circle, a part of a circle), (a flat circle, a part of an ellipse), (a flat circle, a part of a flat oval), and (a flat circle, a part of a flat circle).

In the third planar shape, it is desirable that the relationship $1.0 < L_L/L_S \leq 10$, and preferably $1.2 \leq L_L/L_S \leq 3.0$ is satisfied. In addition, it is desirable that the relationship $0.1 \leq r_L/L_S < 1.0$, and preferably $0.2 \leq r_L/L_S \leq 0.8$ is satisfied, and the relationship $0.1 \leq r_S/L_L \leq 10$, and preferably $0.2 \leq r_S/L_L \leq 5$ is satisfied, where rL is the radius of curvature of the planar shape of the recording layer at the intersection between the first shape axis and the planar shape of the recording layer, and $r_S$ is the radius of curvature of the planar shape of the recording layer at the intersection between the projected portion axis and the planar shape of the recording layer.

In the third planar shape, the planar shape of the recording layer may be substantially line symmetric with respect to the projected portion axis. Such a configuration includes the case where the two projected portions are substantially line symmetric with respect to the first shape axis, and the case where the two projected portions are not line symmetric. It is desirable that the planar shape of the recording layer is substantially line symmetric with respect to the projected portion axis, and is substantially line symmetric with respect to the first shape axis.

The planar shape of the recording layer may be a superposed shape in which a first shape and a second shape having a center coinciding with the center of the first shape are superposed on each other such that the second shape is projected from the first shape at two positions. The first shape axis passing through the center of the first shape and the second shape axis passing through the center of the second shape may be orthogonal to each other. The first shape may include one shape selected from the group including an ellipse, a flat oval, and a flat circle, and the second shape may include one shape selected from the group including a circle, an ellipse, a flat oval, and a flat circle. The easy magnetization axis of the recording layer may be substantially parallel to the first shape axis, and the hard magnetization axis of the recording layer may be substantially parallel to the second shape axis. The relationship $L_L > L_S$ may be satisfied, where the length of the first shape along the first shape axis is $2L_L$, and the length of the second shape along the second shape axis is $2L_S$. The portion at which the outline of the first shape and the outline of the second shape intersect each other may include a smooth curve. For convenience, such a planar shape of the recording layer is called a "fourth planar shape".

In the fourth planar shape, examples of the combination of (the first shape, the second shape) include (an ellipse, a circle), (an ellipse, an ellipse), (an ellipse, a flat oval), (an ellipse, a flat circle), (a flat oval, a circle), (a flat oval, an ellipse), (a flat oval, a flat oval), (a flat oval, a flat circle), (a flat circle, a circle), (a flat circle, an ellipse), (a flat circle, a flat oval), and (a flat circle, a flat circle).

In the fourth planar shape, it is desirable that the relationship $1.0 < L_L/L_S \leq 10$, and preferably $1.2 \leq L_L/L_S \leq 3.0$ is satisfied. In addition, it is desirable that the relationship $0.1 \leq r_L/L_S < 1.0$, and preferably $0.2 \leq r_L/L_S \leq 0.8$ is satisfied, and the relationship $0.1 \leq r_S/L_L \leq 10$, and preferably $0.2 \leq r_S/L_L \leq 5$ is satisfied, where $r_L$ is the radius of curvature of the planar shape of the recording layer at the intersection between the first shape axis and the planar shape of the recording layer, and $r_S$ is the radius of curvature of the planar shape of the recording layer at the intersection between the second shape axis and the planar shape of the recording layer.

In the fourth planar shape, the planar shape of the recording layer may be substantially line symmetric with respect to the second shape axis. Such a configuration includes the case where the two projected regions of the second shape are substantially line symmetric with respect to the first shape axis, and the case where the two projected regions are not line symmetric. It is desirable that the planar shape of the recording layer is substantially line symmetric with respect to the second shape axis and is substantially line symmetric with respect to the first shape axis.

The planar shape of the recording layer may include a pseudo isosceles triangular shape, the oblique lines of the pseudo isosceles triangular shape each may include a smooth curve having a central portion thereof curved toward the center of the pseudo isosceles triangular shape, and the length of the imaginary base of the pseudo isosceles triangular shape may be greater than the virtual height of the pseudo isosceles triangular shape. The easy magnetization axis of the recording layer may be substantially parallel to the base of the pseudo isosceles triangular shape, and the hard magnetization axis of the recording layer may be substantially orthogonal to the base of the pseudo isosceles triangular shape. The sides constituting the planar shape of the recording layer may be smoothly connected to each other. For convenience, such a planar shape of the recording layer is called a "fifth planar shape".

The "pseudo isosceles triangular shape" means that the planar shape of the recording layer has the following shape, as viewed macroscopically. Let the two oblique lines A and B be approximated by line segments, let the length of the line segment opposed to the oblique line A be $L_a$, and let the length of the line segment opposed to the oblique line B be $L_b$, then the shape satisfies the relationship $L_a = L_b$, or satisfies the relationship $L_a \cong L_b$. When the recording layer is viewed microscopically, the two oblique lines constituting the planar shape of the recording layer each include a curve.

In the fifth planar shape, the length of the imaginary base of the pseudo isosceles triangular shape is represented by $2L_B$, the virtual height is represented by H, the average radius of curvature of the planar shape of the recording layer at the portion where the oblique line and the base of the pseudo isosceles triangular shape are smoothly connected to each other is represented by $r_L$, and the radius of curvature of the planar shape of the recording layer at the intersection between the two oblique lines of the pseudo isosceles triangular shape is represented by $r_S$. Here, the intersection between the two oblique lines of the pseudo isosceles triangular shape means the point at which the perpendicular bisector of the imaginary base intersects the curve obtained by connecting the two oblique lines of the pseudo isosceles triangular shape into one line. In addition, the imaginary base of the pseudo isosceles triangular shape means an imaginary line which, when the base of the pseudo isosceles triangular shape is approximated by a straight line (this straight line is called a base approximation straight line), is parallel to the base approximation straight line, which passes through a point being located on the side of the intersection between the two oblique lines of the pseudo isosceles triangular shape and being spaced from the base approximation straight line by a distance $r_L$. Furthermore, the length $2L_B$ of the imaginary base is defined as the distance between the intersections of the imaginary base with the planar shape of the recording layer at the portions where the oblique lines and the base of the pseudo isosceles triangular shape are smoothly connected. Furthermore, the virtual height H is defined as the distance from the intersection between the two oblique lines of the pseudo isosceles triangular shape to the imaginary base. In this case, it is desirable that the relationship $1.0 \leq L_B/H \leq 10$, and preferably $1.2 \leq L_B/H \leq 3.0$ is satisfied. In addition, it is desirable that the relationship $0.1 \leq r_L/H \leq 1.0$, and preferably $0.2 \leq r_L/H \leq 0.8$ is satisfied, and the relationship $0.1 \leq r_S/L_B \leq 10$, and preferably $0.2 \leq r_S/L_B \leq 5$ is satisfied.

In the fifth planar shape, it is desirable that at least two points of inflection are present in the oblique line of the pseudo isosceles triangular shape. It is desirable that the planar shape of the recording layer is substantially line symmetric with respect to the perpendicular bisector of the imaginary base of the pseudo isosceles triangular shape.

The planar shape of the recording layer may include three sides, and at least two of the three sides each may include a smooth curve. The planar shape of the recording layer may be inscribed in a virtual isosceles triangle in which the length of the imaginary base is $2L_{i-B}$, the virtual height is $H_i$ [where $H_i < L_{i-B}$], the base is substantially parallel to the easy magnetization axis of the recording layer, and the perpendicular to the base is substantially parallel to the hard magnetization axis of the recording layer. Each of the sides including the smooth curve may contact an oblique line of the virtual isosceles triangle at least two points. The sides constituting the planar shape of the recording layer may be smoothly connected to each other. For convenience, such a planar shape of the recording layer is called a "sixth planar shape".

In the sixth planar shape, the imaginary base of the virtual isosceles triangle means an imaginary line being parallel to the base of the virtual isosceles triangle and passing a point which is located on the side of the intersection between the two oblique lines of the virtual isosceles triangle and which is spaced from the base of the virtual isosceles triangle by a distance $r_L$, where $r_L$ is the average radius of curvature of the planar shape of the recording layer at the portion where a side constituting the planar shape of the recording layer corresponding to the base of the virtual isosceles triangle is smoothly connected to a side constituting the planar shape of the recording layer corresponding to the oblique line of the virtual isosceles triangle. In addition, the length $2L_{i\text{-}B}$ of the imaginary base is defined as the distance between the imaginary base and the intersection of the two oblique lines of the virtual isosceles triangle. Furthermore, the virtual height $H_i$ is defined as the distance from the intersection of the two oblique lines of the virtual isosceles triangle to the imaginary base. In the sixth planar shape, it is desirable that the relationship $1.0 < L_{i\text{-}B}/H_i \leq 10$, and preferably $1.2 \leq L_{i\text{-}B}/H_i \leq 3.0$ is satisfied. In addition, it is desirable that the relationship $0.1 \leq r_L/H_i \leq 1.0$, and preferably $0.2 \leq r_L/H_i \leq 0.8$ is satisfied, and it is desirable that the relationship $0.1 \leq r_S/L_{i\text{-}B} \leq 10$, and preferably $0.2 \leq r_S/L_{i\text{-}B} \leq 5$ is satisfied, where $r_S$ is the radius of curvature of the planar shape of the recording layer at the intersection between the planar shape of the recording layer and the bisector of the angle formed at the intersection of the two oblique lines of the virtual isosceles triangle. Furthermore, in the interval $0 < X < X_1$ (described below) of the side including a smooth curve, let the maximum distance between the side including the smooth curve and the corresponding oblique side of the virtual isosceles triangle be $D_{MAX}$, then it is desirable that the relationship $0 < D_{MAX} \leq X_1/2$, and preferably $X_1/30 \leq D_{MAX} \leq X_1/3$ is satisfied.

In the sixth planar shape, it is desirable that when, in each of the sides each including the smooth curve and constituting the planar shape of the recording layer, (a) the point closest to the intersection between the two oblique lines of the virtual isosceles triangle of at least two points in contact with the oblique line is made to be the origin (0,0) of a Gaussian coordinate system, (b) the point closest to the intersection between the oblique line and the base of the virtual isosceles triangle of at least two points in contact with the oblique line is made to be $(X_1,0)$ [where $X_1>0$], (c) the intersection with the perpendicular bisector of the base of the virtual isosceles triangle is made to be $(X_S,Y_S)$ [where $X_S<0$, $Y_S<0$], and (d) the intersection with the imaginary base of the virtual isosceles triangle is made to be $(X_L,Y_L)$ [where $X_L>0$, $Y_L<0$], if the side is represented by a real variable function $F(X)$, and the intersection between the perpendicular bisector of the base of the virtual isosceles triangle and the base of the virtual isosceles triangle is located in the third quadrant or the fourth quadrant, the real variable function $F(X)$ has a continuous differential coefficient at each point in an interval $X_S<X<X_L$, and the real variable function $F(X)$ has at least two points of inflection in an interval $0<X<X_1$.

In the sixth planar shape including the above-described configuration, it is desirable that the planar shape of the recording layer is substantially line symmetric with respect to the perpendicular bisector of the base of the virtual isosceles triangle.

The planar shape of the recording layer may include a first shape, and a projected portion projected from the first shape. The projected portion may be located on the projected portion axis and the projected portion axis may pass through the center of the first shape, and may be orthogonal to the first shape axis passing through the center of the first shape. The first shape may have one shape selected from the group including an ellipse, a flat oval, and a flat circle, and the projected portion may have one shape selected from the group including a part of a circle, a part of an ellipse, a part of a flat oval, and a part of a flat circle. The easy magnetization axis of the recording layer may be substantially parallel to the first shape axis, and the hard magnetization axis of the recording layer may be substantially parallel to the projected portion axis. The relationship $L_L>L_S$ may be satisfied, where the length of the first shape along the first shape axis is $2L_L$, and the distance from a front end of the projected portion to the center of the first shape along the projected portion axis is $L_S$. The portion at which the outline of the first shape and the outline of the projected portion intersect may include a smooth curve. For convenience, such a planar shape of the recording layer is called as a "seventh planar shape".

In the seventh planar shape, examples of the combination of (the first shape, the projected portion) include (an ellipse, a part of a circle), (an ellipse, a part of an ellipse), (an ellipse, a part of a flat oval), (an ellipse, a part of a flat circle), (a flat oval, a part of a circle), (a flat oval, a part of an ellipse), (a flat oval, a part of a flat oval), (a flat oval, a part of a flat circle), (a flat circle, a part of a circle), (a flat circle, a part of an ellipse), (a flat circle, a part of a flat oval), and (a flat circle, a part of a flat circle).

In the seventh planar shape, it is desirable that the relationship $1.0 < L_L/L_S \leq 10$, and preferably $1.2 \leq L_L/L_S \leq 3.0$ is satisfied. In addition, it is desirable that the relationship $0.1 \leq r_L/L_S \leq 1.0$, and preferably $0.2 \leq r_L/L_S \leq 0.8$ is satisfied, and the relationship $0.1 \leq r_S/L_L \leq 10$, and preferably $0.2 < r_S/L_L \leq 5$ is satisfied, where $r_L$ is the radius of curvature of the planar shape of the recording layer at the intersection between the first shape axis and the planar shape of the recording layer, and $r_S$ is the radius of curvature of the planar shape of the recording layer at the intersection between the projected portion axis and the planar shape of the recording layer.

In the seventh planar shape, it is desirable that the planar shape of the recording layer is substantially line symmetric with respect to the projected portion axis.

The planar shape of the recording layer may be a superposed shape in which a first shape and a second shape are superposed on each other such that the second shape is projected from the first shape at one position. The second shape may be located on the second shape axis, and the second shape axis may pass through the center of the first shape and may be orthogonal to the first shape axis passing through the center of the first shape. The first shape may have one shape selected from the group including an ellipse, a flat oval, and a flat circle, and the second shape may have one shape selected from the group including a circle, an ellipse, a flat oval, and a flat circle. The easy magnetization axis of the recording layer may be substantially parallel to the first shape axis, and the hard magnetization axis of the recording layer may be substantially parallel to the second shape axis. The relationship $L_L>L_S$ may be satisfied, where the length of the first shape along the first shape axis is $2L_L$, and the distance from a front end of the second shape to the center of the first shape along the second shape axis is $L_S$. The portion at which the outline of the first shape and the outline of the second shape intersect may include a smooth curve. For convenience, such a planar shape of the recording layer is called an "eighth planar shape".

In the eighth planar shape, examples of the combination of (the first shape, the second shape) include (an ellipse, a circle), (an ellipse, an ellipse), (an ellipse, a flat oval), (an ellipse, a flat circle), (a flat oval, a circle), (a flat oval, an ellipse), (a flat oval, a flat oval), (a flat oval, a flat circle), (a flat circle, a circle), (a flat circle, an ellipse), (a flat circle, a flat oval), and (a flat circle, a flat circle).

In the eighth planar shape, it is desirable that the relationship $1.0 < L_L/L_S \leq 10$, and preferably $1.2 \leq L_L/L_S \leq 3.0$ is satisfied. In addition, it is desirable that the relationship $0.1 \leq r_L/L_S \leq 1.0$, and preferably $0.2 \leq r_L/L_S \leq 0.8$ is satisfied, and the relationship $0.1 \leq r_S/L_L \leq 10$, and preferably $0.2 \leq r_S/L_L \leq 5$ is satisfied, where $r_L$ is the radius of curvature of the planar shape of the recording layer at the intersection of the first shape axis and the planar shape of the recording layer, and $r_S$ is the radius of curvature of the planar shape of the recording layer at the intersection between the second shape axis and the planar shape of the recording layer.

In the eighth planar shape, it is desirable that the planar shape of the recording layer is substantially line symmetric with respect to the second shape axis.

Figure 8:
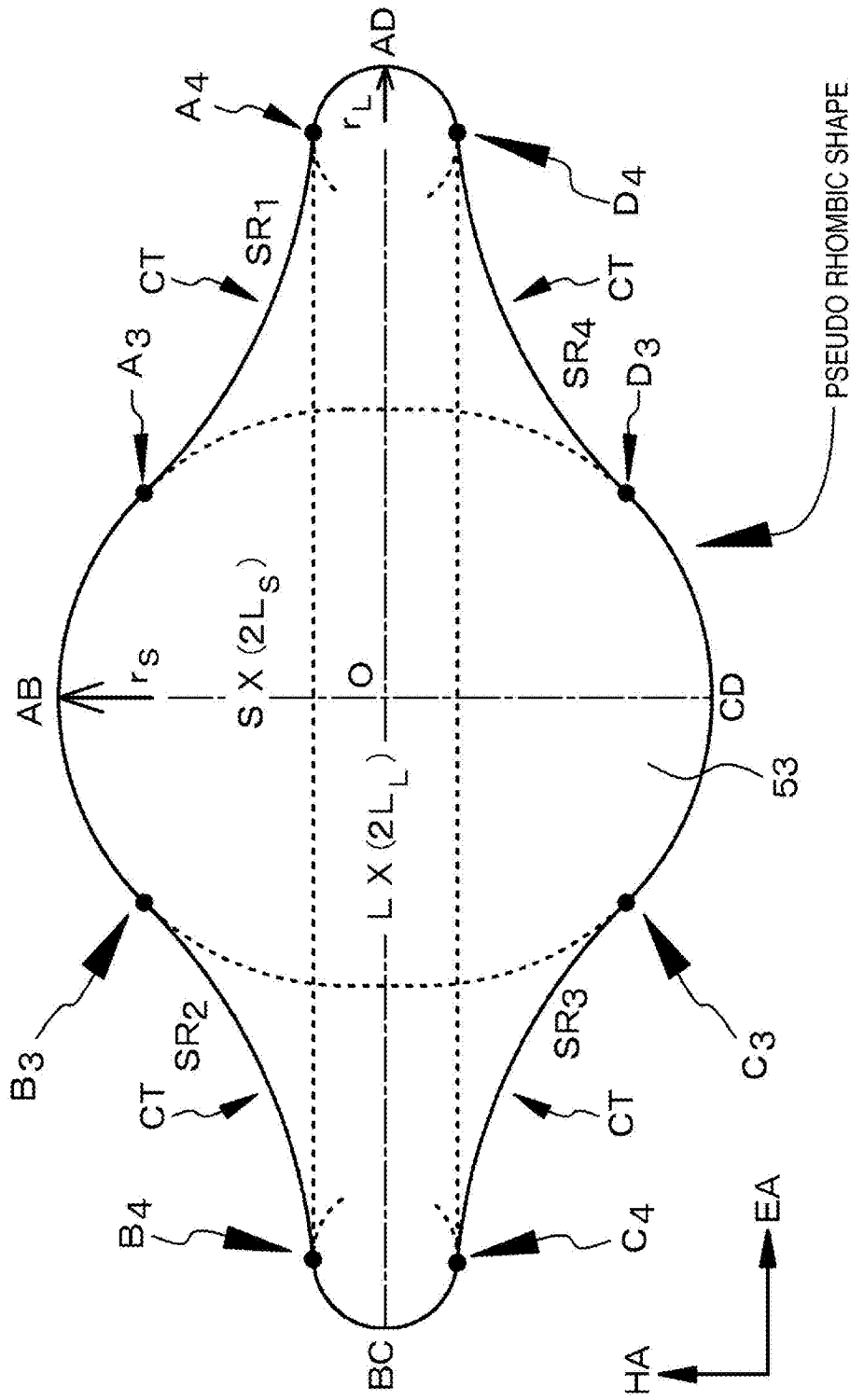
FIG. 8 is a schematic plan view of a recording layer having a first planar shape.

In the first planar shape, as shown in a schematic plan view of the recording layer 53 of FIG. 8, the planar shape (indicated by a solid line) of the recording layer 53 is a pseudo rhombic shape having four sides $SR_m$ (where "m" is one of 1, 2, 3, and 4). The sides $SR_m$ indicate the portions of the planar shape of the recording layer 53 interposed between the intersections BC and AD between the planar shape of the recording layer 53 and the longer axis LX (length $2L_L$) of the pseudo rhombic shape, and between the intersections AB and CD between the planar shape of the recording layer 53 and the shorter axis SX (length $2L_S$) of the pseudo rhombic shape. At least two (in the example of FIG. 8, all the four sides $SR_m$) of the four sides constituting the pseudo rhombic shape each include a smooth curve having a central portion CT thereof curved toward the center of the pseudo rhombic shape. The easy magnetization axis (EA) of the recording layer 53 is substantially parallel to the longer axis LX (indicated by a one-dot-chain line) of the pseudo rhombic shape, and the hard magnetization axis (HA) of the recording layer 53 is substantially parallel to the shorter axis SX (indicated by a one-dot-chain line) of the pseudo rhombic shape. The sides $SR_m$ constituting the planar shape of the recording layer 53 are smoothly connected to each other.

At least two points of inflection are present in each of the sides $SR_m$ each including the smooth curve having a central portion CT thereof curved. That is, two inflection points ($A_3$, $A_4$) are present in the side $SR_1$, and two inflection points ($B_3$, $B_4$) are present in the side $SR_2$. In addition, two inflection points ($C_3$, $C_4$) are present in the side $SR_3$, and two inflection points ($D_3$, $D_4$) are present in the side $SR_4$. In the drawing, the points of inflection are represented by solid circles.

As shown in FIG. 8, the planar shape of the recording layer 53 is substantially line symmetric with respect to the shorter axis SX of the pseudo rhombic shape, and is substantially line symmetric with respect to the longer axis LX of the pseudo rhombic shape.

Figure 9:
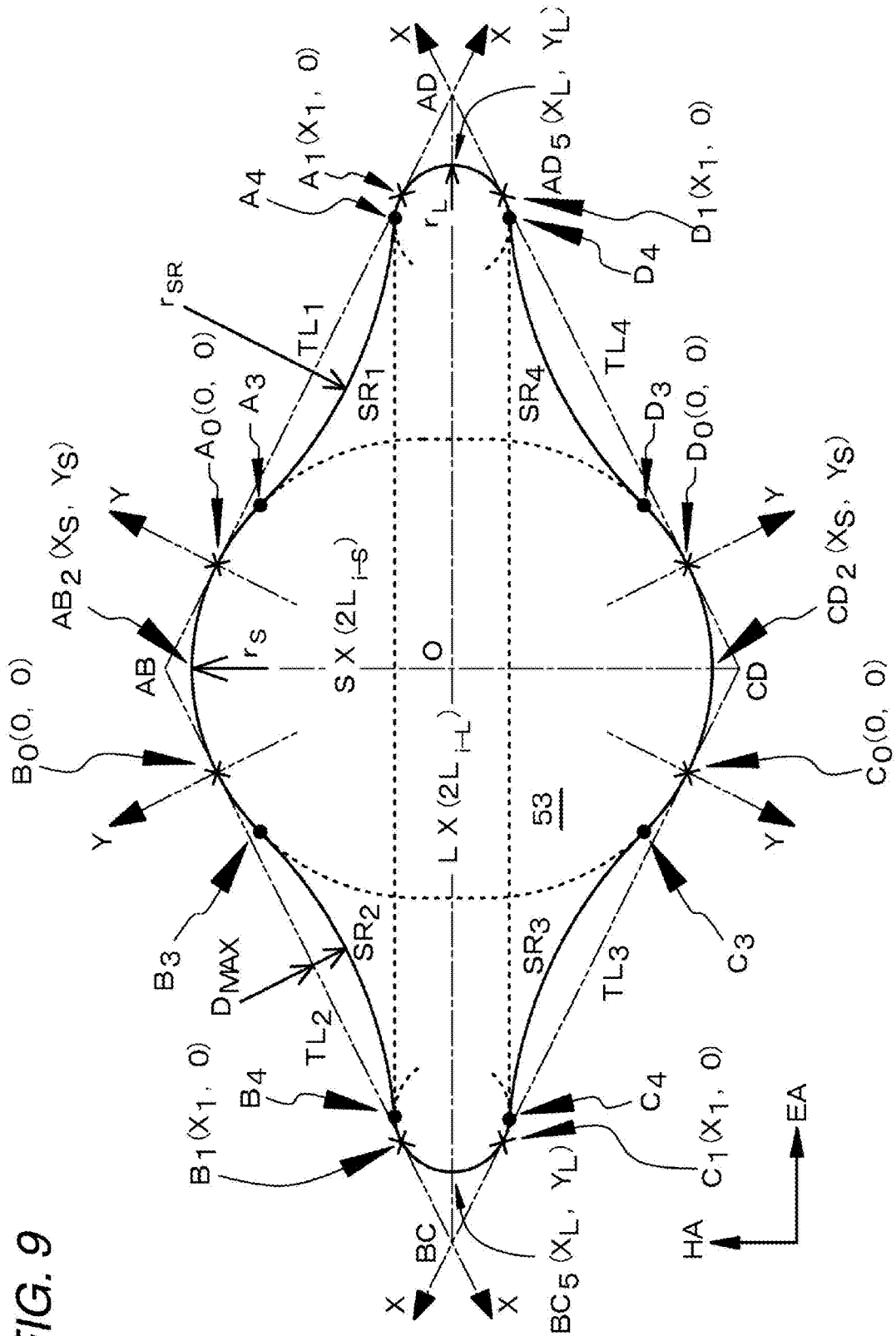
FIG. 9 is a schematic plan view of a recording layer having a second planar shape.

In the second planar shape, as shown in a schematic plan view of the recording layer 53 of FIG. 9, the planar shape (indicated by a solid line) of the recording layer 53 has four sides $SR_m$, and at least two (in the example of FIG. 9, all the four sides $SR_m$) of the four sides each include a smooth curve. The planar shape of the recording layer 53 is inscribed in a virtual rhombus (indicated by a two-dot-chain line). In FIG. 9, the inscribing points are indicated by mark "×". The virtual rhombus has a longer axis LX having a length (the distance from point AD to point BC) of $2L_{i-L}$, and a shorter axis SX orthogonal to the longer axis LX at the bisection point O of the longer axis LX and having a length (the distance from point AB to point CD) of $2L_{i-S}$ [where $L_{i-S} < L_{i-L}$]. The longer axis LX is substantially parallel to the easy magnetization axis (EA) of the recording layer 53, and the shorter axis SX is substantially parallel to the hard magnetization axis (HA) of the recording layer 53. Each of the sides $SR_m$ including the smooth curve contacts the corresponding side $TL_m$ of the virtual rhombus at at least two points (in the example of FIG. 9, two points). In FIG. 9, the contact points are represented by mark "×". The sides $SR_m$ constituting the planar shape of the recording layer 53 are smoothly connected to each other.

In the side $SR_1$ having a smooth curve constituting the planar shape of the recording layer 53, (a) the point located closest to the shorter axis SX of the virtual rhombus of two points in contact with the side $TL_1$ of the virtual rhombus is made to be the origin $A_0(0,0)$ of a Gaussian coordinate system, (b) the point located closest to the longer axis LX of the virtual rhombus of two points in contact with the side $TL_1$ of the virtual rhombus is made to be $A_1(X_1,0)$ [where $X_1>0$], (c) the intersection with the shorter axis SX of the virtual rhombus is made to be $AB_2(X_S,Y_S)$ [where $X_S<0$, $Y_S<0$], and (d) the intersection with the longer axis LX of the virtual rhombus is made to be $AD_5(X_L,Y_L)$ [where $X_L>0$, $Y_L<0$].

In addition, the side $SR_1$ is expressed by a real variable function F(X), and it is assumed that the intersection O between the longer axis LX and the shorter axis SX of the virtual rhombus is located in the third quadrant or the fourth quadrant (in the example shown, the fourth quadrant).

In this case, the real variable function F(X) has a continuous differential coefficient at each point in the interval $X_S<X<X_L$, and the real variable function F(X) has two inflection points ($A_3$, $A_4$) in the interval $0<X<X_1$.

More specifically, in the interval $X_S<X\leq X_{A3}$ ($X_{A3}$: the X coordinate of the inflection point $A_3$), the real variable function F(X) is represented by a circle with a radius $r_S$. In addition, in the interval $X_{A3}\leq X\leq X_{A4}$ ($X_{A4}$: the X coordinate of the inflection point $A_4$), the real variable function F(X) is represented by a circle with a radius $r_{SR}$. In addition, in the interval $X_{A4}<X\leq X_L$, the real variable function F(X) is represented by a circle with a radius $r_L$.

In the side $SR_2$ having a smooth curve constituting the planar shape of the recording layer 53, (a) the point located closest to the shorter axis SX of the virtual rhombus of two points in contact with the side $TL_2$ of the virtual rhombus is made to be origin $B_0(0,0)$ of a Gaussian coordinate system, (b) the point located closet to the longer axis LX of the virtual rhombus of two points in contact with the side $TL_2$ of the virtual rhombus is made to be $B_1(X_1,0)$ [where $X_1>0$], (c) the intersection with the shorter axis SX of the virtual rhombus is made to be $AB_2(X_S,Y_S)$ [where $X_S<0$, $Y_S<0$], and (d) the intersection with the longer axis LX of the virtual rhombus is made to be $BC_5(X_L,Y_L)$ [where $X_L>0$, $Y_L<0$].

In addition, the side $SR_2$ is expressed by a real variable function F(X), and it is assumed that the intersection O between the longer axis LX and the shorter axis SX of the virtual rhombus is located in the third quadrant or the fourth quadrant (in the example shown, the fourth quadrant).

In this case, the real variable function F(X) has a continuous differential coefficient at each point in the interval $X_S<X<X_L$, and the real variable function F(X) has two inflection points ($B_3$, $B_4$) in the interval $0<X<X_1$.

More specifically, in the interval $X_S<X\leq X_{B3}$ ($X_{B3}$: the X coordinate of the inflection point $B_3$), the real variable function F(X) is represented by a circle with a radius $r_S$. In addition, in the interval $X_{B3}\leq X\leq X_{B4}$ ($X_{B4}$: the X coordinate of the inflection point $B_4$), the real variable function F(X) is represented by a circle with a radius $r_{SR}$. Furthermore, in the interval $X_{B4}<X\leq X_L$, the real variable function F(X) is represented by a circle with a radius $r_L$.

In the side $SR_3$ having a smooth curve constituting the planar shape of the recording layer 53, (a) the point located closest to the shorter axis SX of the virtual rhombus of two points in contact with the side $TL_3$ of the virtual rhombus is made to be the origin $C_0(0, 0)$ of a Gaussian coordinate system, (b) the point located closest to the longer axis LX of the virtual rhombus of two points in contact with the side $TL_3$ of the virtual rhombus is made to be $C_1(X_1,0)$ [where $X_1>0$], (c) the intersection with the shorter axis SX of the virtual rhombus is made to be $CD_2(X_S,Y_S)$ [where $X_S<0$, $Y_S<0$], and (d) the intersection with the longer axis LX of the virtual rhombus is made to be $BC_5(X_L, Y_L)$ [where $X_L > 0$, $Y_L < 0$].

In addition, the side $SR_3$ is expressed by a real variable function $F(X)$, and it is assumed that the intersection O between the longer axis LX and the shorter axis SX of the virtual rhombus is located in the third quadrant or the fourth quadrant (in the example shown, the fourth quadrant).

In this case, the real variable function $F(X)$ has a continuous differential coefficient at each point in the interval $X_S < X < X_L$, and the real variable function $F(X)$ has two inflection points ($C_3$, $C_4$) in the interval $0 < X < X_1$.

More specifically, in the interval $X_S < X \leq X_{C3}$ ($X_{C3}$: the X coordinate of the inflection point $C_3$), the real variable function $F(X)$ is represented by a circle with a radius $r_S$. In addition, in the interval $X_{C3} \leq X \leq X_{C4}$ ($X_{C4}$: the X coordinate of the inflection point $C_4$), the real variable function $F(X)$ is represented by a circle with a radius $r_{SR}$. Furthermore, in the interval $X_{C4} < X \leq X_L$, the real variable function $F(X)$ is represented by a circle with a radius $r_L$.

In the side $SR_4$ having a smooth curve constituting the planar shape of the recording layer 53, (a) the point located closest to the shorter axis SX of the virtual rhombus of two points in contact with the side $TL_4$ of the virtual rhombus is made to be the origin $D_0(0,0)$ of a Gaussian coordinate system, (b) the point located closest to the longer axis LX of the virtual rhombus of two points in contact with the side $TL_4$ of the virtual rhombus is made to be $D_1(X_1, 0)$ [where $X_1 > 0$], (c) the intersection with the shorter axis SX of the virtual rhombus is made to be $CD_2(X_S, Y_S)$ [where $X_S < 0$, $Y_S < 0$], and (d) the intersection with the longer axis LX of the virtual rhombus is made to be $AD_5(X_L, Y_L)$ [where $X_L > 0$, $Y_L < 0$].

In addition, the side $SR_4$ is expressed by a real variable function $F(X)$, and it is assumed that the intersection O between the longer axis LX and the shorter axis SX of the virtual rhombus is located in the third quadrant or the fourth quadrant (in the example shown, the fourth quadrant).

In this case, the real variable function $F(X)$ has a continuous differential coefficient at each point in the interval $X_S < X < X_L$, and the real variable function $F(X)$ has two inflection points ($D_3$, $D_4$) in the interval $0 < X < X_1$.

More specifically, in the interval $X_S < X \leq X_{D3}$ ($X_{D3}$: the X coordinate of the inflection point $D_3$), the real variable function $F(X)$ is represented by a circle with a radius $r_S$. In addition, in the interval $X_{D3} \leq X \leq X_{D4}$ ($X_{D4}$: the X coordinate of the inflection point $D_4$), the real variable function $F(X)$ is represented by a circle with a radius $r_{SR}$. Furthermore, in the interval $X_{D4} < X \leq X_L$, the real variable function $F(X)$ is represented by a circle with a radius $r_L$.

In the interval $X_S < X < 0$, the first-order differential coefficient of the real variable function $F(X)$ is a positive value; at $X = 0$, the first-order differential coefficient of the real variable function $F(X)$ is 0; and in the interval $0 < X < X_1$, the first-order differential coefficient of the real variable function $F(X)$ varies from a negative value to 0, and further to a positive value. At $X = X_1$, the first-order differential coefficient of the real variable function $F(X)$ is 0; and in the interval $X_1 < X < X_L$, the first-order differential coefficient of the real variable function $F(X)$ is a negative value.

In the interval $X_S < X < X_{A3}$ (or $X_{B3}$, $X_{C3}$, $X_{D3}$), the second-order differential coefficient of the real variable function $F(X)$ is a negative value; at $X = X_{A3}$ (or $X_{B3}$, $X_{C3}$, $X_{D3}$), the second-order differential coefficient of the real variable function $F(X)$ is 0; in the interval $X_{A3}$ (or $X_{B3}$, $X_{C3}$, $X_{D3}$) $< X < X_{A4}$ (or $X_{B4}$, $X_{C4}$, $X_{D4}$), the second-order differential coefficient of the real variable function $F(X)$ is a positive value; at $X = X_{A4}$ (or $X_{B4}$, $X_{C4}$, $X_{D4}$), the second-order differential coefficient of the real variable function $F(X)$ is 0; and in the interval $X < X_{A4}$ (or $X_{B4}$, $X_{C4}$, $X_{D4}$), the second-order differential coefficient of the real variable function $F(X)$ is a negative value.

Assuming a Gaussian coordinate system with the longer axis LX of the virtual rhombus being the x axis and with the shorter axis SX of the virtual rhombus being the y axis, when the side $SR_1$ and the side $SR_2$ are collectively expressed by a real variable function $f(x)$, and the side $SR_3$ and the side $SR_4$ are collectively expressed by the real variable function $f(x)$, the real variable function $f(x)$ has a continuous differential coefficient at each point in the interval $a < x < b$ (where a is the minimum allowable value of x in the real variable function $f(x)$, and b is the maximum allowable value of x in the real variable function $f(x)$). In addition, the first-order differential coefficient of the real variable function $f(x)$ at $x = 0$ is 0, and the first-order differential coefficient of the real variable function $f(x)$ at $y = 0$ is $\infty$.

In the recording layer 53 shown in FIG. 9, the planar shape is substantially line symmetric with respect to the shorter axis SX of the virtual rhombus, and is substantially line symmetric with respect to the longer axis LX of the virtual rhombus.

Figure 10:
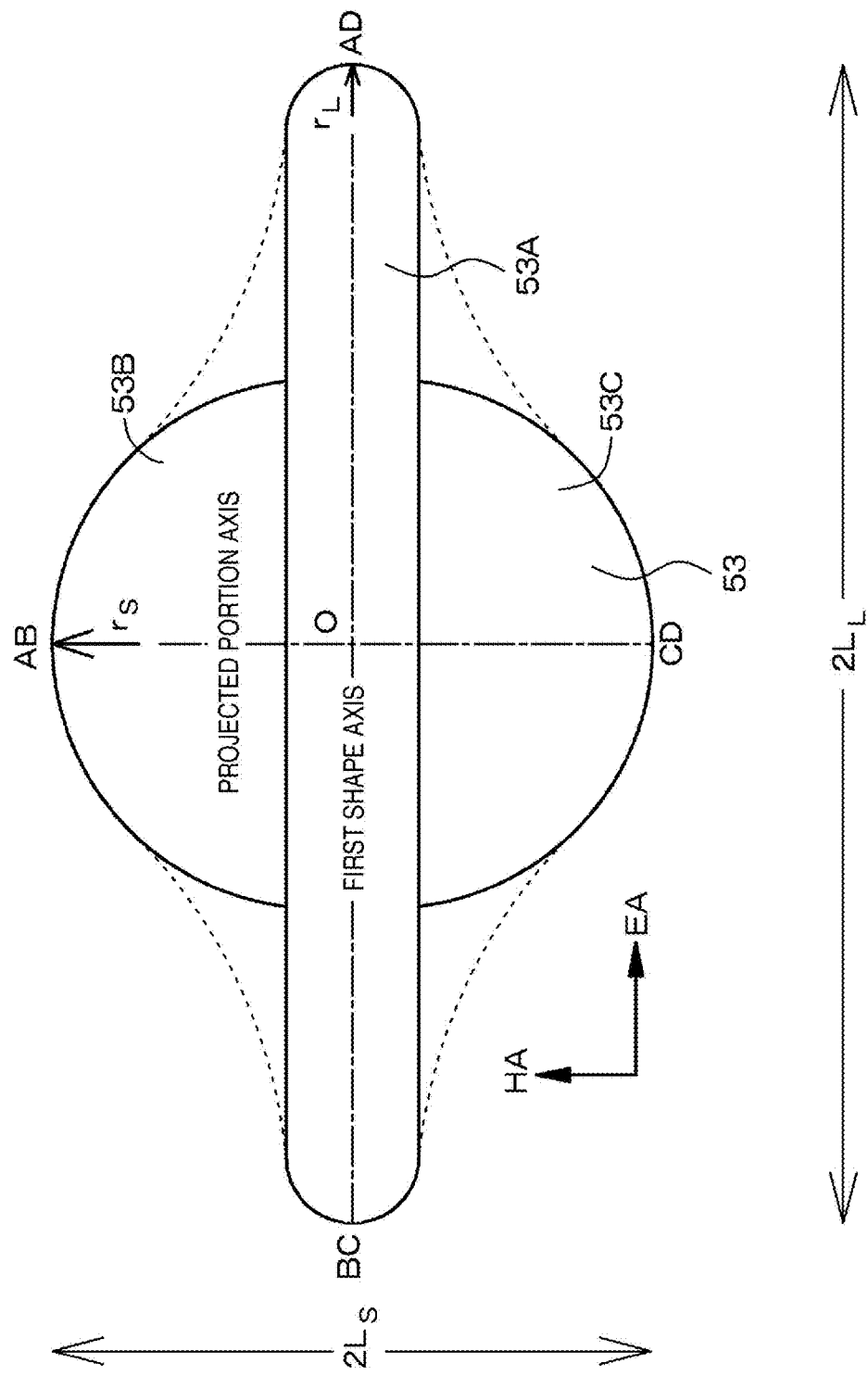
FIG. 10 is a schematic plan view of a recording layer having a third planar shape.

In the third planar shape, as shown in a schematic plan view of the recording layer 53 of FIG. 10, the planar shape of the recording layer 53 includes a first shape 53A (indicated by a solid line in FIG. 10), and two projected portions 53B and 53C (indicated by solid lines in FIG. 10) oppositely projected from the first shape 53A. The two projected portions 53B and 53C are located on the projected portion axis (in FIG. 10, indicated by a one-dot-chain line). The projected portion axis passes the center O of the first shape 53A, and the projected portion axis is orthogonal to the first shape axis (in FIG. 10, indicated by a one-dot-chain line) passing the center O of the first shape 53A. The easy magnetization axis (EA) of the recording layer 53 is substantially parallel to the first shape axis, and the hard magnetization axis (HA) of the recording layer 53 is substantially parallel to the projected portion axis. In addition, the relationship $L_L > L_S$ is satisfied, where the length of the first shape 53A along the first shape axis is $2L_L$, and the distance between the front ends of the two projected portions 53B and 53C along the projected portion axis is $2L_S$. The portion at which the outline of the first shape 53A and the outline of each of the projected portions 53B and 53C intersect includes a smooth curve (in FIG. 10, indicated by a dotted line) curved toward the center O of the first shape 53A.

The first shape 53A is a flat oval, that is, a figure obtained from a combination of two semicircles (radius: $r_L$) and two line segments. Each of the projected portions 53B and 53C is a figure formed by a part of a circle (radius: $r_S$).

The planar shape of the recording layer 53 is substantially line symmetric with respect to the projected portion axis, and is substantially line symmetric with respect to the first shape axis.

Figure 11:
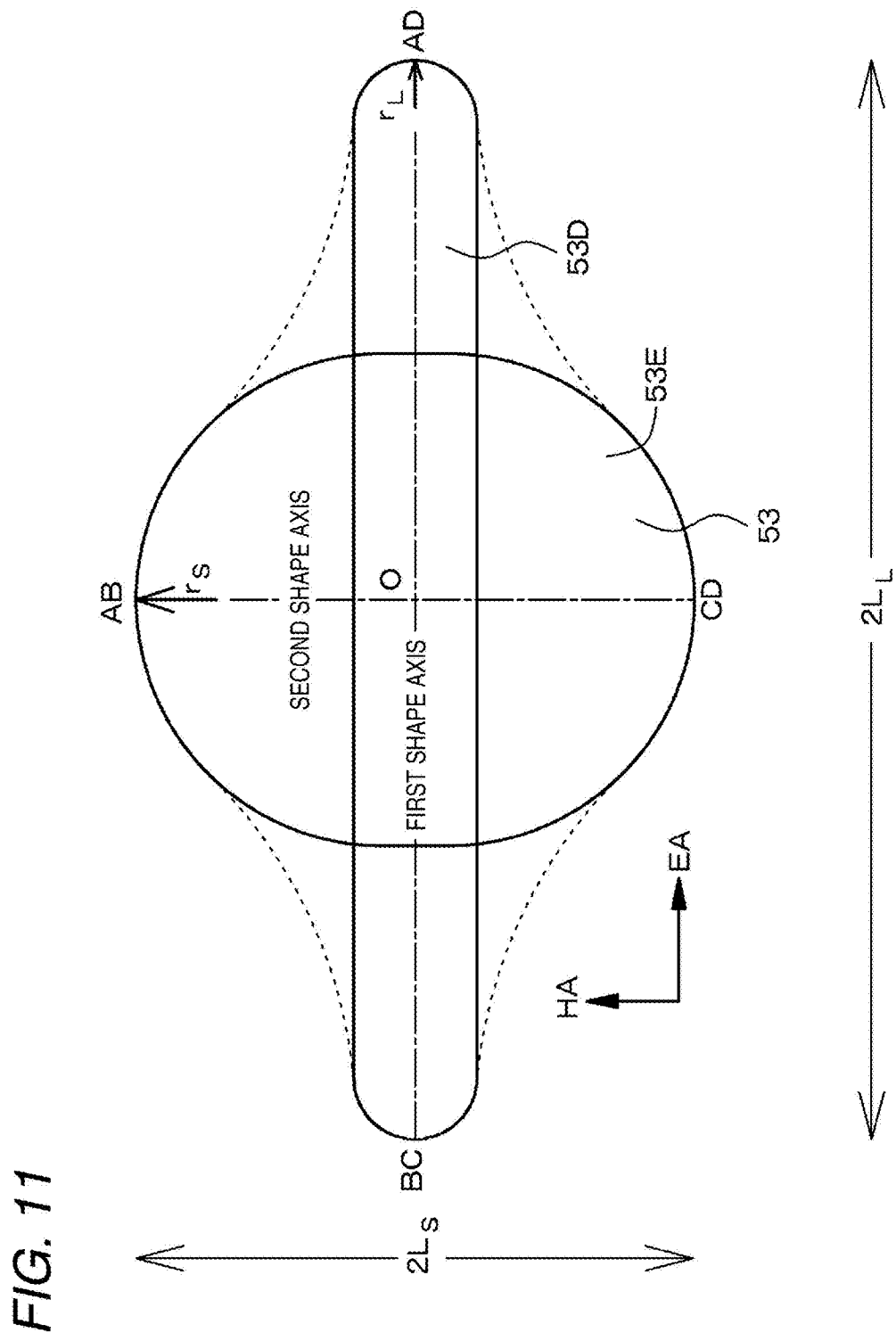
FIG. 11 is a schematic plan view of a recording layer having a fourth planar shape.

In the fourth planar shape, as shown in the schematic plan view of the recording layer 53 of FIG. 11, the planar shape of the recording layer 53 is a superposed shape in which a first shape 53D and a second shape 53E having a center O coinciding with the center O of the first shape 53D are superposed on each other such that the second shape 53E is projected from the first shape 53D at two positions. The first shape axis passing through the center O of the first shape 53D and the second shape axis passing through the center O of the second shape 53E are orthogonal to each other. The easy magnetization axis (EA) of the recording layer 53 is substantially parallel to the first shape axis, and the hard magnetization axis (HA) of the recording layer 53 is substantially parallel to the second shape axis. In addition, the relationship $L_L > L_S$ is satisfied, where the length of the first shape 53D along the first shape axis is $2L_L$, and the length of the second shape 53E along the second shape axis is $2L_S$. The portion at which the outline of the first shape 53D and the outline of the second shape 53E intersect includes a smooth curve (in FIG. 11, indicated by a dotted line) curved toward the center O of the first shape 53D.

The first shape 53D is a flat oval, that is, a figure obtained from a combination of two semicircles (radius: $r_L$) and two line segments. The second shape 53E is also a flat oval, that is, a figure obtained from a combination of two semicircles (radius: $r_S$) and two line segments.

The planar shape of the recording layer 53 is substantially line symmetric with respect to the second shape axis, and is substantially line symmetric with respect to the first shape axis.

Figure 12:
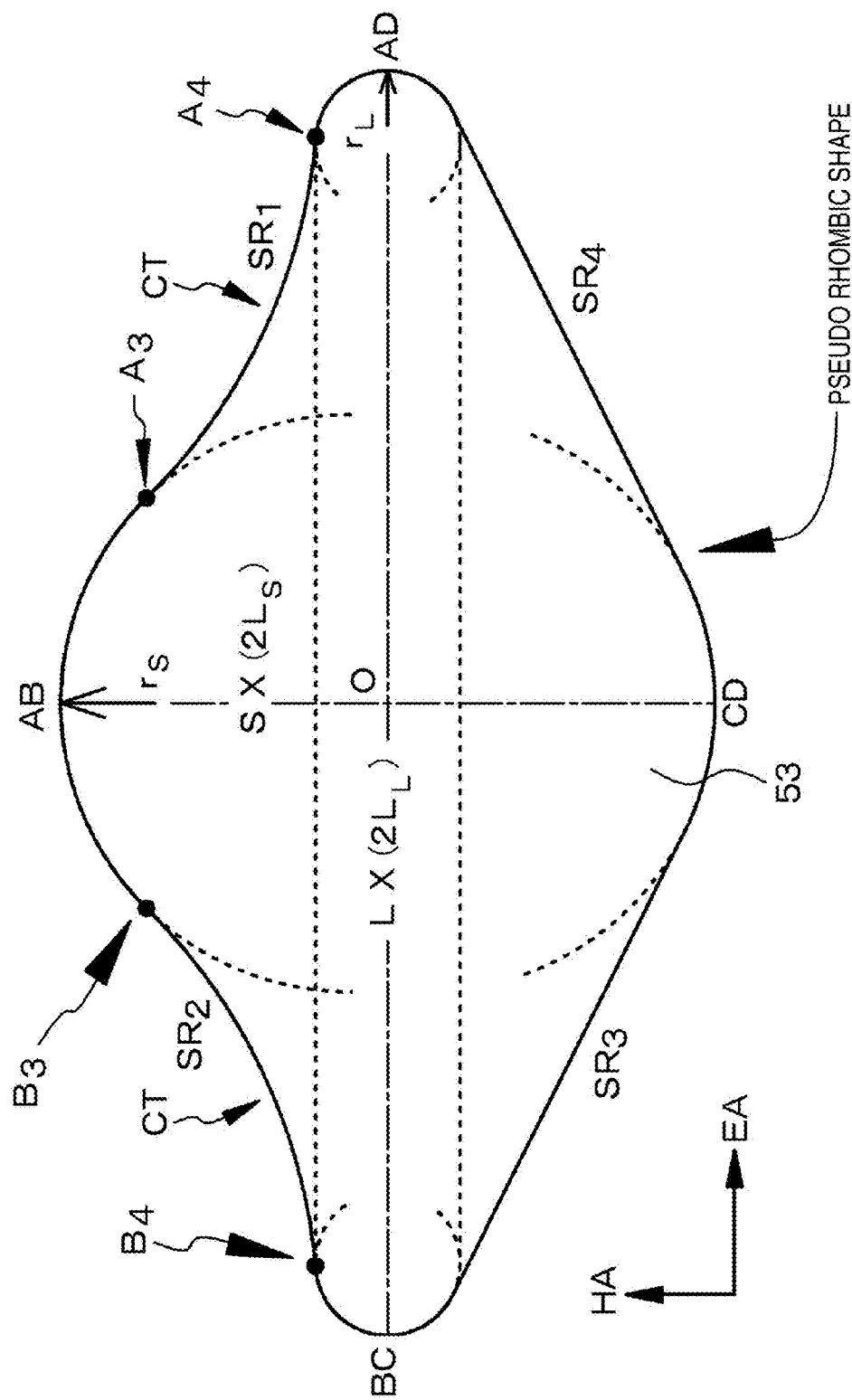
FIG. 12 is a schematic plan view of a modification of the recording layers having the first to fourth planar shapes.

In the foregoing description, each of the four sides $SR_m$ includes a smooth curve having a central portion thereof curved toward the center of the pseudo rhombic shape. Alternatively, each of the two sides $SR_1$ and $SR_2$ may include a smooth curve having a central portion thereof curved toward the center of the pseudo rhombic shape. Such a planar shape of the recording layer is shown in FIG. 12. In this example, when the pseudo rhombic shape is divided into two regions by the longer axis LX of the pseudo rhombic shape, the two sides $SR_1$ and $SR_2$ each including a smooth curve having a central portion thereof curved belong to one region. The planar shape of the recording layer 53 is substantially line symmetric with respect to the shorter axis SX of the pseudo rhombic shape.

Figure 13:
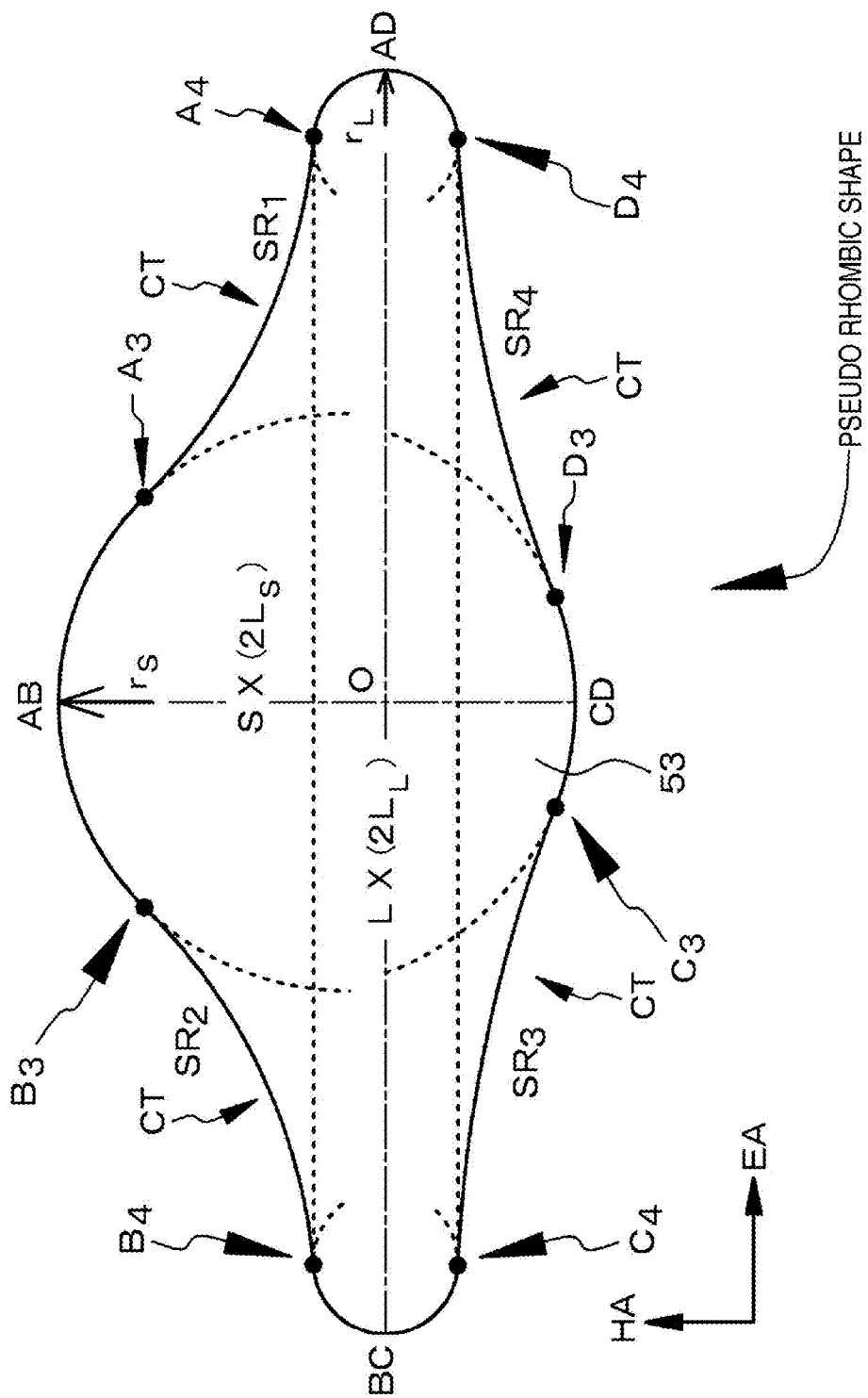
FIG. 13 is a schematic plan view of another modification of the recording layers having the first to fourth planar shapes.

Each of the four sides $SR_m$ includes a smooth curve having a central portion thereof curved toward the center of the pseudo rhombic shape, the planar shape of the recording layer 53 is substantially line symmetric with respect to the shorter axis SX of the pseudo rhombic shape, and is substantially line symmetric with respect to the longer axis LX of the pseudo rhombic shape. Alternatively, the planar shape of the recording layer 53 may be substantially line symmetric only with respect to the shorter axis SX of the pseudo rhombic shape. Such a planar shape of the recording layer 53 is shown in FIG. 13.

Figure 14:
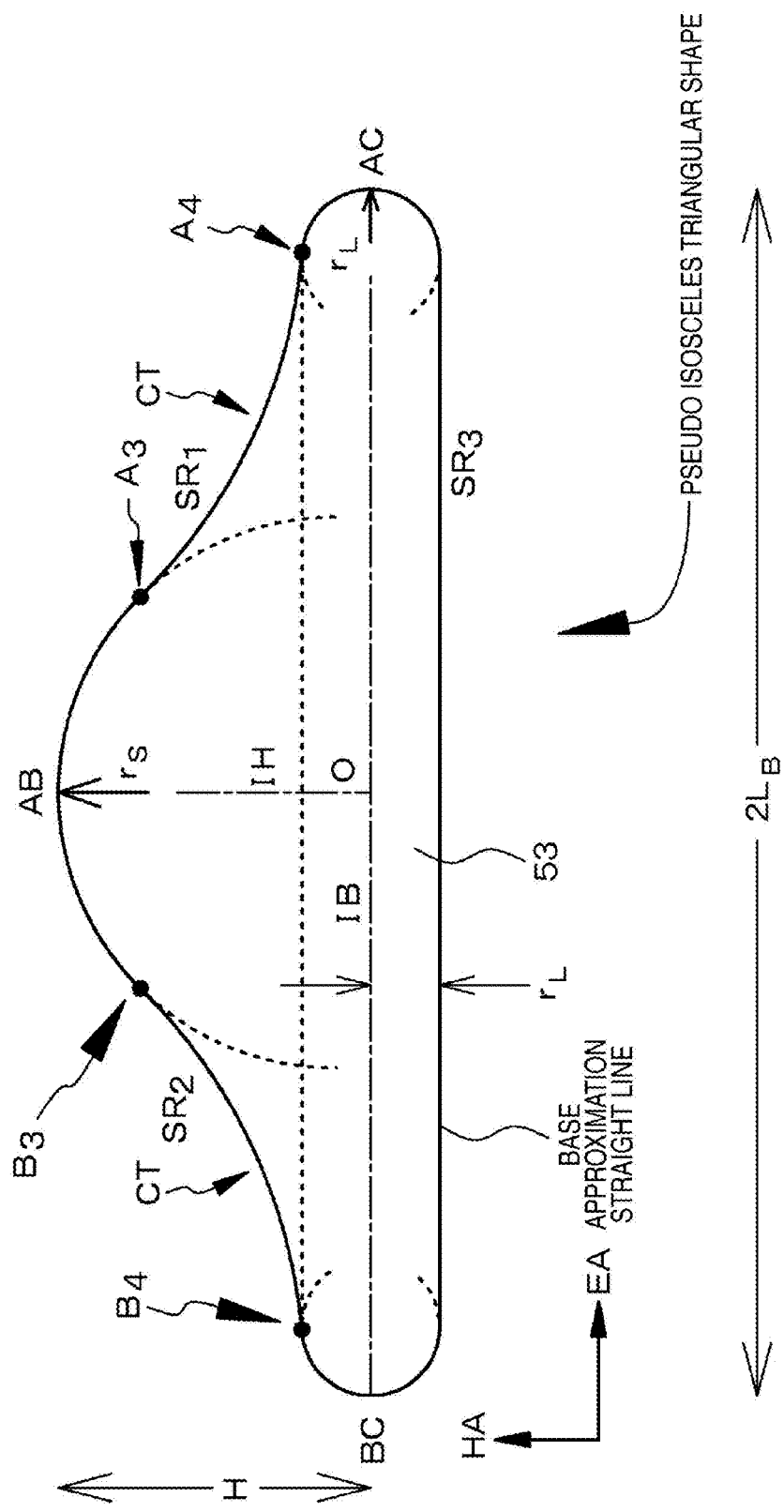
FIG. 14 is a schematic plan view of a recording layer having a fifth planar shape.

In the fifth planar shape, as shown in a schematic plan view of the recording layer 53 of FIG. 14, the planar shape (indicated by a solid line) of the recording layer 53 is a pseudo isosceles triangular shape having three sides $SR_n$ (where "n" is one of 1, 2, and 3). Each of the oblique lines $SR_1$ and $SR_2$ of the pseudo isosceles triangular shape includes a smooth curve having a central portion CT thereof curved toward the center of the pseudo isosceles triangular shape. The easy magnetization axis (EA) of the recording layer 53 is substantially parallel to the base $SR_3$ of the pseudo isosceles triangular shape, and the hard magnetization axis (HA) of the recording layer 53 is substantially orthogonal to the base $SR_3$ of the pseudo isosceles triangular shape. The sides $SR_n$ constituting the planar shape of the recording layer 53 are smoothly connected to each other.

At least two points of inflection are present in each of the oblique lines of the pseudo isosceles triangular shape. That is, two inflection points ($A_3$, $A_4$) are present in the oblique line $SR_1$, and two inflection points ($B_3$, $B_4$) are present in the oblique line $SR_2$.

As shown in FIG. 14, the planar shape of the recording layer 53 is substantially line symmetric with respect to the perpendicular bisector of the base of the pseudo isosceles triangular shape.

Let the length of the imaginary base IB of the pseudo isosceles triangular shape shown in FIG. 14 be $2L_B$, the virtual height be H, the average radius of curvature of the planar shape of the recording layer 53 at the portion where the oblique lines $SR_1$ and $SR_2$ and the base $SR_3$ of the pseudo isosceles triangular shape are smoothly connected to each other be $r_L$, and the radius of curvature of the planar shape of the recording layer 53 at the intersection AB between the two oblique lines $SR_1$ and $SR_2$ of the pseudo isosceles triangular shape be $r_S$. The intersection between the two oblique lines $SR_1$ and $SR_2$ of the pseudo isosceles triangular shape means the point at which the perpendicular bisector IH of the imaginary base IB intersects the curve obtained by connecting the two oblique lines $SR_1$ and $SR_2$ of the pseudo isosceles triangular shape into one line. The imaginary base IB of the pseudo isosceles triangular shape means an imaginary line which, when the base $SR_3$ of the pseudo isosceles triangular shape is approximated by a straight line (base approximation straight line), is parallel to the base approximation straight line and passes through a point located on the side of the intersection of the two oblique lines $SR_1$ and $SR_2$ of the pseudo isosceles triangular shape and spaced from the base approximation straight line by a distance $r_L$. The length $2L_B$ of the imaginary base is defined as the distance between the intersections between the planar shape of the recording layer 53 and the imaginary base IB at the portions where the oblique lines $SR_1$ and $SR_2$ of the pseudo isosceles triangular shape are smoothly connected to the base $SR_3$ (the distance between point BC and point AC). The virtual height H is defined as the distance from the intersection AB of the two oblique lines $SR_1$ and $SR_2$ of the pseudo isosceles triangular shape to the imaginary base IB. The length $2L_B$ of the imaginary base IB and the virtual height H satisfy the relationship of $H<L_B$.

Figure 15:
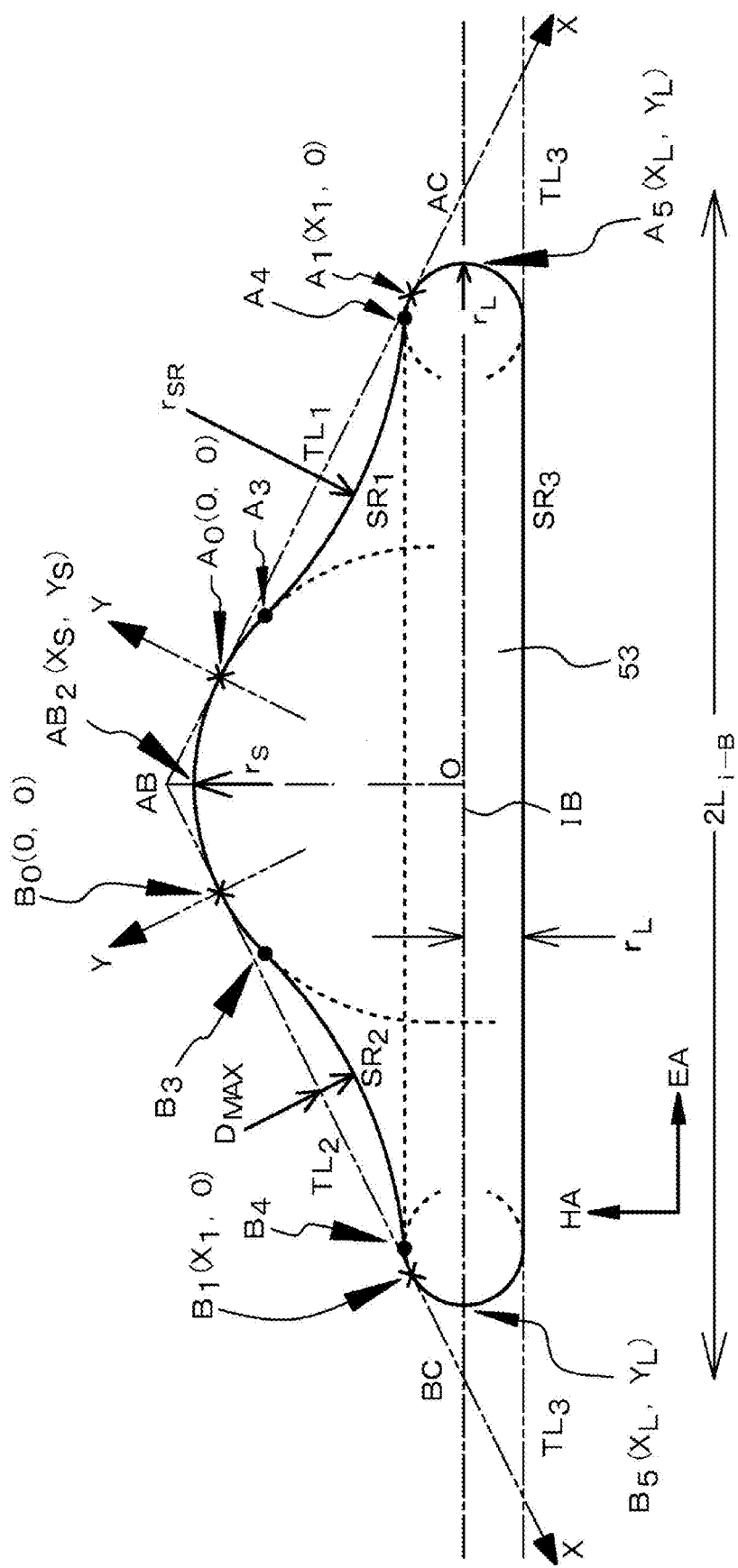
FIG. 15 is a schematic plan view of a recording layer having a sixth planar shape.

In the sixth planar shape, as shown in a schematic plan view of the recording layer 53 of FIG. 15, the planar shape (indicated by a solid line) of the recording layer 53 has three sides $SR_n$, and at least two (in the example of FIG. 15, two sides $SR_1$ and $SR_2$) of the three sides each include a smooth curve. The planar shape of the recording layer 53 is inscribed in a virtual isosceles triangle (indicated by a two-dot-chain line) In FIG. 15, the inscribing points are indicated by mark "×". The virtual isosceles triangle has an imaginary base IB (indicated by a one-dot-chain line) having a length $2L_{i-B}$, and the virtual height (the distance from point O to point AB) is $H_i$ [where $H_i<L_{i-B}$]. The imaginary base IB of the virtual isosceles triangle means an imaginary line which is parallel to the base $TL_3$ of the virtual isosceles triangle and passes through a point located on the side of the intersection of the two oblique lines $TL_1$ and $TL_2$ of the virtual isosceles triangle and spaced from the base $TL_3$ of the virtual isosceles triangle by a distance $r_L$, where $r_L$ is the average radius of curvature of the planar shape of the recording layer 53 at the portions where the side $SR_3$ constituting the planar shape of the recording layer 53 and corresponding to the base $TL_3$ of the virtual isosceles triangle is smoothly connected to the sides $SR_1$ and $SR_2$ constituting the planar shape of the recording layer 53 and corresponding to the oblique lines $TL_1$ and $TL_2$ of the virtual isosceles triangle. The length $2L_{i-B}$ of the imaginary base IB is the distance between the intersections BC and AC at which the imaginary base IB intersects the two oblique lines $TL_1$ and $TL_2$ of the virtual isosceles triangle. The imaginary height $H_i$ is the distance from the intersection AB of the two oblique lines $TL_1$ and $TL_2$ of the virtual isosceles triangle to the imaginary base IB. The base $SR_3$ is substantially parallel to the easy magnetization axis (EA) of the recording layer 53, and the perpendicular to the base $SR_3$ is substantially parallel to the hard magnetization axis (HA) of the recording layer 53. Furthermore, each of the sides $SR_1$ and $SR_2$ including a smooth curve contacts the corresponding one of the sides $TL_1$ and $TL_2$ of the virtual isosceles triangle at least two points (in the example of FIG. 15, two points). In FIG. 15, the contact point is indicated by mark "×". The sides $SR_n$ constituting the planar shape of the recording layer 53 are smoothly connected to each other.

In the oblique line $SR_1$ having a smooth curve constituting the planar shape of the recording layer 53, (a) the point located closest to the intersection AB of the two oblique lines $TL_1$ and $TL_2$ of two points in contact with the oblique line $TL_1$ of the virtual isosceles triangle is made to be the origin $A_0(0, 0)$ of a Gaussian coordinate system, (b) the point located closest to the intersection AC of the oblique line $TL_1$ and the base $TL_3$ of two points in contact with the oblique line $TL_1$ of the virtual isosceles triangle is made to be $A_1(X_1,0)$ [where $X_1>0$], (c) the intersection with the perpendicular bisector to the base $TL_3$ of the virtual isosceles triangle is made to be $AB_2(X_S,Y_S)$ [where $X_S<0$, $Y_S<0$], and (d) the intersection with the imaginary base IB of the virtual isosceles triangle is made to be $A_5(X_L,Y_L)$ [where $X_L>0$, $Y_L<0$].

In addition, the oblique line $SR_1$ is expressed by a real variable function $F(X)$, and it is assumed that the intersection between the perpendicular bisector of the base of the virtual isosceles triangle and the base is located in the third quadrant or the fourth quadrant (in the example shown, the fourth quadrant).

In this case, the real variable function $F(X)$ has a continuous differential coefficient at each point in the interval $X_S<X<X_L$, and the real variable function $F(X)$ has two inflection points $(A_3, A_4)$ in the interval $0<X<X_1$.

More specifically, in the interval $X_S<X \leq X_{A3}$ ($X_{A3}$: the X coordinate of the inflection point $A_3$), the real variable function $F(X)$ is represented by a circle with a radius $r_S$. In addition, in the interval $X_{A3} \leq X \leq X_{A4}$ ($X_{A4}$: the X coordinate of the inflection point $A_4$), the real variable function $F(X)$ is represented by a circle with a radius $r_{SR}$. Furthermore, in the interval $X_{A4}<X \leq X_L$, the real variable function $F(X)$ is represented by a circle with a radius $r_L$.

In the oblique line $SR_2$ having a smooth curve constituting the planar shape of the recording layer 53, (a) the point located closest to the intersection AB between the two oblique lines $TL_1$ and $TL_2$ of two points in contact with the oblique line $TL_2$ of the virtual isosceles triangle is made to be the origin $B_0(0,0)$ of a Gaussian coordinate system, (b) the point located closest to the intersection BC between the oblique line $TL_2$ and the base $TL_3$ of two points in contact with the oblique line $TL_2$ of the virtual isosceles triangle is made to be $B_1(X_1,0)$ [where $X_1>0$], (c) the intersection with the perpendicular bisector of the base $TL_3$ of the virtual isosceles triangle is made to be $AB_2(X_S,Y_S)$ [where $X_S<0$, $Y_S<0$], and (d) the intersection with the imaginary base IB of the virtual isosceles triangle is made to be $B_5(X_L,Y_L)$ [where $X_L>0$, $Y_L<0$].

In addition, the oblique line $SR_2$ is expressed by a real variable function $F(X)$, and it is assumed that the intersection between the perpendicular bisector of the base of the virtual isosceles triangle and the base is located in the third quadrant or the fourth quadrant (in the example shown, the fourth quadrant).

In this case, the real variable function $F(X)$ has a continuous differential coefficient at each point in the interval $X_S<X<X_L$, and the real variable function $F(X)$ has two inflection points $(B_3, B_4)$ in the interval $0<X<X_1$.

More specifically, in the interval $X_S<X \leq X_{B3}$ ($X_{B3}$: the X coordinate of the inflection point $B_3$), the real variable function $F(X)$ is represented by a circle with a radius $r_S$. In addition, in the interval $X_{B3} \leq X \leq X_{B4}$ ($X_{B4}$: the X coordinate of the inflection point $B_4$), the real variable function $F(X)$ is represented by a circle with a radius $r_{SR}$. Furthermore, in the interval $X_{B4}<X \leq X_L$, the real variable function $F(X)$ is represented by a circle with a radius $r_L$.

In the interval $X_S<X<0$, the first-order differential coefficient of the real variable function $F(X)$ is a positive value; at $X=0$, the first-order differential coefficient of the real variable function $F(X)$ is 0; and in the interval $0<X<X_1$, the first-order differential coefficient of the real variable function $F(X)$ varies from a negative value to 0, and further to a positive value. At $X=X_1$, the first-order differential coefficient of the real variable function $F(X)$ is 0, and when X exceeds $X_1$, the first-order differential coefficient of the real variable function $F(X)$ is a negative value.

In the interval $X_S<X<X_{A3}$ (or $X_{B3}$), the second-order differential coefficient of the real variable function $F(X)$ is a negative value; at $X=X_{A3}$ (or $X_{B3}$), the second-order differential coefficient of the real variable function $F(X)$ is 0; in the interval $X_{A3}$ (or $X_{B3}$)$<X<X_{A4}$ (or $X_{B4}$), the second-order differential coefficient of the real variable function $F(X)$ is a positive value; at $X=X_{A4}$ (or $X_{B4}$), the second-order differential coefficient of the real variable function $F(X)$ is 0; and in the interval $X<X_{A4}$ (or $X_{B4}$), the second-order differential coefficient of the real variable function $F(X)$ is a negative value.

Assuming a Gaussian coordinate system with the imaginary base IB of the virtual isosceles triangle being the x axis and with the perpendicular bisector of the imaginary base IB being the y axis, when the oblique line $SR_1$ and the oblique line $SR_2$ are collectively expressed by the real variable function $f(x)$, the real variable function $f(x)$ has a continuous differential coefficient at each point in the interval $a<x<b$ (where a is the minimum allowable value of x in the real variable function $f(x)$, and b is the maximum allowable value of x in the real variable function $f(x)$). The first-order differential coefficient of the real variable function $f(x)$ at $x=0$ is 0, and the first-order differential coefficient of the real variable function $f(x)$ at $y=0$ is $\infty$.

In the recording layer 53 of FIG. 15, the planar shape is substantially line symmetric with respect to the perpendicular bisector of the base of the virtual isosceles triangle.

Figure 16:
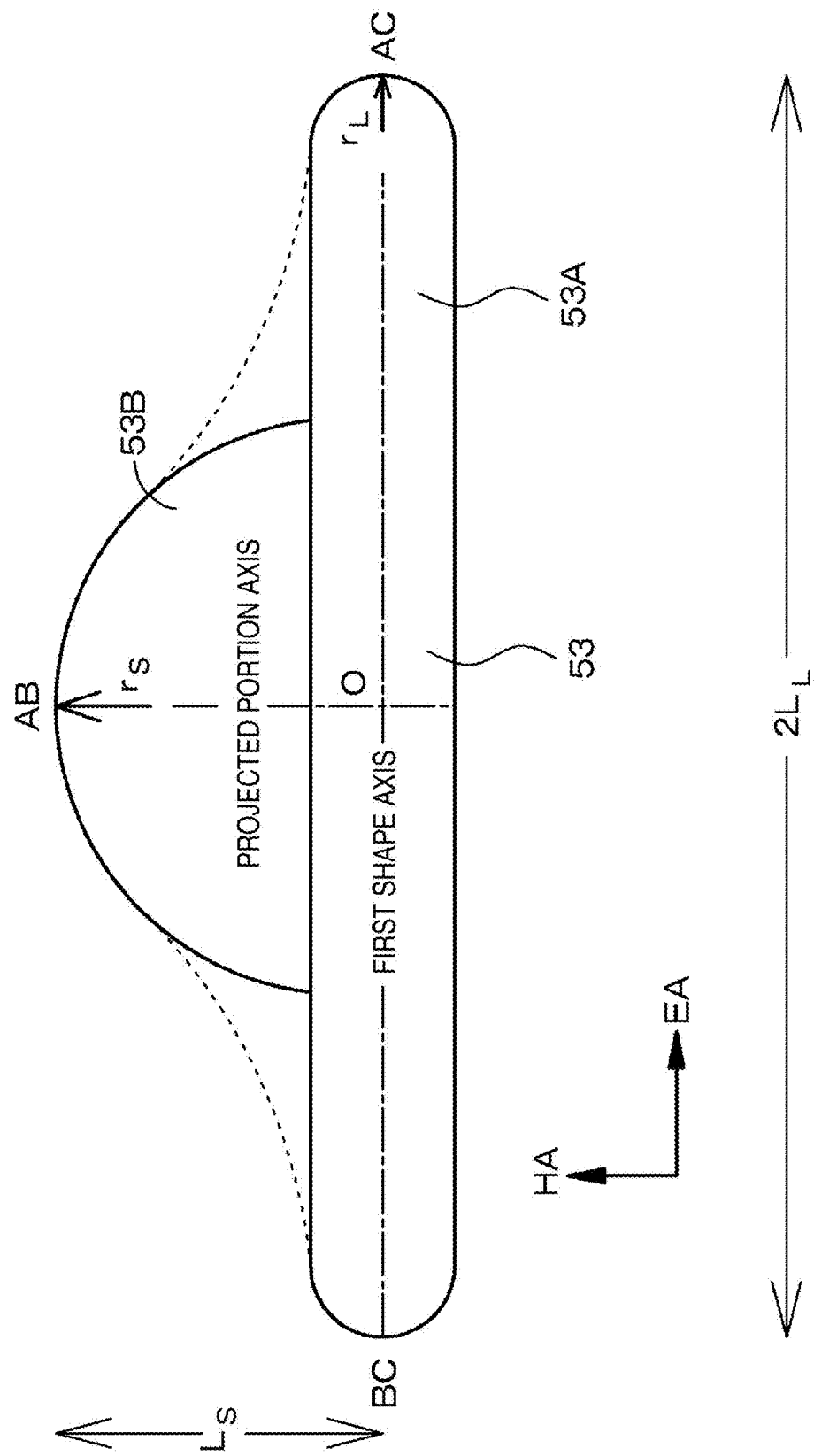
FIG. 16 is a schematic plan view of a recording layer having seventh planar shape.

In the seventh planar shape, as shown in a schematic plan view of the recording layer 53 of FIG. 16, the planar shape of the recording layer 53 includes a first shape 53A (indicated by a solid line in FIG. 16), and one projected portion 53B (indicated by a solid line in FIG. 16) projected from the first shape 53A. The projected portion 53B is located on the projected portion axis (in FIG. 16, indicated by a one-dot-chain line). The projected portion axis passes through the center O of the first shape 53A, and the projected portion axis is orthogonal to the first shape axis (in FIG. 16, indicated by a one-dot-chain line) passing through the center O of the first shape 53A. The easy magnetization axis (EA) of the recording layer 53 is substantially parallel to the first shape axis, and the hard magnetization axis (HA) of the recording layer 53 is substantially parallel to the projected portion axis. In addition, the relationship $L_L>L_S$ is satisfied, where the length of the first shape 53A along the first shape axis is $2L_L$, and the distance from a front end of the projected portion 53B to the center O of the first shape 53A along the projected portion axis is $L_S$. The portion at which the outline of the first shape 53A and the outline of the projected portion 53B intersect includes a smooth curve (in FIG. 16, indicated by a dotted line) curved toward the center O of the first shape 53A.

The first shape 53A is a flat oval, that is, a figure obtained from a combination of two semicircles (radius: $r_L$) and two line segments. The projected portion 53B is formed by a part of a circle (radius: $r_S$).

The planar shape of the recording layer 53 is substantially line symmetric with respect to the projected portion axis.

Figure 17:
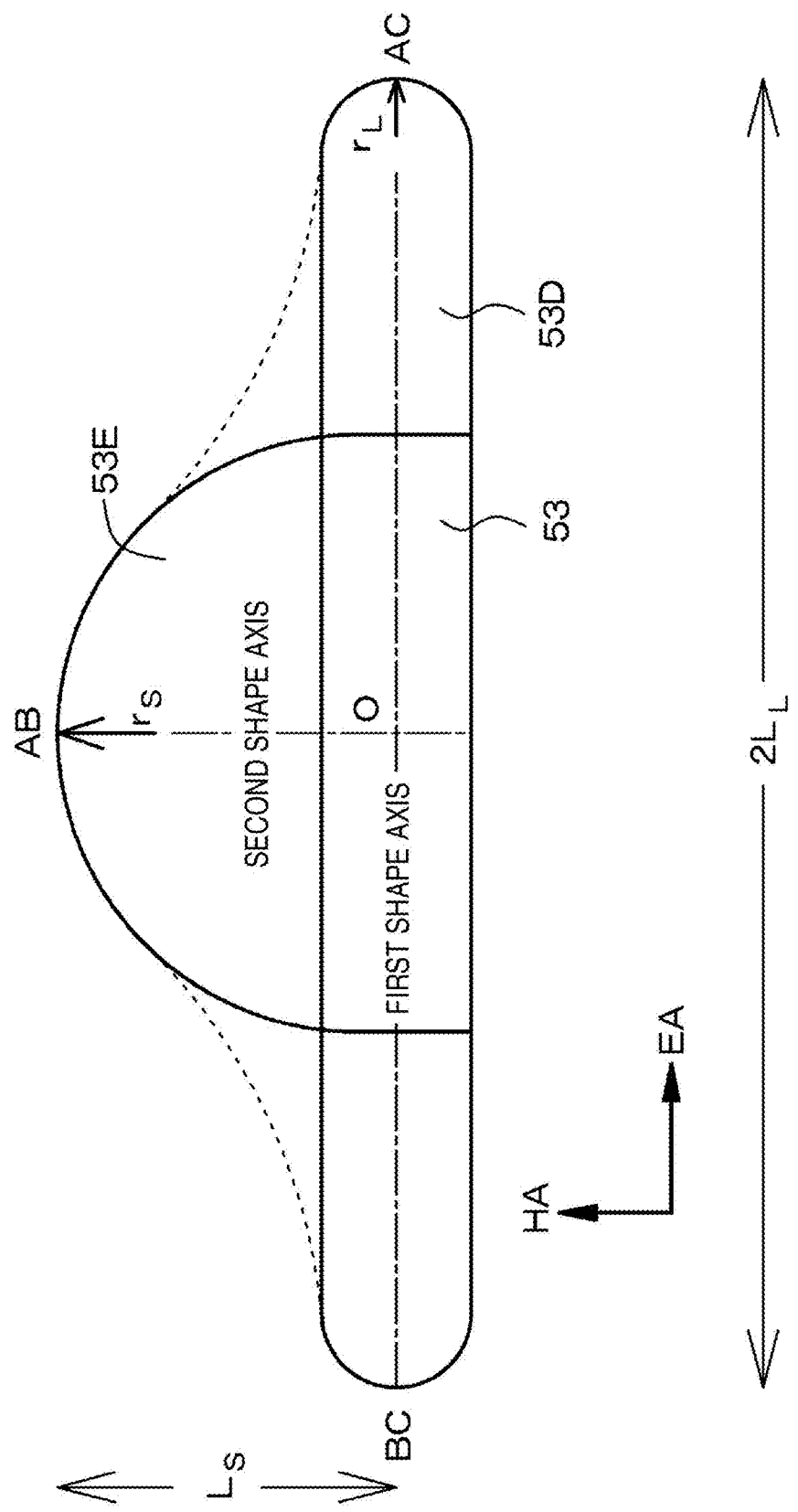
FIG. 17 is a schematic plan view of a recording layer having an eighth planar shape.

In the eighth planar shape, as shown in a schematic plan view of the recording layer 53 of FIG. 17, the planar shape of the recording layer 53 is a superposed shape in which a first shape 53D and a second shape 53E are superposed on each other such that the second shape 53E is projected from the first shape 53D at one position. The second shape 53E is located on the second shape axis, and the second shape axis passes through the center O of the first shape 53D and is orthogonal to the first shape axis passing through the center O of the first shape 53D. The easy magnetization axis (EA) of the recording layer 53 is substantially parallel to the first shape axis, and the hard magnetization axis (HA) of the recording layer 53 is substantially parallel to the second shape axis. In addition, the relationship $L_L > L_S$ is satisfied, where the length of the first shape 53D along the first shape axis is $2L_L$, and the distance from a front end of the second shape 53E to the center O of the first shape 53D along the second shape axis is $L_S$. The portion at which the outline of the first shape 53D and the outline of the second shape 53E intersect includes a smooth curve (in FIG. 17, indicated by a dotted line) curved toward the center O of the first shape 53D.

The first shape 53D is a flat oval, that is, a figure obtained from a combination of two semicircles (radius: $r_L$) and two line segments. The second shape 53E is a figure obtained from a combination of a semicircle (radius: $r_S$) and two line segments.

The planar shape of the recording layer 53 is substantially line symmetric with respect to the second shape axis.

The details of the first planar shape to the eighth planar shape are disclosed in JP-A-2005-353788 (Japanese Patent Application No. 2004-172122).

It should be understood by those skilled in the art that various modifications, combinations, sub-combinations and alterations may occur depending on design requirements and other factors insofar as they are within the scope of the appended claims or the equivalents thereof.

What is claimed is:

1. A nonvolatile magnetic memory device comprising:
a magnetoresistance effect element that includes
(A) a layered structure having a recording layer,
(B) a first wiring electrically connected to a lower part of the layered structure,
(C) a second wiring electrically connected to an upper part of the layered structure, and
(D) an interlayer insulation layer surrounding the layered structure,
wherein the magnetoresistance effect element further includes a low Young modulus region having a Young modulus lower than a Young modulus of a material forming the interlayer insulation layer,
the recording layer has an easy magnetization axis, and a hard magnetization axis orthogonal to the easy magnetization axis,
when a magnetostriction constant λ of a material forming the recording layer is a positive value, the low Young modulus region is disposed in an extension region of the easy magnetization axis of the recording layer, and
when the magnetostriction constant λ of the material forming the recording layer is a negative value, the low Young modulus region is disposed in an extension region of the hard magnetization axis of the recording layer.

2. The nonvolatile magnetic memory device according to claim 1,
wherein the low Young modulus region is formed by an extension portion of the second wiring.

3. The nonvolatile magnetic memory device according to claim 1,
wherein the low Young modulus region is formed by an extension portion of an upper insulation layer surrounding the second wiring.

4. The nonvolatile magnetic memory device according to claim 1,
wherein the magnetoresistance effect element includes a spin injection type magnetoresistance effect element.

5. The nonvolatile magnetic memory device according to claim 4,
wherein a selection transistor formed by a field effect transistor is further provided below the layered structure, and
an extension direction of the second wiring is substantially parallel to an extension direction of a gate electrode constituting a field effect transistor.

6. The nonvolatile magnetic memory device according to claim 1,
wherein a connection portion is provided between the upper part of the layered structure and the second wiring, and
a Young modulus of a material forming the connection portion is higher than the Young modulus of the material forming the interlayer insulation layer.

7. The nonvolatile magnetic memory device according to claim 1,
wherein the Young modulus of a material forming the first wiring is higher than the Young modulus of the material forming the interlayer insulation layer.

8. The nonvolatile magnetic memory device according to claim 1,
wherein a connection portion is provided between the upper part of the layered structure and the second wiring,
a Young modulus of a material forming the connection portion is higher than the Young modulus of the material forming the interlayer insulation layer, and
a Young modulus of a material forming the first wiring is higher than the Young modulus of the material forming the interlayer insulation layer.

9. A nonvolatile magnetic memory device comprising:
a magnetoresistance effect element that includes
(A) a layered structure having a recording layer,
(B) a first wiring electrically connected to a lower part of the layered structure,
(C) a second wiring electrically connected to an upper part of the layered structure, and
(D) an interlayer insulation layer surrounding the layered structure,
wherein the magnetoresistance effect element further includes a high Young modulus region having a Young modulus higher than a Young modulus of a material forming the interlayer insulation layer,
the recording layer has an easy magnetization axis, and a hard magnetization axis orthogonal to the easy magnetization axis,
when a magnetostriction constant λ of a material forming the recording layer is a positive value, the high Young modulus region is disposed in an extension region of the hard magnetization axis of the recording layer, and
when the magnetostriction constant λ of the material forming the recording layer is a negative value, the high Young modulus region is disposed in an extension region of the easy magnetization axis of the recording layer.

10. The nonvolatile magnetic memory device according to claim 9,
   wherein the high Young modulus region is formed by an extension portion of the second wiring.

11. The nonvolatile magnetic memory device according to claim 9,
   wherein the high Young modulus region is formed by an extension portion of an upper insulation layer surrounding the second wiring.

12. The nonvolatile magnetic memory device according to claim 9,
   wherein the magnetoresistance effect element includes a spin injection type magnetoresistance effect element.

13. The nonvolatile magnetic memory device according to claim 12,
   wherein a selection transistor formed by a field effect transistor is further provided below the layered structure, and
   an extension direction of the second wiring is substantially parallel to an extension direction of a gate electrode constituting a field effect transistor.

14. The nonvolatile magnetic memory device according to claim 9,
   wherein a connection portion is provided between the upper part of the layered structure and the second wiring, and
   a Young modulus of a material forming the connection portion is higher than the Young modulus of the material forming the interlayer insulation layer.

15. The nonvolatile magnetic memory device according to claim 9,
   wherein a Young modulus of a material forming the first wiring is higher than a Young modulus of the material forming the interlayer insulation layer.

16. The nonvolatile magnetic memory device according to claim 9,
   wherein a connection portion is provided between the upper part of the layered structure and the second wiring,
   a Young modulus of a material forming the connection portion is higher than the Young modulus of the material forming the interlayer insulation layer, and
   a Young modulus of a material forming the first wiring is higher than the Young modulus of the material forming the interlayer insulation layer.

17. A nonvolatile magnetic memory device comprising:
   a magnetoresistance effect element that includes
   (A) a layered structure having a recording layer,
   (B) a first wiring electrically connected to a lower part of the layered structure,
   (C) a second wiring electrically connected to an upper part of the layered structure, and
   (D) an interlayer insulation layer surrounding the layered structure,
   wherein the magnetoresistance effect element further includes a high Young modulus region and a low Young modulus region having a Young modulus lower than a Young modulus of the high Young modulus region,
   the recording layer has an easy magnetization axis, and a hard magnetization axis orthogonal to the easy magnetization axis,
   when a magnetostriction constant $\lambda$ of a material forming the recording layer is a positive value, the high Young modulus region is disposed in an extension region of the hard magnetization axis of the recording layer, and the low Young modulus region is disposed in an extension region of the easy magnetization axis of the recording layer, and
   when the magnetostriction constant $\lambda$ of the material forming the recording layer is a negative value, the high Young modulus region is disposed in the extension region of the easy magnetization axis of the recording layer, and the low Young modulus region is disposed in an extension region of the hard magnetization axis of the recording layer.

18. The nonvolatile magnetic memory device according to claim 1,
   wherein a planar shape of the recording layer has a pseudo rhombic shape,
   at least two of four sides constituting the pseudo rhombic shape each include a smooth curve having a central portion thereof curved toward the center of the pseudo rhombic shape,
   the easy magnetization axis of the recording layer is substantially parallel to the longer axis of the pseudo rhombic shape,
   the hard magnetization axis of the recording layer is substantially parallel to the shorter axis of the pseudo rhombic shape, and
   the sides constituting the planar shape of the recording layer are smoothly connected to each other.

19. The nonvolatile magnetic memory device according to claim 9,
   wherein a planar shape of the recording layer has a pseudo rhombic shape,
   at least two of four sides constituting the pseudo rhombic shape each include a smooth curve having a central portion thereof curved toward a center of the pseudo rhombic shape,
   the easy magnetization axis of the recording layer is substantially parallel to a longer axis of the pseudo rhombic shape,
   the hard magnetization axis of the recording layer is substantially parallel to a shorter axis of the pseudo rhombic shape, and
   the sides constituting the planar shape of the recording layer are smoothly connected to each other.

20. The nonvolatile magnetic memory device according to claim 17,
   wherein a planar shape of the recording layer has a pseudo rhombic shape,
   at least two of four sides constituting the pseudo rhombic shape each include a smooth curve having a central portion thereof curved toward a center of the pseudo rhombic shape,
   the easy magnetization axis of the recording layer is substantially parallel to a longer axis of the pseudo rhombic shape,
   the hard magnetization axis of the recording layer is substantially parallel to a shorter axis of the pseudo rhombic shape, and
   the sides constituting the planar shape of the recording layer are smoothly connected to each other.

* * * * *